US005972560A

United States Patent [19]

Kaneko et al.

[11] Patent Number: 5,972,560

[45] Date of Patent: Oct. 26, 1999

[54] HIGH MOLECULAR WEIGHT SILICONE COMPOUND, CHEMICALLY AMPLIFIED POSITIVE RESIST COMPOSITION AND PATTERNING METHOD

[75] Inventors: Ichiro Kaneko, Kashima-gun; Mutsuo Nakashima, Nakakubiki-gun; Toshinobu Ishihara, Nakakubiki-gun; Junji Tsuchiya, Nakakubiki-gun; Jun Hatakeyama, Nakakubiki-gun; Shigehiro Nagura, Nakakubiki-gun, all of Japan

[73] Assignee: Shin-Etsu Chemical Co., Ltd., Japan

[21] Appl. No.: 09/016,448

[22] Filed: Jan. 30, 1998

[30] Foreign Application Priority Data

| | | | |
|---|---|---|---|
| Jan. 31, 1997 | [JP] | Japan | 9-033082 |
| Mar. 28, 1997 | [JP] | Japan | 9-095104 |

[51] Int. Cl.[6] ............ G03F 7/075; C08G 77/04

[52] U.S. Cl. ............ 430/270.1; 430/296; 528/15; 528/26; 524/380

[58] Field of Search ............ 528/26, 15; 430/270.1, 430/296; 524/380

[56] References Cited

U.S. PATENT DOCUMENTS

| | | | |
|---|---|---|---|
| 5,141,840 | 8/1992 | Mizutani et al. | 430/281 |
| 5,691,396 | 11/1997 | Takemura et al. | 522/62 |

*Primary Examiner*—Janet Baxter
*Assistant Examiner*—Barbara Gilmore
*Attorney, Agent, or Firm*—Millen, White, Zelano, & Branigan, P.C.

[57] ABSTRACT

The invention provides a high molecular weight silicone compound comprising recurring units of the general formula (1) and having a weight average molecular weight of 1,000–50,000.

(1)

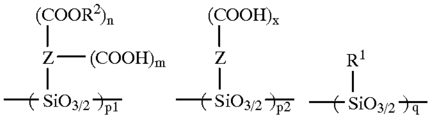

Z is a di- to hexavalent, monocyclic or polycyclic hydrocarbon group or bridged cyclic hydrocarbon group of 5–12 carbon atoms, $R^1$ is a substituted or unsubstituted alkyl or alkenyl group of 1–8 carbon atoms, $R^2$ is an acid labile group, m is 0 or an integer, n is an integer, satisfying $m+n \leqq 5$, x is an integer, p1 and p2 are positive numbers, q is 0 or a positive number, satisfying $0<p1/(p1+p2+q) \leqq 0.9$, $0<p2/(p1+p2+q) \leqq 0.9$, $0 \leqq q/(p1+p2+q) \leqq 0.7$, and $p1+p2+q=1$. A chemically amplified positive resist composition comprising the high molecular weight silicone compound as a base resin is sensitive to actinic radiation and has a high sensitivity and resolution so that it is suitable for fine patterning with electron beams or deep UV. Since the composition has low absorption at the exposure wavelength of an ArF or KrF excimer laser, a finely defined pattern having walls perpendicular to the substrate can be readily formed.

15 Claims, No Drawings

HIGH MOLECULAR WEIGHT SILICONE COMPOUND, CHEMICALLY AMPLIFIED POSITIVE RESIST COMPOSITION AND PATTERNING METHOD

BACKGROUND OF THE INVENTION

This invention relates to high molecular weight silicone compounds (or silicone polymers) suitable as base resins in chemically amplified positive resist compositions which lend themselves to fine processing in the manufacture of semiconductor devices or the like; chemically amplified positive resist compositions which are appropriate when high energy radiation such as deep UV, KrF excimer laser radiation (248 nm), ArF excimer laser radiation (193 nm), electron beam or x-ray is used as a light source for exposure; and a patterning method.

As the LSI technology tends toward higher integration and higher speed, further refinement of pattern rules is required. The light exposure currently employed as versatile technology is now approaching to the essential limit of resolution which is dictated by the wavelength of a light source. It is generally recognized that in light exposure using g-line (436 nm) or i-line (365 nm) as a light source, a pattern rule of about 0.5 μm is the limit. LSIs fabricated by this technique have a degree of integration equivalent to 16 mega-bit DRAM at maximum. At present, LSIs fabricated in the laboratory have reached this stage. It is urgently required to develop a finer patterning technique.

One of approaches for making finer patterns is to use exposure light of a shorter wavelength in forming resist patterns. For the mass production process of 256 mega-bit (working size up to 0.25 μm) DRAM (dynamic random access memory), active research works are now made to substitute a KrF excimer laser of lower wavelength (248 nm) for the i-line (365 nm) as the light source for exposure. However, for the manufacture of DRAM with a degree of integration of 1 G or greater requiring further finer processing technology (working size up to 0.2 μm), a light source of further shorter wavelength is needed. In particular, photography using an ArF excimer laser (193 nm) is now under consideration.

In the case of lithography using light of a short wavelength of 220 nm or shorter as typified by an ArF excimer laser, in order to form fine patterns, photo-resists are required to have new properties which cannot be met by conventional materials. For this reason, since Ito et al. proposed a chemically amplified positive resist composition comprising a polyhydroxystyrene resin whose hydroxyl group is protected with a tert-butoxycarbonyloxy group (t-Boc group), known as PBOCST, and a photoacid generator in the form of an onium salt, a number of high sensitivity, high resolution resist compositions have been developed. Although these chemically amplified positive resist compositions have high sensitivity and high resolution, formation of a fine pattern having a high aspect ratio is deemed difficult when the mechanical strength of the resultant pattern is taken into account.

A number of chemically amplified positive resist compositions using polyhydroxystyrene as a base resin and having sensitivity to deep-UV, electron beams and x-rays are known in the art. These resist compositions rely on a single layer resist technique although a two-layer resist technique is advantageous in forming high aspect ratio patterns on stepped substrates. Because of such outstanding problems of substrate steps, light reflection from substrates, and difficult formation of high aspect ratio patterns, the known resist compositions are far from practical use.

It is known that the two-layer resist technique is advantageous in forming high aspect ratio patterns on stepped substrates. It is also known that in order to develop two-layer resist films with conventional alkali developers, silicone polymers having hydrophilic groups such as hydroxyl and carboxyl groups are required. Since silicone polymers having hydroxyl groups directly attached thereto, however, undergo crosslinking reaction in the presence of acid, it is difficult to apply such silanols to chemically amplified positive resist materials.

Recently, as the chemically amplified silicone system positive resist material capable of solving these problems, chemically amplified silicone system positive resist materials comprising polyhydroxybenzylsilsesquioxane, known as a stable alkali soluble silicone polymer, in which some phenolic hydroxyl groups are protected with t-Boc groups, and photoacid generators combined therewith were proposed (Japanese Patent Application Kokai (JP-A) No. 118651/1995 and SPIE, Vol. 1952 (1993), 377).

However, the polymers used in these silicone resist materials have aromatic rings, which cause substantial light absorption at a wavelength of 220 nm or shorter. Thus these prior art resins as such cannot be applied to photography using light of a short wavelength of 220 nm or shorter. Since the majority of exposure light is absorbed at the surface of resist, exposure light does not penetrate through the resist to the substrate, failing to form a fine resist pattern. (See Sasago et al., "ArF Excimer Laser Lithography (3)—Resist Rating—," the preprint of the 35th Applied Physics Society Related Union Meeting, 1P-K4 (1989)).

One exemplary phenyl group-free base resin for chemically amplified silicone system positive resist materials is disclosed in JP-A 323611/1993. Since all hydrophilic groups such as carboxyl and hydroxyl groups necessary to enable alkali development have been protected in this base polymer, many protective groups must be decomposed before exposed areas can be dissolved in the developer. Then the amount of photoacid generator added to this end is increased and the sensitivity is exacerbated. In addition, the decomposition of many protective groups has the high possibility of causing a change of film thickness and generating stresses or bubbles in the film. A resist material having high sensitivity and suited for fine patterning is not available.

SUMMARY OF THE INVENTION

An object of the invention is to provide a novel silicone polymer useful as a base resin of a chemically amplified positive resist composition which has a high sensitivity and resolution, is advantageously applicable to the two-layer resist technique suitable for forming high aspect ratio patterns, and can form a heat resistant pattern; a chemically amplified positive resist composition comprising the polymer as a base resin; and a pattern forming method.

Making extensive investigations in order to achieve the above object, we have found that an aromatic ring-free high molecular weight silicone compound (or silicone polymer) comprising recurring units of the general formula (1) shown below and having a weight average molecular weight of 1,000 to 50,000 as well as a chemically amplified positive resist composition comprising the silicone polymer and a photoacid generator added thereto, especially a chemically amplified positive resist composition further comprising a dissolution regulator in addition to the photoacid generator, and a chemically amplified positive resist composition further comprising a basic compound are effective for increasing the dissolution contrast of resist and especially a dissolution rate after exposure; that a chemically amplified positive resist composition further comprising a compound having a group represented by ≡C—COOH in a molecule is effective for improving the PED stability of resist and the edge roughness on nitride film substrates; and that the composition is further improved in ease of coating and storage stability by further blending an acetylene alcohol derivative. Therefore, the chemically amplified silicone system positive resist compositions according to the invention have high transparency, high resolution, improved latitude of exposure, process adaptability, and practical applicability, and are very useful as ultra-LSI resist materials advantageous for precise micro-processing. The present invention is predicated on these findings.

Briefly, the present invention provides a high molecular weight silicone compound, a chemically amplified positive resist composition comprising the same, and a pattern forming method, which are as defined below.

[1] A high molecular weight silicone compound comprising recurring units of the following general formula (1) and having a weight average molecular weight of 1,000 to 50,000.

(1)

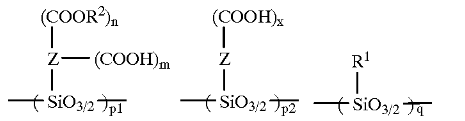

In the formula, Z is a di- to hexavalent, monocyclic or polycyclic hydrocarbon group or bridged cyclic hydrocarbon group of 5 to 12 carbon atoms, $R^1$ is a normal, branched or cyclic, substituted or unsubstituted alkyl or alkenyl group of 1 to 8 carbon atoms, $R^2$ is an acid labile group, letter m is 0 or a positive integer, n is a positive integer, m and n satisfying $m+n \leqq 5$, x is a positive integer, p1 and p2 are positive numbers, q is 0 or a positive number, p1, p2 and q satisfying $0<p1/(p1+p2+q) \leqq 0.9$, $0<p2/(p1+p2+q) \leqq 0.9$, $0 \leqq q/(p1+p2+q) \leqq 0.7$, and p1+p2+q=1. More than 0 mol % to 90 mol % of the entire hydrogen atoms of carboxyl groups may be crosslinked within a molecule and/or between molecules with crosslinking groups having C—O—C linkages of the following general formula (2a) or (2b).

(2a)

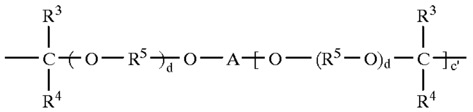

(2b)

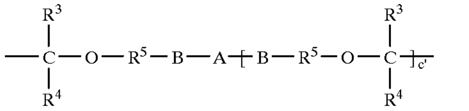

In the formulae, each of $R^3$ and $R^4$ is hydrogen or a normal, branched or cyclic alkyl group of 1 to 8 carbon atoms, or $R^3$ and $R^4$, taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7.

[2] The high molecular weight silicone compound of [1] comprising recurring units of the following general formula (3).

(3)

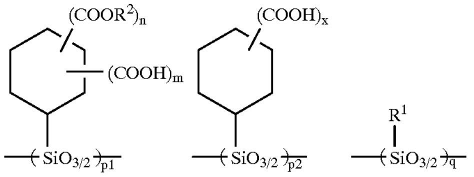

In the formula, $R^1$, $R^2$, m, n, x, p1, p2, and q are as defined above.

[3] The high molecular weight silicone compound of [1] or [2] wherein the crosslinking group having C—O—C linkages represented by the general formula (2a) or (2b) is represented by the following general formula (2a''') or (2b''').

(2a''')

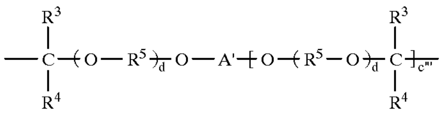

(2b''')

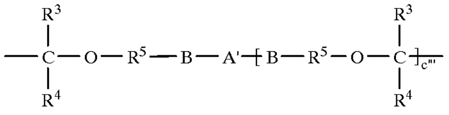

In the formulae, each of $R^3$ and $R^4$ is hydrogen or a normal, branched or cyclic alkyl group of 1 to 8 carbon atoms, or $R^3$ and $R^4_1$ taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 5, A' is a c''-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c'' is an integer of 2 to 4, and c''' is an integer of 1 to 3.

[4] The high molecular weight silicone compound of [1], [2] or [3] wherein $R^2$ is at least one group selected from the class consisting of groups of the following general formula (4), groups of the following general formula (5), tertiary alkyl groups of 4 to 20 carbon atoms, trialkylsilyl groups whose alkyl groups each have 1 to 6 carbon atoms, and oxoalkyl groups of 4 to 20 carbon atoms.

(4)

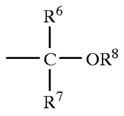

(5)

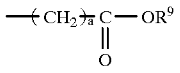

In the formulae, $R^6$ and $R^7$ each are hydrogen or a normal, branched or cyclic alkyl group of 1 to 8 carbon atoms, $R^8$ is a monovalent hydrocarbon group of 1 to 18 carbon atoms which may have a hetero atom, or $R^6$ and $R^7$, $R^6$ and $R^8$, or $R^7$ and $R^8$, taken together, may form a ring, with the proviso that $R^6$, $R^7$ and $R^8$ each are a normal or branched alkylene group of 1 to 18 carbon atoms when they form a ring, $R^9$ is a tertiary alkyl group of 4 to 20 carbon atoms, a trialkylsilyl group whose alkyl groups each have 1 to 6 carbon atoms, an oxyalkyl group of 4 to 20 carbon atoms or a group of the above general formula (4), and letter a is an integer of 0 to 6.

[5] A high molecular weight silicone compound comprising recurring units of the following general formula (3a), wherein the hydrogen atoms of some of the carboxyl groups are partially replaced by acid labile groups, the silicone compound is crosslinked within a molecule and/or between molecules with crosslinking groups having C—O—C linkages resulting from reaction between some of the remaining carboxyl groups and an alkenyl ether compound and/or halogenated alkyl ether compound, and the amount of said acid labile groups and said crosslinking groups combined is on the average more than 0 mol % to 80 mol % of the entire carboxyl groups in formula (1).

(3a)

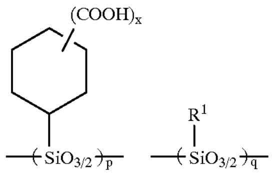

In the formula, $R^1$ is a normal, branched or cyclic, substituted or unsubstituted alkyl or alkenyl group of 1 to 8 carbon atoms, letter x is a positive integer, p is a positive number, and q is 0 or a positive number, p and q satisfy $0 \leqq q/(p+q) \leqq 0.6$ and $p+q=1$.

[6] A high molecular weight silicone compound of [5] comprising recurring units of the following general formula (3b), wherein the silicone compound is crosslinked within a molecule and/or between molecules with crosslinking groups having C—O—C linkages resulting from reaction between some of the carboxyl groups represented by R and an alkenyl ether compound and/or halogenated alkyl ether compound, and the amount of said acid labile groups and said crosslinking groups combined is on the average more than 0 mol % to 80 mol % of the entire carboxyl groups in formula (3a).

(3b)

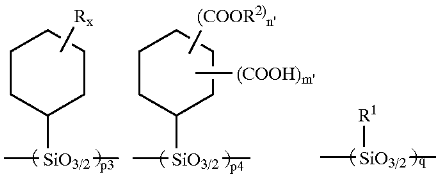

In the formula, R is a carboxyl group or $COOR^2$, at least one of R groups being a carboxyl group, $R^1$ is a normal, branched or cyclic, substituted or unsubstituted alkyl or alkenyl group of 1 to 8 carbon atoms, $R^2$ is an acid labile group, letter x is a positive integer, m' is 0 or a positive integer, n' is a positive integer, m' and n' satisfy $m'+n' \leqq 5$, p3 is a positive number, p4 is 0 or a positive number, q is 0 or a positive number, p3, p4 and q satisfy $0<p3/(p3+p4+q) \leqq 0.8$, $0 \leqq q/(p3+p4+q) \leqq 0.6$, $0.4 \leqq (p3+p4)/(p3+p4+q) \leqq 1$, and $p3+p4+q=1$.

[7] The high molecular weight silicone compound of [6] comprising recurring units of the following general formula (3c), wherein some hydrogen atoms are eliminated from the carboxyl groups represented by R to leave terminal oxygen atoms which are crosslinked with divalent or polyvalent crosslinking groups having C—O—C linkages of the following general formula (2a) or (2b) within a molecule and/or between molecules, and the amount of said acid labile groups and said crosslinking groups combined is on the average more than 0 mol % to 80 mol % of the entire carboxyl groups in formula (3a).

(3c)

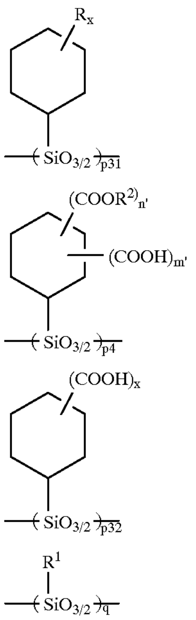

In the formula, R is a carboxyl group or $COOR^2$, at least one of R groups being a carboxyl group, $R^1$ is a normal, branched or cyclic, substituted or unsubstituted alkyl or alkenyl group of 1 to 8 carbon atoms, $R^2$ is an acid labile group, letter p31 is a positive number, p32, p4 and q each are 0 or a positive number, p31, p32, p4 and q satisfy $0<p31/(p31+p32+p4+q) \leqq 0.8$, $0 \leqq p4/(p31+p32+p4+q) \leqq 0.8$, $0 \leqq q/(p31+p32+p4+q) \leqq 0.6$, $0.4 \leqq (p31+p32+p4)/(p31+p32+p4+q) \leqq 1$, and $p31+p32+p4+q=1$, x is a positive integer, m' is 0 or a positive integer, n' is a positive integer, m' and n' satisfy m'+n'≦5.

(2a)

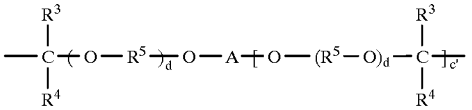

(2b)

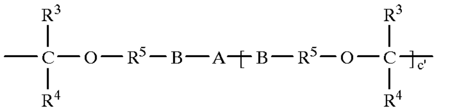

In the formulae, each of $R^3$ and $R^4$ is hydrogen or a normal, branched or cyclic alkyl group of 1 to 8 carbon atoms, or $R^3$ and $R^4$, taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7.

[8] The high molecular weight silicone compound of [7] wherein the crosslinking group having C—O—C linkages represented by the general formula (2a) or (2b) is represented by the following general formula (2a''') or (2b''').

(2a''')

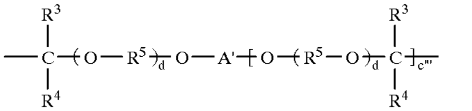

(2b''')

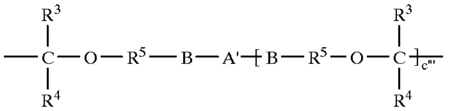

In the formula, each of $R^3$ and $R^4$ is hydrogen or a normal, branched or cyclic alkyl group of 1 to 8 carbon atoms, or $R^3$ and $R^4$, taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 5, A' is a c''-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c'' is an integer of 2 to 4, and c''' is an integer of 1 to 3.

[9] The high molecular weight silicone compound of [8] wherein $R^2$ is at least one group selected from the class consisting of groups of the following general formula (4), groups of the following general formula (5), tertiary alkyl groups of 4 to 20 carbon atoms, trialkylsilyl groups whose alkyl groups each have 1 to 6 carbon atoms, and oxoalkyl groups of 4 to 20 carbon atoms.

(4)

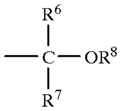

(5)

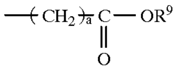

In the formulae, $R^6$ and $R^7$ each are hydrogen or a normal, branched or cyclic alkyl group of 1 to 8 carbon atoms, $R^8$ is a monovalent hydrocarbon group of 1 to 18 carbon atoms which may have a hetero atom, or $R^6$ and $R^7$, $R^6$ and $R^8$, or $R^7$ and $R^8$, taken together, may form a ring, with the proviso that $R^6$, $R^7$ and $R^8$ each are a normal or branched alkylene group of 1 to 18 carbon atoms when they form a ring, $R^9$ is a tertiary alkyl group of 4 to 20 carbon atoms, a trialkylsilyl group whose alkyl groups each have 1 to 6 carbon atoms, an oxyalkyl group of 4 to 20 carbon atoms or a group of the above general formula (4), and letter a is an integer of 0 to 6.

[10] A chemically amplified positive resist composition comprising (A) an organic solvent, (B) a base resin in the form of the high molecular weight silicone compound of any one of [1] to [9], and (C) a photoacid generator.

[11] The resist composition of [10] further comprising (D) a dissolution regulator.

[12] The resist composition of [10] or [11] further comprising (E) a basic compound.

[13] The resist composition of any one of [10] to [12] further comprising (F) a compound having a group represented by ≡C—COOH in a molecule.

[14] The resist composition of any one of [10] to [13] further comprising (G) an acetylene alcohol derivative.

[15] A method for forming a pattern comprising the steps of:

(i) applying a chemically amplified positive resist composition according to any one of [10] to [14] onto a substrate, (ii) heat treating the coated film and then exposing it to actinic radiation having a wavelength of up to 300 nm or electron beams through a photo mask, and (iii) optionally heat treating the exposed film and developing it with a developer.

More particularly, aside from phenyl-bearing silicone polymers as disclosed in JP-A 118651/1994, we have investigated and sought for a polymer in which alkali-soluble groups are not entirely, but partially, protected with acid labile groups, and which provides a high transmittance to light in the deep-UV region and a high resolution. On the other hand, known phenyl-free silicone polymers include a silicone polymer having an ethylcarboxyl group as disclosed in JP-A 323611/1993. When a polysiloxane having hydrogen atoms is reacted with an unsaturated carboxylic acid such as methacrylic acid as in this synthesis process, it is difficult to obtain a silicone polymer as illustrated in JP-A 323611/1993 because of preferential occurrence of addition reaction at the α-position of the unsaturated carboxylic acid. Since effecting hydrosilylation reaction on polymers is difficult in a quantitative sense, it is difficult to provide a constant supply of silicone polymer. Further, the quality control of resist is difficult.

As opposed to these polymers, a resist composition comprising a silicone polymer obtained by introducing acid labile groups into some of the carboxyl groups of an aromatic ring-free high molecular weight silicone compound is highly transmissive to light of a short wavelength of 220 nm or shorter and can form a pattern with such exposure light. The present invention is predicated on this finding.

Further, a resist composition comprising a silicone polymer which has been crosslinked within a molecule and/or between molecules with crosslinking groups having C—O—C linkages resulting from reaction of some carboxyl groups therein with an alkenyl ether compound and/or halogenated alkyl ether compound exerts a dissolution inhibitory effect even in a low proportion of crosslinking and exhibits improved heat resistance on account of the increased molecular weight due to crosslinking. Additionally, since the polymer reduces its molecular weight as a result of deblocking of crosslinking groups after exposure rather than before exposure, the resist film can be increased in dissolution contrast and eventually has a high sensitivity and high resolution. Also, since the problems of footing and a difficultly soluble subsurface stratum are minimized, the chemically amplified positive resist composition allows the size and configuration of a resist pattern to be controlled in terms of composition, and offers improved process adaptability. The present invention is also predicated on this finding.

DETAILED DESCRIPTION OF THE INVENTION

The novel silicone polymer of the invention is a high molecular weight silicone compound comprising recurring units of the following general formula (1).

(1)

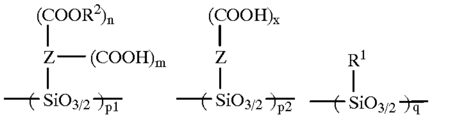

In the formula, Z is a di- to hexavalent, monocyclic or polycyclic hydrocarbon group or bridged cyclic hydrocarbon group of 5 to 12 carbon atoms, $R^1$ is a normal, branched or cyclic, substituted or unsubstituted alkyl or alkenyl group of 1 to 8 carbon atoms, $R^2$ is an acid labile group, letter m is 0 or a positive integer, n is a positive integer (i.e., an integer of at least 1), m and n satisfying $m+n \leqq 5$, x is a positive integer, p1 and p2 are positive numbers, q is 0 or a positive number, p1, p2 and q satisfying $0<p1/(p1+p2+q) \leqq 0.9$, $0<p2/(p1+p2+q) \leqq 0.9$, $0 \leqq q/(p1+p2+q) \leqq 0.7$, and $p1+p2+q=1$.

Herein, the di- to hexavalent, monocyclic or polycyclic hydrocarbon groups or bridged cyclic hydrocarbon groups of 5 to 12 carbon atoms represented by Z are illustrated by the following hydrocarbon groups, though not limited thereto. Exemplary hydrocarbon groups are cyclopentanediyl, cyclohexanediyl, cycloheptanediyl, cyclopentanetriyl, cyclohexanetriyl, cycloheptanetriyl, cyclohexanetetrayl, cyclohexanepentayl, cyclohexanehexayl, cyclooctanediyl, cyclononanediyl, cyclodecanediyl, cyclooctanetriyl, cyclononanetriyl, cyclodecanetriyl, norbornanediyl, isobornanediyl, norbornanetriyl, isobornanetriyl, adamantanediyl, tricyclo[5,2,1,$0^{2,6}$]decanediyl, adamantanetriyl, tricyclo[5,2,1,$0^{2,6}$]decanetriyl, tricyclo[5,2,1,$0^{2,6,}$]decanemethylenediyl, and tricyclo[5,2,1,$0^{2,6}$]decanemethylenetriyl.

Preferred are silicone polymers comprising recurring units of the following general formula (3):

(3)

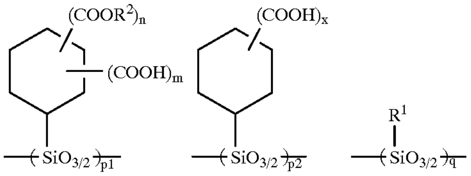

wherein $R^1$, $R^2$, m, n, x, p1, p2, and q are as defined above.

Herein, the normal, branched or cyclic, unsubstituted alkyl or alkenyl groups of 1 to 8 carbon atoms represented by $R^1$ include methyl, ethyl, propyl, isopropyl, n-butyl, isobutyl, tert-butyl, cyclohexyl, cyclopentyl, vinyl, allyl, propenyl, butenyl, hexenyl, and cyclohexenyl. The substituted alkyl or alkenyl groups include those unsubstituted alkyl or alkenyl groups wherein all or some of the hydrogen atoms are replaced by such groups as cyano groups, nitro groups and alkoxy groups of 1 to 5 carbon atoms. Letter x is an integer, preferably from 1 to 3, and especially 1 or 2. In formula (1), p1 and p2 are positive numbers, and q is 0 or a positive number, satisfying $p1+p2+q=1$. That is, p1, p2 and q represent the proportions of recurring units affixed with p1, recurring units affixed with p2, and recurring units affixed with q in the inventive compound, respectively. These letters satisfy $0 \leqq q/(p1+p2+q) \leqq 0.7$, and especially $0 \leqq q/(p1+p2+q) \leqq 0.6$. If this value is in excess of 0.7, the siloxane polymer becomes alkali insoluble and inappropriate as a base polymer for resist. Also, with too small values of $q/(p1+p2+q)$, heat resistance is sometimes low. These letters further satisfy $0<p1/(p1+p2+q) \leqq 0.9$, more preferably $0.3<p1/(p1+p2+q) \leqq 0.8$, and $0<p2/(p1+p2+q) \leqq 0.9$, more preferably $0.2<p2/(p1+p2+q) \leqq 0.7$. If p1 is 0, the contrast of alkali dissolution rate becomes low, resulting in a poor resolution. If p1 is in excess of 0.9, it may sometimes occur that alkali solubility is lost, the film thickness changes and stresses or bubbles generate in the film during alkali development, and adhesion to the substrate is lost due to fewer hydrophilic groups.

The acid labile groups represented by $R^2$ may be selected from a variety of acid labile groups, and preferably groups of one or more types selected from groups of the following general formulae (4) and (5), tert-alkyl groups of 4 to 20 carbon atoms, trialkylsilyl groups whose alkyl groups each have 1 to 6 carbon atoms, and oxoalkyl groups of 4 to 20 carbon atoms.

(4)

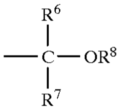

(5)

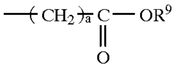

In the formulae, $R^6$ and $R^7$ each are a hydrogen atom or normal, branched or cyclic alkyl group having 1 to 8 carbon atoms, preferably 1 to 6 carbon atoms, more preferably 1 to 5 carbon atoms. $R^8$ is a monovalent hydrocarbon group of 1 to 18 carbon atoms, preferably 1 to 10 carbon atoms, more preferably 1 to 8 carbon atoms, which may have a hetero atom such as oxygen. Alternatively, $R^6$ and $R^7$, $R^6$ and $R^8$, or $R^7$ and $R^8$, taken together, may form a ring, with the proviso that $R^6$, $R^7$ and $R^8$ each are a normal or branched alkylene group having 1 to 18 carbon atoms, preferably 1 to 10 carbon atoms, more preferably 1 to 8 carbon atoms, when they form a ring. $R^9$ is a tertiary alkyl group having 4 to 20 carbon atoms, preferably 4 to 15 carbon atoms, more preferably 4 to 10 carbon atoms, a trialkylsilyl group whose alkyl groups each have 1 to 6 carbon atoms, an oxoalkyl group of 4 to 20 carbon atoms, preferably 4 to 15 carbon atoms, more preferably 4 to 10 carbon atoms, or a group of the above general formula (4). Letter a is an integer of 0 to 6.

The normal, branched or cyclic alkyl groups of 1 to 8 carbon atoms represented by $R^6$ and $R^7$ are the same as described for $R^1$.

Examples of the hydrocarbon group represented by $R^8$ include normal, branched or cyclic alkyl groups, substituted or unsubstituted aryl groups such as phenyl, p-methylphenyl, p-ethylphenyl, and alkoxyphenyl groups (e.g., p-methoxyphenyl), and aralkyl groups such as benzyl and phenethyl, as well as modified ones of these groups, for example, alkyl groups in which an oxygen atom intervenes, the hydrogen atom attached to a carbon atom is replaced by a hydroxyl group, or two hydrogen atoms are replaced by an oxygen atom to form a carbonyl group, as shown below.

$—(CH_2)_4OH$ $—(CH_2)_2O(CH_2)_3CH_3$

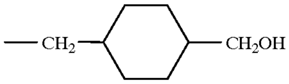

$—(CH_2)_2O(CH_2)_2OH$ $—(CH_2)_6OH$

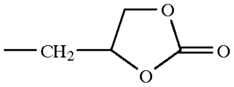

Examples of the tertiary alkyl group of 4 to 20 carbon atoms represented by $R^9$ include tert-butyl, 1-methylcyclohexyl, 2-(2-methyl)adamantyl and tert-amyl groups.

Examples of the trialkylsilyl group whose alkyl groups each have 1 to 6 carbon atoms include trimethylsilyl, triethylsilyl and dimethyl-tert-butyl groups. Examples of the oxoalkyl group of 4 to 20 carbon atoms include 3-oxocyclohexyl and groups of the following formulae.

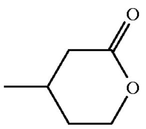
,
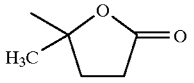

Examples of the acid labile group of the above formula (4) include linear or branched acetal groups such as 1-methoxyethyl, 1-ethoxyethyl, 1-n-propoxyethyl, 1-isopropoxyethyl, 1-n-butoxyethyl, 1-iso-butoxyethyl, 1-sec-butoxyethyl, 1-tert-butoxyethyl, 1-tert-amyloxyethyl, 1-ethoxy-n-propyl, 1-cyclohexyloxyethyl, methoxypropyl, ethoxypropyl, 1-methoxy-1-methylethyl, and 1-ethoxy-1-methylethyl; and cyclic acetal groups such as tetrahydrofuranyl and tetrahydropyranyl, with the ethoxyethyl, butoxyethyl and ethoxypropyl groups being preferred. Examples of the acid labile group of the above formula (5) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl groups.

In the above general formula (1), more than 0 mol % to 90 mol %, preferably more than 0 mol % to 80 mol %, and further preferably 1 to 60 mol % of the entire hydrogen atoms of carboxyl groups may be crosslinked within a molecule and/or between molecules with crosslinking groups having C—O—C linkages of the general formula (2a) or (2b).

Description is further made on the polymer having crosslinking groups. The inventive silicone polymer may be a high molecular weight silicone compound comprising recurring units of the following general formula (3a), wherein the hydrogen atoms of some of the carboxyl groups are partially replaced by acid labile groups, the silicone compound is crosslinked within a molecule and/or between molecules with crosslinking groups having C—O—C linkages resulting from reaction between some of the remaining carboxyl groups and an alkenyl ether compound and/or halogenated alkyl ether compound, and the amount of the acid labile groups and the crosslinking groups combined is on the average more than 0 mol % to 80 mol % of the entire carboxyl groups in formula (1).

(3a)

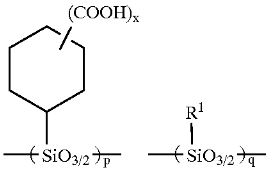

In the formula, $R^1$ is a normal, branched or cyclic, substituted or unsubstituted alkyl or alkenyl group of 1 to 8 carbon atoms as described above, letter x is a positive integer, p and q are positive numbers, satisfying $0 \leqq q/(p+q) \leqq 0.6$ and $p+q=1$.

In formula (3a), p and q are positive numbers satisfying $p+q=1$. That is, p and q represent the proportions of recurring units affixed with p and recurring units affixed with q, respectively, and satisfy $0 \leqq q/(p+q) \leqq 0.6$, preferably $0 \leqq q/(p+q) \leqq 0.5$. If $q/(p+q) \leqq 0.6$ is not satisfied, the siloxane polymer becomes alkali insoluble and inappropriate as a base polymer for resist. Also, since heat resistance is sometimes low with too small values of q/(p+q), it is thus preferred and effective that q/(p+q) is 0.2 or more. By properly selecting the values of p and q within the above-defined ranges, the size and configuration of a resist pattern can be controlled as desired.

Illustratively, the silicone polymer is a high molecular weight silicone compound comprising recurring units of the following general formula (3b), wherein the silicone compound is crosslinked within a molecule and/or between molecules with crosslinking groups having C—O—C linkages resulting from reaction between some of the carboxyl groups represented by R and an alkenyl ether compound and/or halogenated alkyl ether compound, and the amount of the acid labile groups and the crosslinking groups combined is on the average more than 0 mol % to 80 mol % of the entire carboxyl groups in formula (1).

(3b)

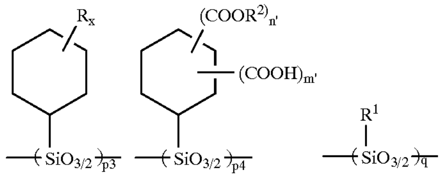

In the formula, R is a carboxyl group or $COOR^2$, at least one of R groups being a carboxyl group, $R^1$ is a normal, branched or cyclic, substituted or unsubstituted alkyl or alkenyl group of 1 to 8 carbon atoms, $R^2$ is an acid labile group, letter x is a positive integer, m' is 0 or a positive integer, n' is a positive integer, m' and n' satisfy $m'+n' \leqq 5$, p3 is a positive number, p4 is 0 or a positive number, q is 0 or a positive number, p3, p4 and q satisfy $0<p3/(p3+p4+q) \leqq 0.8$, $0 \leqq q/(p3+p4+q) \leqq 0.6$, $0.4 \leqq (p3+p4)/(p3+p4+q) \leqq 1$, and $p3+p4+q=1$. It is understood that $p3+p4=p$ wherein p is as defined above.

The crosslinking group having a C—O—C linkage is exemplified by groups of the following general formulae (2a) and (2b).

(2a)

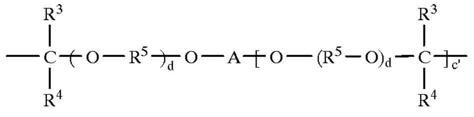

(2b)

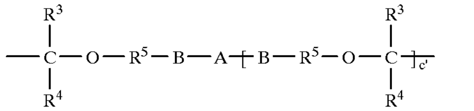

In these formulae, $R^3$ and $R^4$ each are hydrogen or a normal, branched or cyclic alkyl group of 1 to 8 carbon atoms. Alternatively, $R^3$ and $R^4$, taken together, may form a ring, with the proviso that each of $R^3$ and $R^4$ is a normal or branched alkylene group of 1 to 8 carbon atoms when they form a ring. $R^5$ is a normal or branched alkylene group of 1 to 10 carbon atoms. Letter d is 0 or an integer of 1 to 10. A is a c-valent aliphatic or alicyclic saturated hydrocarbon group, aromatic hydrocarbon group or heterocyclic group of 1 to 50 carbon atoms (preferably, a normal or branched alkylene, alkyltriyl or alkyltetrayl group of 1 to 20 carbon atoms or an arylene group of 6 to 30 carbon atoms), which may have an intervening hetero atom and in which the hydrogen atom attached to a carbon atom may be partially replaced by a hydroxyl group, carboxyl group, acyl group or fluorine atom. B is —CO—O—, —NHCO—O— or —NHCONH—. Letter c is an integer of 2 to 8, and c' is an integer of 1 to 7.

Herein, the normal, branched or cyclic alkyl groups of 1 to 8 carbon atoms are as exemplified above. Examples of the group represented by A are described later. These crosslinking groups of formulae (2a) and (2b) originate from alkenyl ether compounds and halogenated alkyl ether compounds to be described later.

As understood from the value of c' in formula (2a) or (2b), the crosslinking group is not limited to a divalent one and trivalent to octavalent groups are acceptable. For example, the divalent crosslinking group is exemplified by groups of the following formulae (2a') and (2b') and the trivalent crosslinking group is exemplified by groups of the following formulae (2a") and (2b").

(2a')

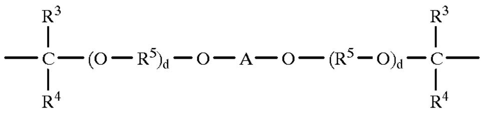

(2b')

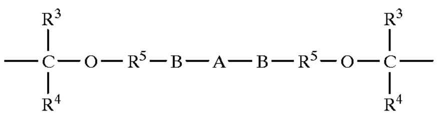

(2a")

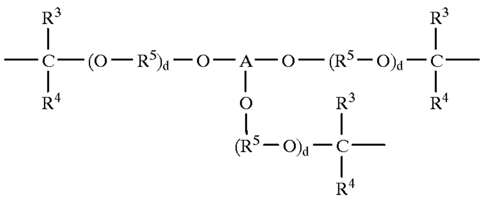

(2b")

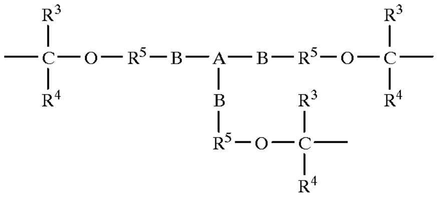

Preferred crosslinking groups are of the following formulae (2a''') and (2b'''):

(2a''')

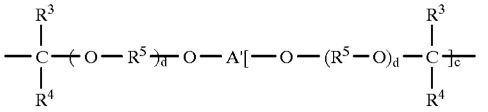

(2b''')

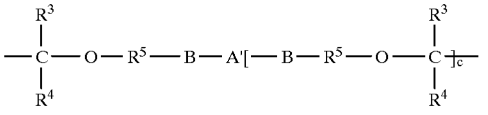

wherein $R^3$ and $R^4$ each are hydrogen or a normal, branched or cyclic alkyl group of 1 to 8 carbon atoms, or $R^3$ and $R^4$, taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 5, A' is a c"-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c" is an integer of 2 to 4, and c''' is an integer of 1 to 3.

An illustrative example of the silicone polymer of the above formula (3a) according to the invention is a high molecular weight silicone compound comprising recurring units of the following general formula (3c), wherein some hydrogen atoms are eliminated from the carboxyl groups represented by R to leave terminal oxygen atoms which are crosslinked with divalent or polyvalent crosslinking groups having C—O—C linkages of the following general formula (2a) or (2b) within a molecule and/or between molecules, and the amount of the acid labile groups and the crosslinking groups combined is on the average more than 0 mol % to 80 mol % of the entire carboxyl groups in formula (3a).

(3c)

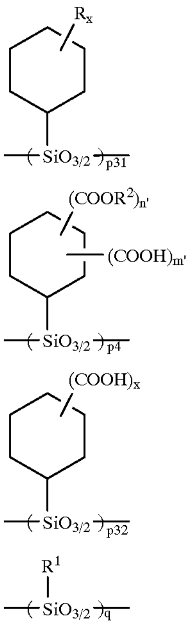

In the formula, R is a carboxyl group or $COOR^2$, at least one of R groups being a carboxyl group, $R^1$ is a normal, branched or cyclic, substituted or unsubstituted alkyl or alkenyl group of 1 to 8 carbon atoms, $R^2$ is an acid labile group as defined above, letter p31 is a positive number, p32, p4 and q each are 0 or a positive number, p31, p32, p4 and q satisfy $0<p31/(p31+p32+p4+q)\leqq 0.8$, $0\leqq p4/(p31+p32+p4+q)\leqq 0.8$, $0\leqq q/(p31+p32+p4+q)\leqq 0.6$, $0.4\leqq (p31+p32+p4)/(p31+p32+p4+q)\leqq 1$, and $p31+p32+p4+q=1$, x is a positive integer, m' is 0 or a positive integer, n' is a positive integer, m' and n' satisfy $m'+n'\leqq 5$. It is understood that $p31+p32=p3$ wherein p3 is as defined above.

While p31, p32, p4 and q are numbers as defined above, the preferred values of p31, p32, p4 and q are as defined below.

$0<p31/(p31+p32+p4+q)\leqq 0.8$, especially $0.002\leqq p31/(p31+p32+p4+q)\leqq 0.6$ $0\leqq p32/(p31+p32+p4+q)\leqq 0.5$, especially $0.01\leqq p32/(p31+p32+p4+q)\leqq 0.4$ $0\leqq p4/(p31+p32+p4+q)\leqq 0.8$, especially $0.01\leqq p4/(p31+p32+p4+q)\leqq 0.6$, $0\leqq q/(p31+p32+p4+q)\leqq 0.6$, especially $0.1\leqq q/(p31+p32+p4+q)\leqq 0.5$, $0.4\leqq (p31+p32+p42)/(p31+p32+p4+q)\leqq 1$ especially $0.5\leqq (p31+p32+p4)/(p31+p32+p4+q)\leqq 1$ Illustrative examples of the silicone polymer are represented by the following formulae (3'-1) and (3'-2).

(3'-1)

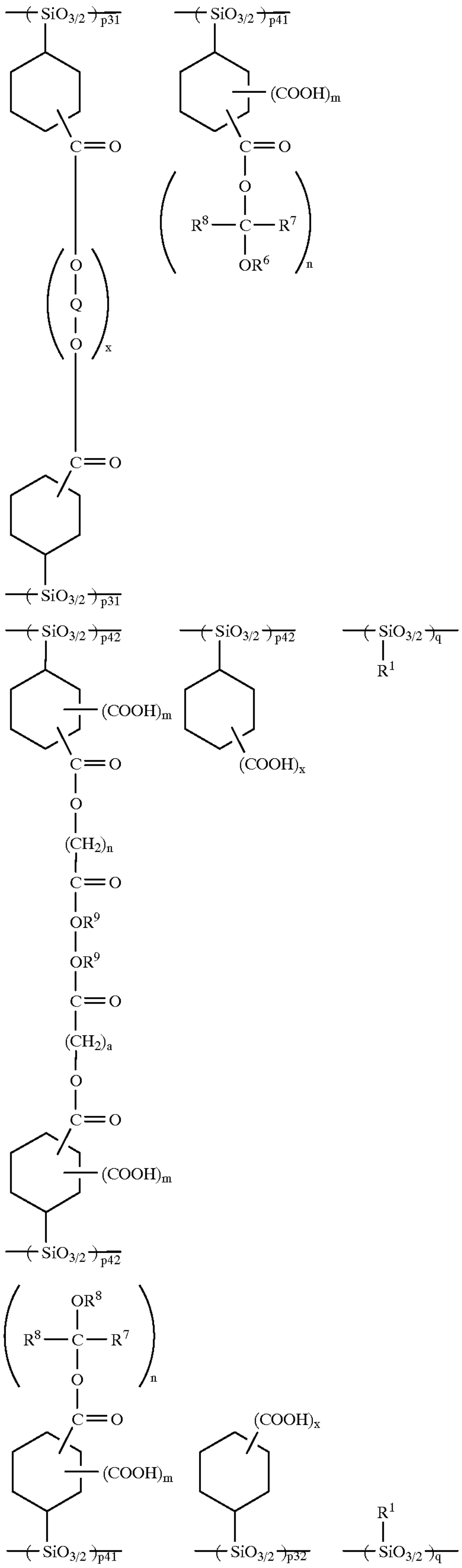

-continued (3'-2)

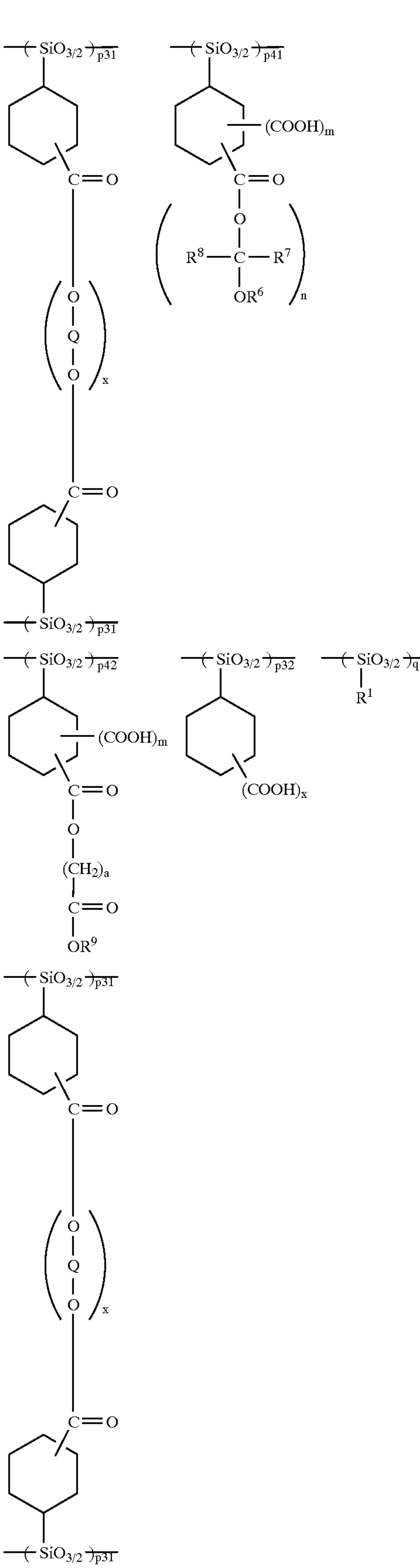

-continued

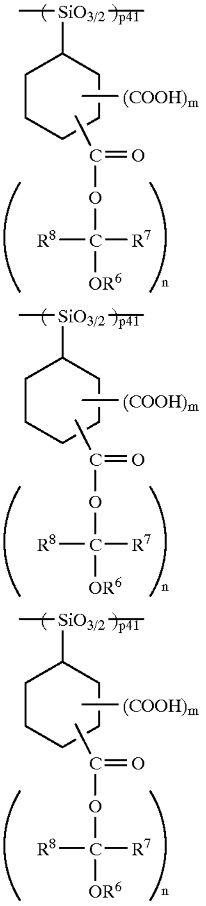

It is noted that p41 and p42 in the above formulae each are 0 or a positive number, they are not equal to 0 at the same time, and p41+p42=p4. Formula (3'-1) shows an intermolecular linkage and formula (3'-2) shows an intramolecular linkage. They may be present alone or in admixture. The value of p41/(p41+p42) is preferably from 0.1 to 1, more preferably from 0.5 to 1, and further preferably from 0.7 to 1.

Q is a crosslinking group having a C—O—C linkage, typically a crosslinking group of formula (2a) or (2b), preferably formula (2a'), (2b'), (2a") or (2b"), most preferably formula (2a'") or (2b'"). Where the crosslinking group is trivalent or more, Q is attached to at least three units of the following formulae in formula (3a).

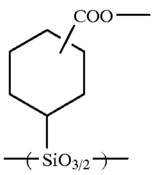

In the silicone polymer of the above formula (3a) according to the present invention, the hydrogen atoms of some carboxyl groups are replaced by acid labile groups and crosslinking groups having a C—O—C linkage as mentioned above. More preferably, the amount of the acid labile groups and the crosslinking groups combined is on the average from more than 0 mol % to 80 mol %, especially from 2 to 40 mol % of the entire carboxyl groups in formula (3a).

In this regard, the average proportion of the crosslinking group having a C—O—C linkage is from more than 0 mol % to 80 mol %, especially from 1 to 20 mol % of the entirety of the carboxyl groups in formula (3a). With 0 mol %, no benefits of the crosslinking group are obtained, resulting in a reduced contrast of alkali dissolution rate and low resolution. With more than 80 mol %, a too much crosslinked polymer will gel, become insoluble in alkali, induce a film thickness change, internal stresses or bubbles upon alkali development, and lose adhesion to the substrate due to fewer hydrophilic groups.

The average proportion of the acid labile group is from more than 0 mol % to 80 mol %, especially from 10 to 40 mol % of the entirety of the carboxyl groups in formula (3a). With 0 mol %, there result a reduced contrast of alkali dissolution rate and a poor resolution. With more than 80 mol %, alkali solubility may be lost and the affinity to an alkaline developer becomes low during development, resulting in a low resolution.

By properly selecting the amounts of the crosslinking group having a C—O—C linkage and the acid labile group within the above-defined ranges, the size and configuration of a resist pattern can be controlled as desired. In the silicone polymer according to the invention, the contents of the crosslinking group having a C—O—C linkage and the acid labile group have substantial influence on the dissolution rate contrast of a resist film and govern the properties of a resist composition relating to the size and configuration of a resist pattern.

Understandably, the above-mentioned silicone polymer may have acid labile groups of two or more types within its molecule, and two or more silicone polymers having different acid labile groups may be blended.

The silicone polymer of the invention should have a weight average molecular weight of 1,000 to 50,000, preferably 1,500 to 30,000. Polymers with a weight average molecular weight of less than 1,000 would provide resist materials with poor heat resistance whereas polymers with a weight average molecular weight of more than 50,000 would form resist materials which cannot be uniformly applied by spin coating.

The method for preparing the silicone polymer of the above formula (1) according to the invention is now described. The silicone polymer can be prepared by hydrolyzing a trichlorosilane compound bearing a di- to hexavalent, mono- or polycyclic hydrocarbon group or bridged cyclic hydrocarbon group of 5 to 12 carbon atoms having an alkyl carboxylate group attached thereto and optionally, a trichlorosilane compound having a normal, branched or cyclic alkyl group, further subjecting the hydrolytic condensate to thermal condensation, and hydrolyzing the alkyl ester group in a conventional manner (with KOH, NaOH or the like), thereby forming a silicone polymer of the following formula (1'). From the storage stability consideration, it is preferred to trimethylsilylate the polymer in order to protect silanol groups at the ends of its backbone. By introducing acid labile groups into carboxyl groups of the resulting silicone polymer, the end silicone polymer can be obtained.

(1')

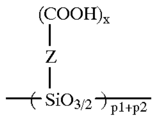

-continued

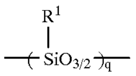

In the formula, $R^1$, p1, p2, q and x are as defined above, and x=m+n.

Introduction of the acid labile group can be carried out by well-known methods. For crosslinking with crosslinking groups having C—O—C linkages, methods using alkenyl ether compounds or halogenated alkyl ether compounds are useful.

More particularly, the silicone polymer bearing a crosslinking group having a C—O—C linkage according to the invention may be prepared in various ways, for example, by a method of introducing an acid labile group of the general formula (4) into a carboxyl group of a silicone polymer (1') resulting from the above-mentioned polymerization process, isolating the polymer, and reacting it with an alkenyl ether compound or halogenated alkyl ether compound whereby the polymer is crosslinked within a molecule and/or between molecules with a crosslinking group having a C—O—C linkage; a method of reacting a silicone polymer resulting from the above-mentioned polymerization process with an alkenyl ether compound or halogenated alkyl ether compound whereby the polymer is crosslinked within a molecule and/or between molecules with a C—O—C linkage, isolating the polymer, and introducing an acid labile group of the general formula (4) therein; or a method of carrying out reaction with an alkenyl ether compound or halogenated alkyl ether compound and introduction of an acid labile group of the general formula (4) together. The combination method of carrying out reaction with an alkenyl ether compound or halogenated alkyl ether compound and introduction of an acid labile group of the general formula (4) together is preferred. It is possible to further introduce into the thus obtained silicone polymer an acid labile group of the general formula (5), tert-alkyl, trialkylsilyl or oxoalkyl group, if necessary.

Exemplary methods include a first method using a silicone polymer comprising recurring units of the general formula (1'), an alkenyl ether compound of the general formula (I) or (II), and a compound of the general formula (4a) or a second method using a silicone polymer comprising recurring units of the general formula (1'), a halogenated alkyl ether compound of the general formula (VII) or (VIII), and a compound of the general formula (4b).

(1')

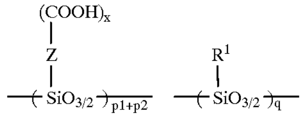

(I)

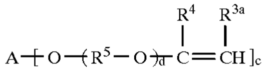

(II)

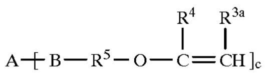

-continued (4a)

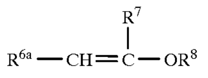

Here, $R^1$, Z, $R^4$, $R^5$, $R^7$, $R^8$, p1, p2, q, and x are as defined above, and $R^{3a}$ and $R^{6a}$ each are hydrogen or a normal, branched or cyclic alkyl group of 1 to 7 carbon atoms.

In the general formula (I) or (II) representing the vinyl ether compound, A is a c-valent (c is an integer of 2 to 8) aliphatic saturated hydrocarbon, alicyclic saturated hydrocarbon, aromatic hydrocarbon or heterocyclic group having 1 to 50 carbon atoms, B is —CO—O, —NHCO—O— or —NHCONH—, $R^5$ is a normal or branched alkylene group of 1 to 10 carbon atoms, and letter d is 0 or an integer of 1 to 10.

Examples of the c-valent aliphatic or alicyclic saturated hydrocarbon and aromatic hydrocarbon groups represented by A include substituted or unsubstituted alkylene groups having 1 to 50 carbon atoms, especially 1 to 40 carbon atoms, substituted or unsubstituted arylene groups having 6 to 50 carbon atoms, especially 6 to 40 carbon atoms (in these groups, a hetero atom such as O, NH, $N(CH_3)$, S and $SO_2$ may intervene and where substituted, the substituent is a hydroxyl, carboxyl, acyl group or fluorine atom), a combination of an alkylene group and an arylene group, and c"-valent groups obtained by eliminating one hydrogen atom attached to a carbon atom from the foregoing groups wherein c- is an integer of 3 to 8; and c-valent heterocyclic groups, and a combination of a heterocyclic group with any one of the foregoing hydrocarbon groups.

Illustrative examples of A are given below.

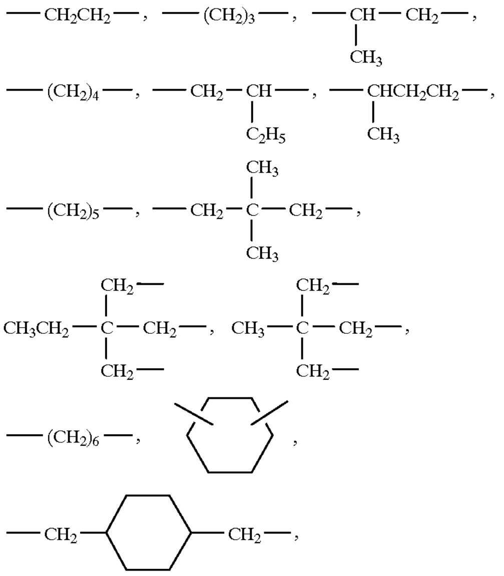

$-(CH_2CH_2O)_3-CH_2CH_2-$, $-(CH_2CH_2O)_{5-10}-CH_2-CH_2-$, $-(CH_2)_4-[O-(CH_2)_4]_{5-10}$, $-CH_2-CH_2-O-CH_2-CH_2-$, $-CH_2-CH_2-O-CH_2-CH_2-O-CH_2-CH_2-$,

-continued

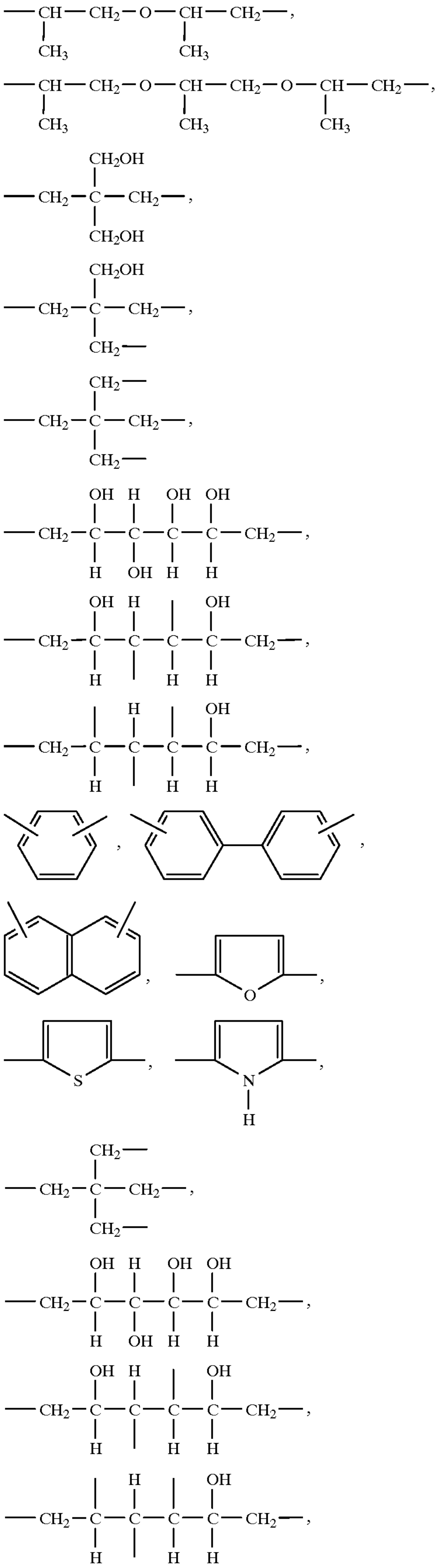

-continued
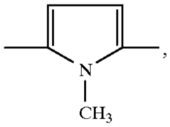,
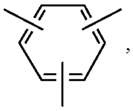,
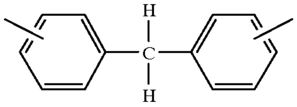,
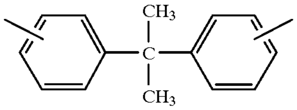,
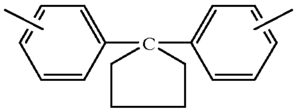,
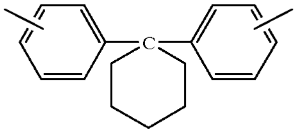,
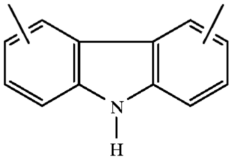,
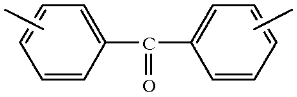,
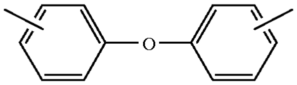,
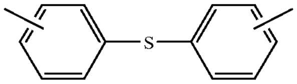,
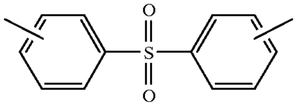,
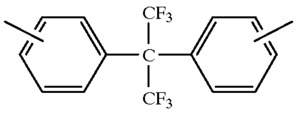,
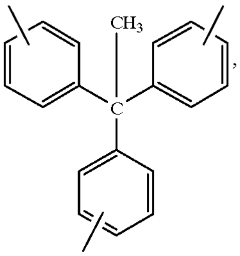,
-continued
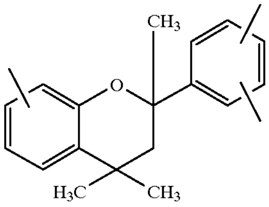,
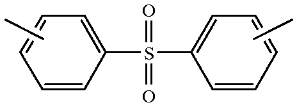,
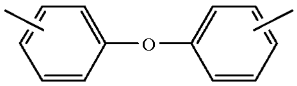,
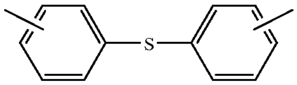,
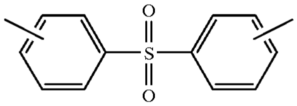,
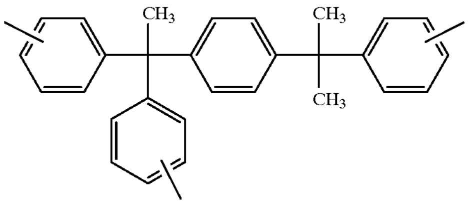,
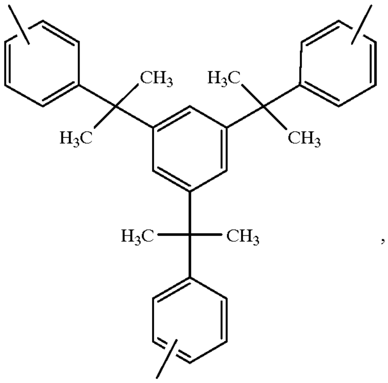,
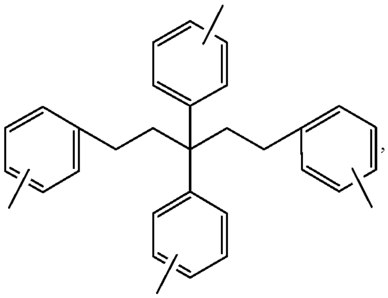, -continued

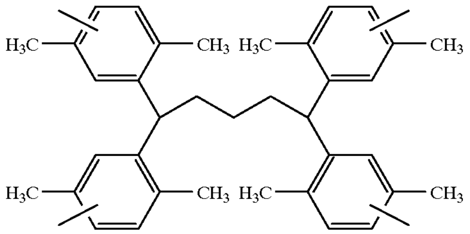

,

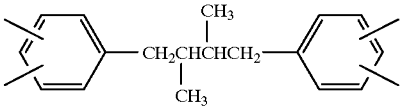

,

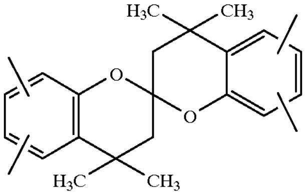

,

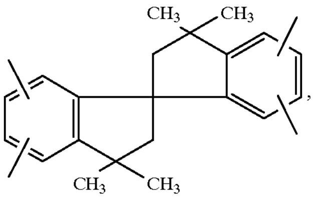

,

-continued

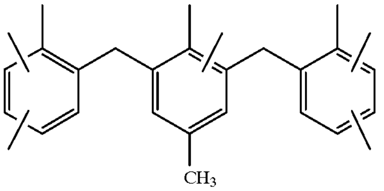

The compounds of the general formula (I) can be synthesized, for example, by the method described in Stephen C. Lapin, Polymers Paint Colour Journal, 179 (4237), 321 (1988), more specifically by reacting polyhydric alcohols or polyhydric phenols with acetylene or reacting polyhydric alcohols or polyhydric phenols with halogenated alkyl vinyl ethers.

Illustrative, non-limiting examples of the compound of the general formula (I) include ethylene glycol divinyl ether, triethylene glycol divinyl ether, 1,2-propane diol divinyl ether, 1,3-propane diol divinyl ether, 1,3-butane diol divinyl ether, 1,4-butane diol divinyl ether, tetramethylene glycol divinyl ether, neopentyl glycol divinyl ether, trimethylol propane trivinyl ether, trimethylol ethane trivinyl ether, hexane diol divinyl ether, 1,4-cyclohexane diol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylol propane triethylene vinyl ether, trimethylol propane diethylene vinyl ether, pentaerythritol diethylene vinyl ether, pentaerythritol triethylene vinyl ether, pentaerythritol tetraethylene vinyl ether as well as the compounds of the following formulae (I-1) through (I-31).

(I-1)

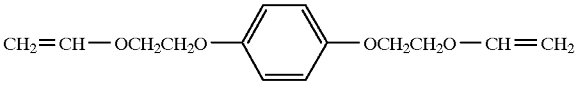

(I-2)

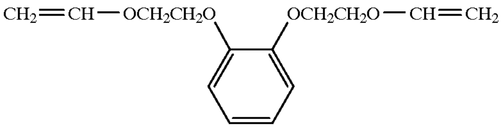

(I-3)

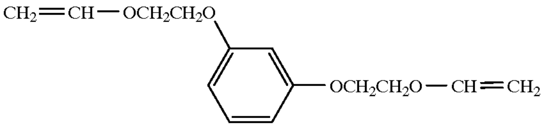

(I-4)

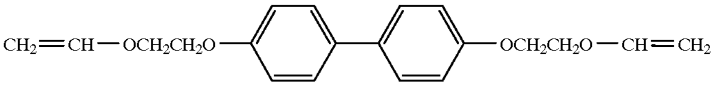

(I-5)

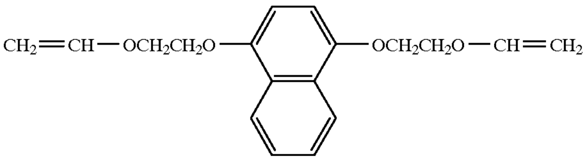

-continued
(I-6)
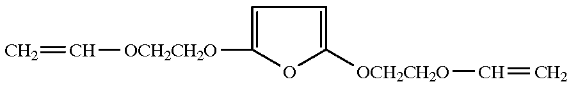
(I-7)
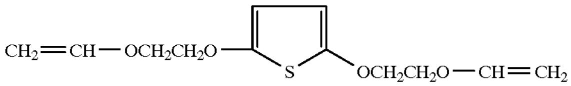
(I-8)
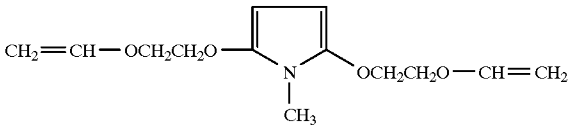
(I-9)
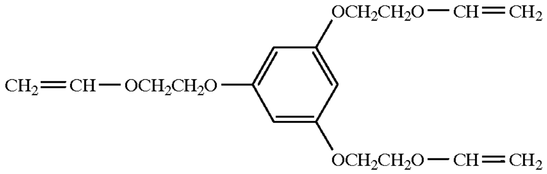
(I-10)
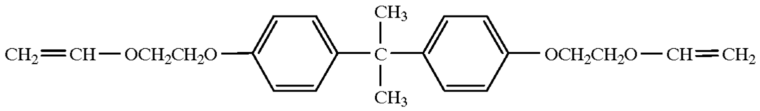
(I-11)
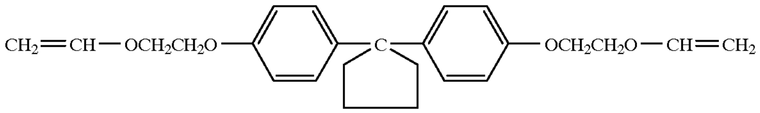
(I-12)
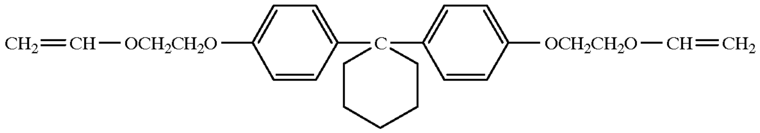
(I-13)
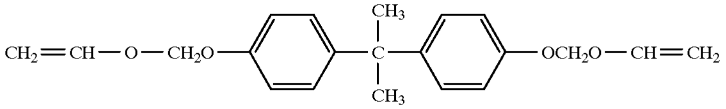
(I-14)
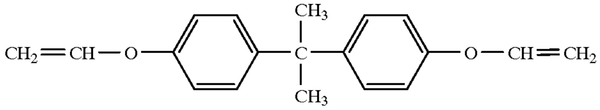
(I-15)
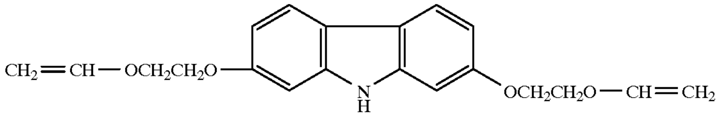

-continued
(I-16)
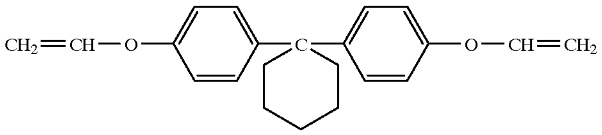
(I-17)
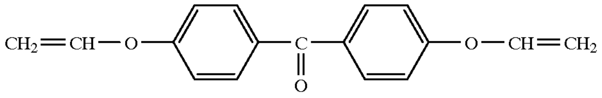
(I-18)
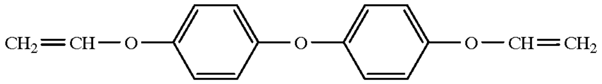
(I-19)
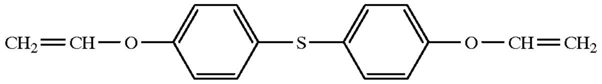
(I-20)
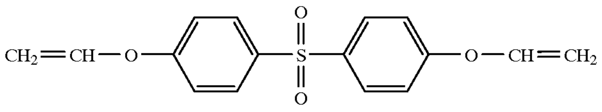
(I-21)
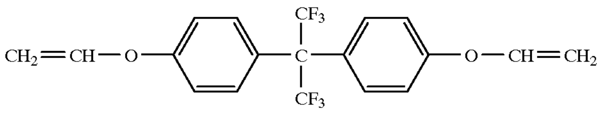
(I-22)
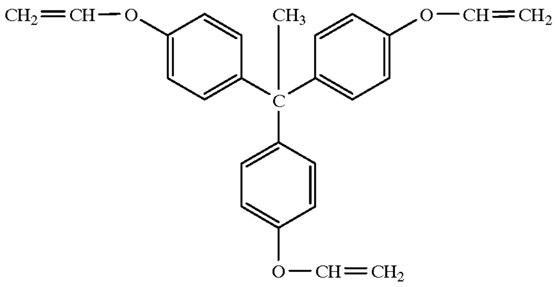
(I-23)
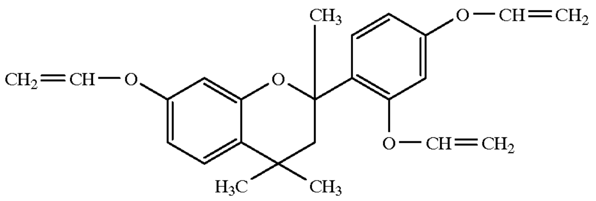
(I-24)
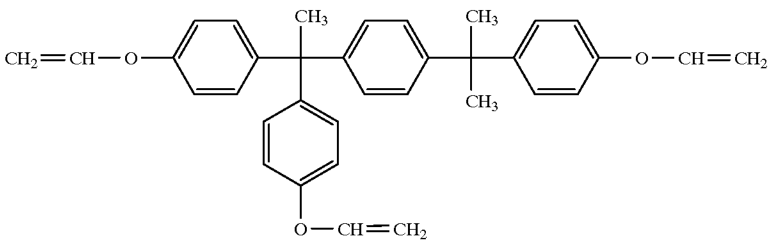

-continued
(I-25)
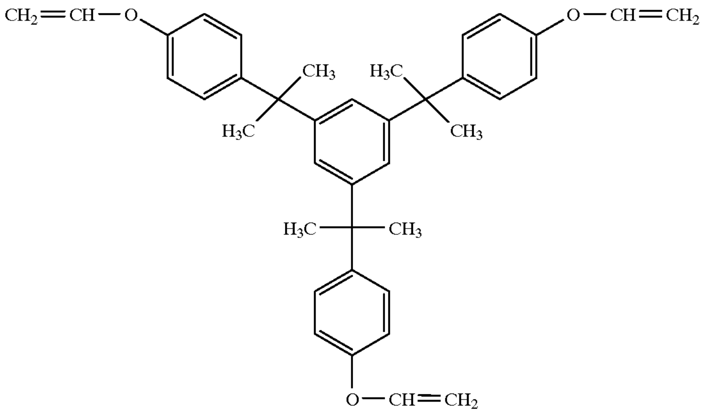
(I-26)
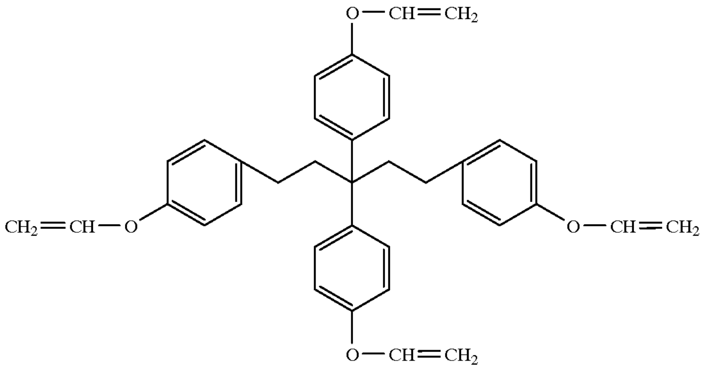
(I-27)
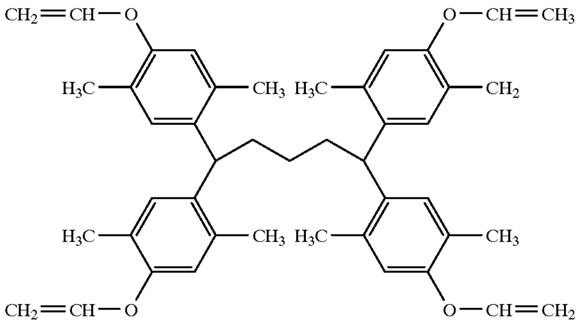
(I-28)
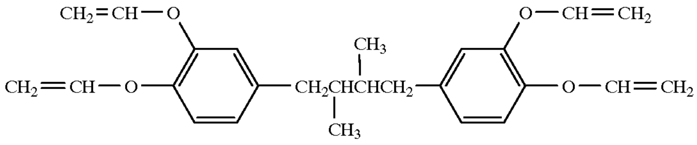
(I-29)
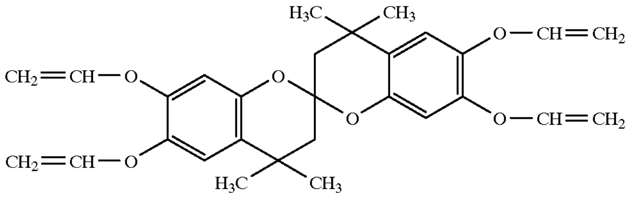

-continued (I-30)

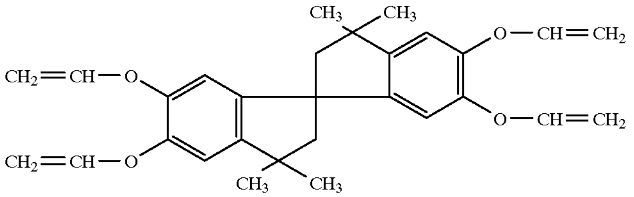

(I-31)

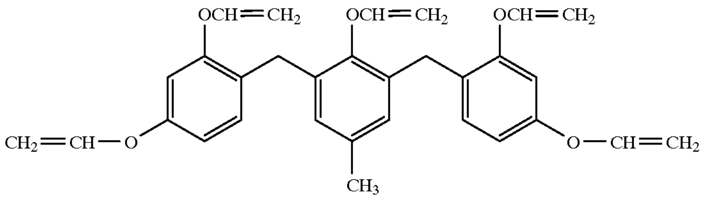

The compounds of formula (II) wherein B is —CO—O— can be synthesized by reacting polyvalent carboxylic acids with halogenated alkyl vinyl ethers. Illustrative, non-limiting examples of the compounds of formula (II) wherein B is —CO—O— include terephthalic diethylene vinyl ether, phthalic diethylene vinyl ether, isophthalic diethylene vinyl ether, phthalic dipropylene vinyl ether, terephthalic dipropylene vinyl ether, isophthalic dipropylene vinyl ether, maleic diethylene vinyl ether, fumaric diethylene vinyl ether, and itaconic diethylene vinyl ether.

Other useful alkenyl ether group-containing compounds which can be used herein are alkenyl ether group-containing compounds which are synthesized by reacting alkenyl ether compounds having active hydrogen as represented by the following formulae (III), (IV), and (V) with compounds having an isocyanato group.

(III)

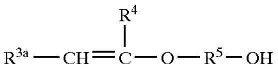

(IV)

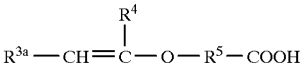

-continued (V)

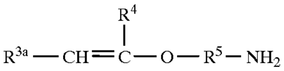

$R^{3a}$, $R^4$, and $R^5$ are as defined above.

Where B is —NHCOO— or —NHCONH—, the compounds having an isocyanato group of formula (II) may be those compounds described in "Handbook of Crosslinking Agents," Taiseisha, 1981, for example. Exemplary are polyisocyanates such as triphenylmethane triisocyanate, diphenylmethane diisocyanate, tolylene diisocyanate, 2,4-tolylene diisocyanate dimer, naphthalene-1,5-diisocyanate, o-tolylene diisocyanate, polymethylene polyphenyl isocyanate, and hexamethylene diisocyanate; and polyisocyanate adducts such as an addition product of tolylene diisocyanate and trimethylolpropane, an addition product of hexamethylene diisocyanate and water, and an addition product of xylene diisocyanate and trimethylolpropane. By reacting isocyanato group-containing compounds with active hydrogen-containing vinyl ether compounds, there are obtained various compounds having an alkenyl ether group at an end. These compounds are exemplified by the following formulae (II-1) through (II-11), though not limited thereto.

(II-1)

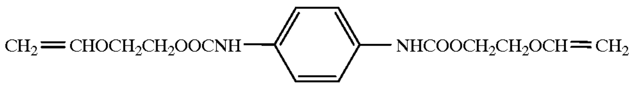

(II-2)

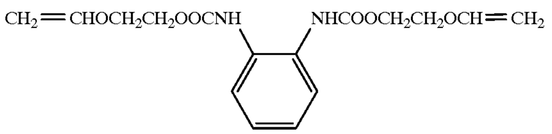

(II-3)

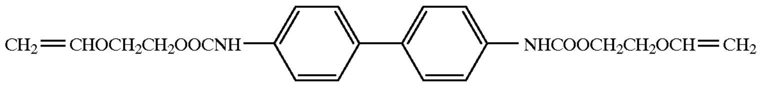

-continued (II-4)

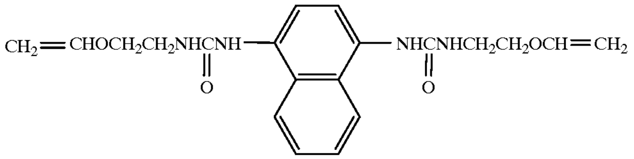

(II-5)

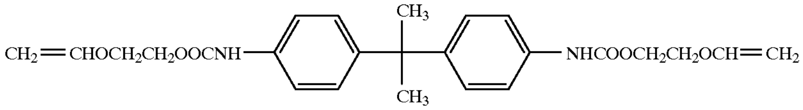

(II-6)

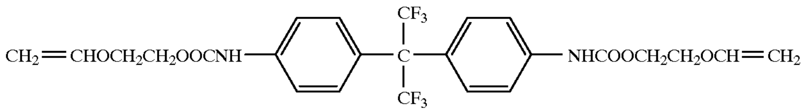

(II-7)

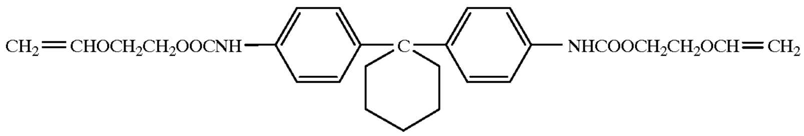

(II-8)

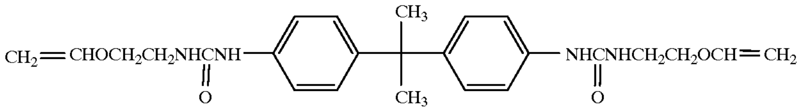

(II-9)

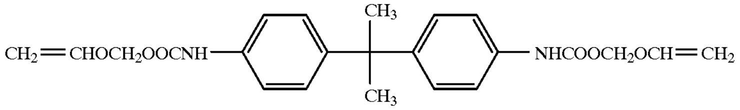

(II-10)

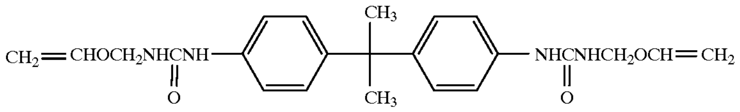

(II-11)

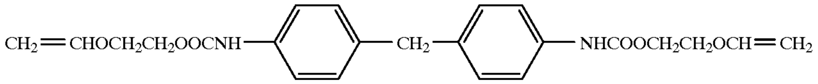

More particularly, when it is desired to obtain a silicone polymer of the general formula (3a) according to the first method, a polymer having a weight average molecular weight of 1,000 to 500,000 and preferably represented by the general formula (3') is reacted with p31 mol of an alkenyl ether compound of the general formula (I) or (II) and p41+p42 mol of a compound of the general formula (4a) per mol of the carboxyl groups in the polymer of the general formula (3'), thereby forming a polymer of the general formula (3a'-1) or (3a'-2).

(3')

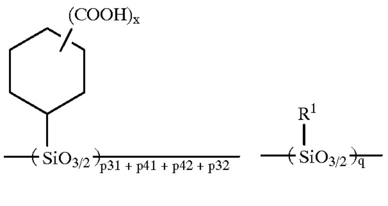

Herein, $R^1$, x, p31, p41, p42, p32 and q are as defined above, with $p31+p41+p42+p32+q=1$.

(3a'-1)

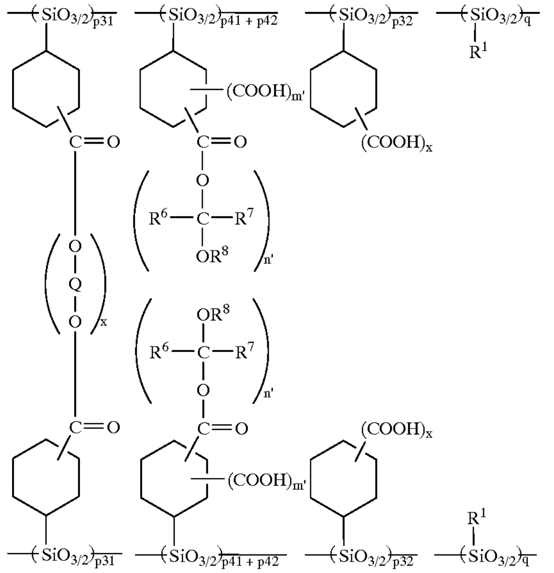

(3a'-2)

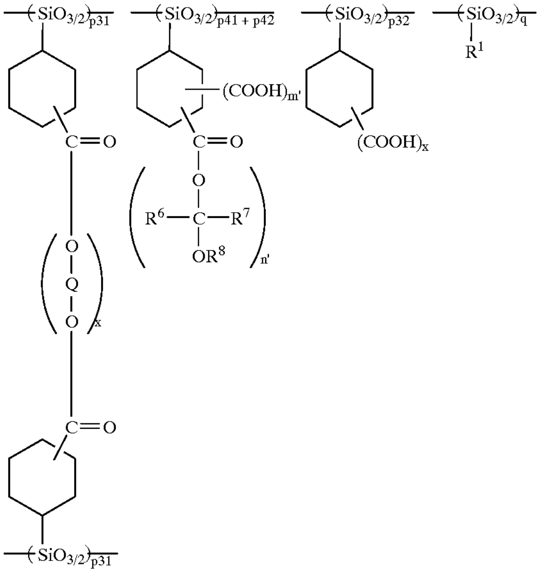

Herein, Q, m', n' and other symbols are as defined above.

The reaction solvent used in the first method is preferably selected from aprotic polar solvents such as dimethylformamide, dimethylacetamide, tetrahydrofuran, and ethyl acetate, and mixtures thereof.

The acid catalyst used herein is preferably selected from hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 10 mol % per mol of the carboxyl group in the polymer of the general formula (1') to be reacted.

The reaction temperature is from −20° C. to 100° C., more preferably from 0° C. to 60° C., and the reaction time is 0.2 to 100 hours, preferably ½ to 20 hours.

Where two types of reaction are carried out in a contiguous manner without once isolating an intermediate product, the order of addition of the alkenyl ether compound of the general formula (I) or (II) and the compound of the general formula (4a) is not critical. Preferably, the compound of the general formula (4a) is first added and after reaction proceeds to a full extent, the alkenyl ether compound of the general formula (I) or (II) is added. If the alkenyl ether compound of the general formula (I) or (II) and the compound of the general formula (4a) are simultaneously added or if the alkenyl ether compound of the general formula (I) or (II) is first added, then some of reactive sites of the alkenyl ether compound of the general formula (I) or (II) can be hydrolyzed with water in the reaction system whereby there is formed a polymer of complex structure which is difficult to control its physical properties.

Second Method (1')

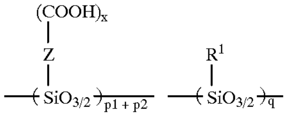

(VI)

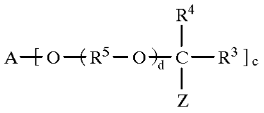

(VII)

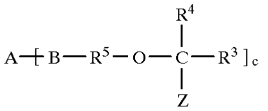

(4b)

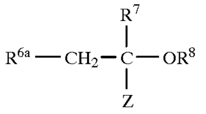

Herein, $R^1$, $R^3$ to $R^5$, $R^{6a}$, $R^7$, $R^8$, p1, p2, q, x, A, B, c, and d are as defined above, and Z is a halogen atom such as Cl, Br or I.

It is understood that the compounds of the above formulae (VI), (VII) and (4b) can be produced by reacting the compounds of the above formulae (I), (II) and (4a) with hydrogen chloride, hydrogen bromide or hydrogen iodide, respectively.

When it is desired to obtain a silicone polymer of formula (3a) according to the second method, a polymer comprising recurring units of the general formula (3') and having a weight average molecular weight of 1,000 to 500,000 is reacted with p31+p41 mol of a halogenated alkyl ether compound of the general formula (VI) or (VII) and p41 mol of a compound of the general formula (4b) per mol of the phenolic hydroxyl group and carboxyl group in the polymer of formula (3'), thereby forming a polymer of the above formula (3a'-1) or (3a'-2), for example.

In the second method, reaction is preferably carried out in a solvent in the presence of a base.

The reaction solvent used herein is preferably selected from aprotic polar solvents such as acetonitrile, acetone, dimethylformamide, dimethylacetamide, tetrahydrofuran, and dimethylsulfoxide, and mixtures thereof.

The base used herein is preferably selected from triethylamine, pyridine, diisopropylamine and potassium carbonate. The amount of the base used is preferably at least 1 mol, especially at least 5 mol, per mol of the carboxyl group in the polymer of formula (1') to be reacted.

The reaction temperature is from −50° C. to 100° C., more preferably from 0° C. to 60° C., and the reaction time is from ½ to 100 hours, preferably from 1 to 20 hours.

It is acceptable to take a reaction sequence of first reacting a polymer having recurring units of formula (1') or (3') with a compound of formula (4a) or (4b) to form a compound having an acid labile group, for example, a compound of the following formula (3d), isolating the compound of formula (3d), and then crosslinking the compound of formula (3d) using a compound of formula (I), (II), (VI) or (VII).

(3d)

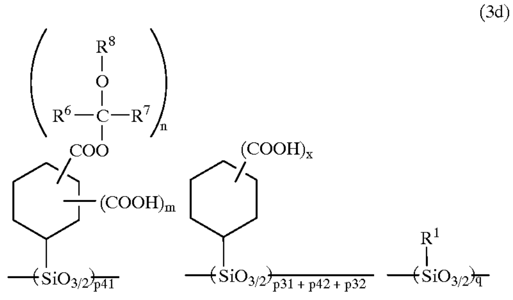

If desired, the polymer of formula (3a'-1) or (3a'-2) obtained by the first or second method may be reacted with p42 mol of a dialkyl dicarbonate compound or alkoxycarbonylalkyl halide per mol of the carboxyl group in the original polymer of formula (3') to introduce an acid labile group of the general formula (5) or reacted with a tert-alkyl halide, trialkylsilyl halide or oxoalkyl compound to introduce an acid labile group, obtaining a polymer of the general formula (3b'-1) or (3b'-2), for example.

(3b'-1)

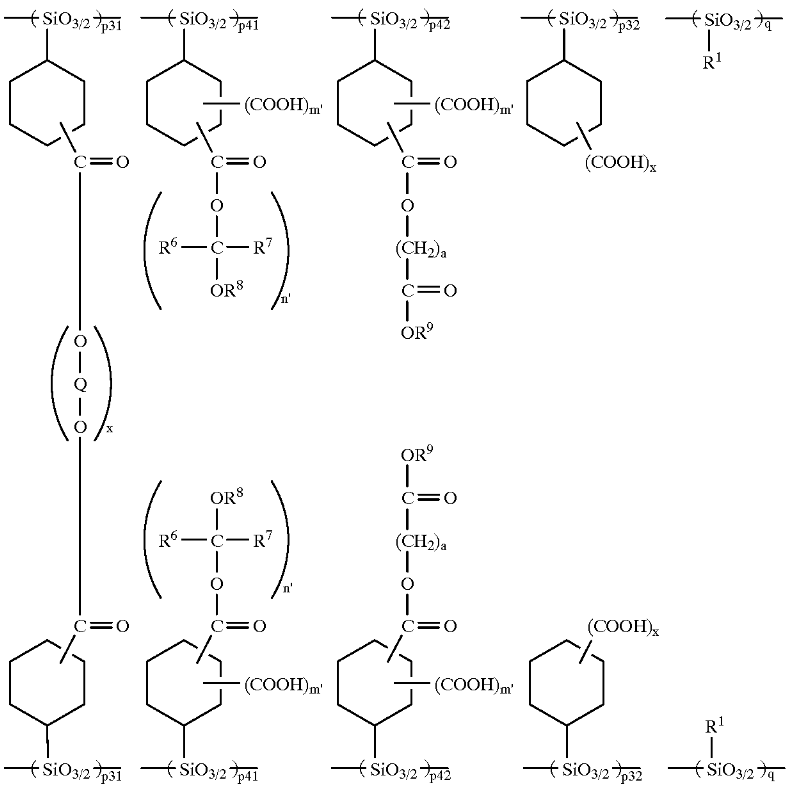

-continued (3b'-2)

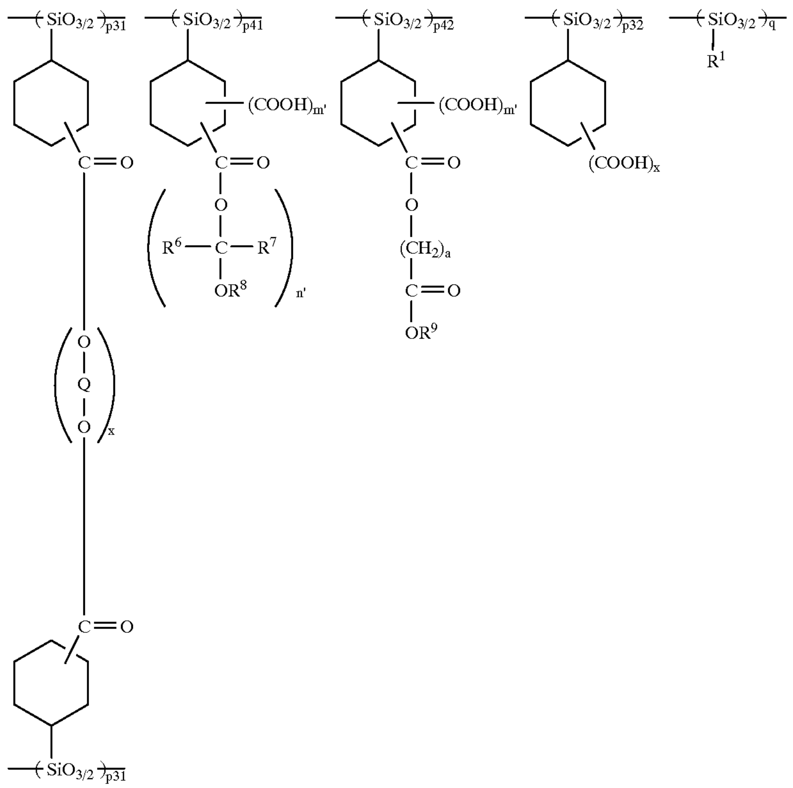

Herein, Q, m', n' and other symbols are as defined above.

Preferably the introduction of an acid labile group of the above formula (5) is carried out in a solvent in the presence of a base.

The reaction solvent used herein is preferably selected from aprotic polar solvents such as acetonitrile, acetone, dimethylformamide, dimethylacetamide, tetrahydrofuran, and dimethylsulfoxide, and mixtures thereof.

The base used herein is preferably selected from triethylamine, pyridine, imidazole, diisopropylamine and potassium carbonate. The amount of the base used is preferably at least 1 mol, especially at least 5 mol, per mol of the carboxyl group in the original polymer of formula (1').

The reaction temperature is from 020 C. to 100° C., more preferably from 0° C. to 60° C., and the reaction time is from 0.2 to 100 hours, preferably from 1 to 10 hours.

Examples of the dialkyl dicarbonate compound include di-tert-butyl dicarbonate and di-tert-amyl dicarbonate. Examples of the alkoxycarbonylalkyl halide include tert-butoxycarbonylmethyl chloride, tert-amyloxycarbonylmethyl chloride, tert-butoxycarbonylmethyl bromide, and tert-butoxycarbonylethyl chloride. Examples of the trialkylsilyl halide include trimethylsilyl chloride, triethylsilyl chloride, and dimethyl-tert-butylsilyl chloride.

Furthermore, if necessary, the polymer of the general formula (3a'-1) or (3a'-2) obtained by the first or second method can be tert-alkylated or oxoalkylated by reacting the polymer with p42 mol of a tert-alkylating compound or oxoalkyl compound per mol of the carboxyl group in the original polymer of formula (3').

Preferably this reaction is carried out in a solvent in the presence of an acid.

The reaction solvent used herein is preferably selected from aprotic polar solvents such as dimethylformamide, dimethylacetamide, tetrahydrofuran, and ethyl acetate, and mixtures thereof.

The acid used herein as the catalyst is preferably selected from hydrochloric acid, sulfuric acid, trifluoromethanesulfonic acid, p-toluenesulfonic acid, methanesulfonic acid, trifluoroacetic acid, and pyridinium p-toluenesulfonate. The amount of the acid catalyst used is preferably 0.1 to 10 mol % per mol of the carboxyl group in the original polymer of formula (1').

The reaction temperature is from −20° C. to 100° C., more preferably from 0° C. to 60° C., and the reaction time is from 0.2 to 100 hours, preferably from ½ to 20 hours.

Exemplary tert-alkylating compounds include iso-butene, 2-methyl-1-butene, and 2-methyl-2-butene. Exemplary oxoalkyl compounds include α-angelica lactone, 2-cyclohexen-1-one, and 5,6-dihydro-2H-pyran-2-one.

Apart from the route of once forming a polymer of the general formula (3a'-1) or (3a'-2), it is possible to directly introduce an acid labile group of the general formula (5), tertiary alkyl group, trialkylsilyl group or oxoalkyl group into a polymer comprising recurring units of the following general formula (3c'-1) or (3c'-2) and optionally further introduce an acid labile group of the general formula (4).

(3c'-1)

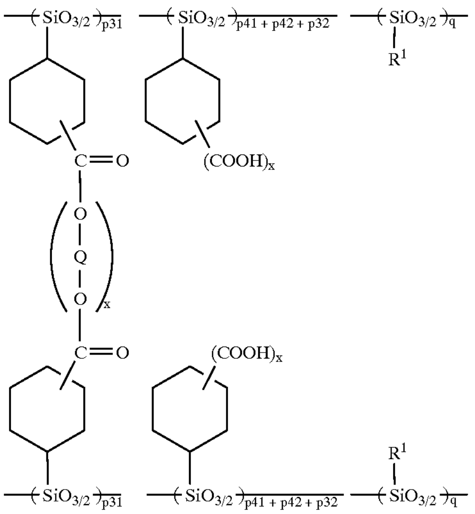

(3c'-2)

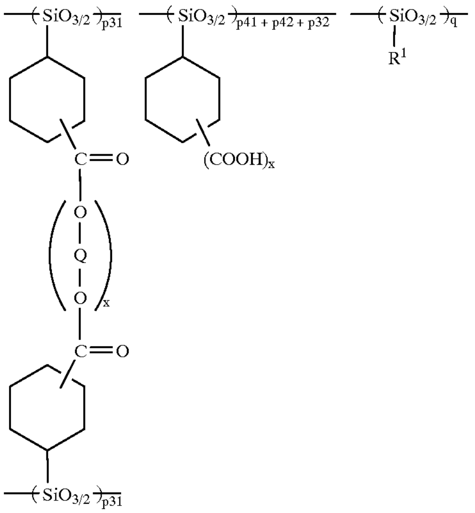

In the polymer of the invention, the acid labile group represented by $R^2$ is not limited to one type. Acid labile groups of two or more types can be introduced into the polymer. A polymer having acid labile groups of two or more types can be obtained by first introducing p41 mol of an acid labile group per mol of the entire hydroxyl groups in the polymer of formula (1') as above, then introducing p42 mol of a different acid labile group by the same procedure as above, and in the case of three or more types, repeating such introduction appropriate times.

The silicone polymer of the invention is useful as a base resin of a chemically amplified positive resist composition. The present invention provides a chemically amplified positive resist composition comprising the silicone polymer as a base resin and the following components.

(A) organic solvent (B) base resin in the form of the above-defined silicone polymer (C) photoacid generator If desired, the resist composition may further contain the following components.

(D) dissolution regulator (E) basic compound (F) compound having a group represented by ≡C—COOH in a molecule (G) acetylene alcohol derivative The organic solvent used herein as component (A) may be any desired one of organic solvents in which the photoacid generator, base resin, dissolution regulator and other components are soluble. Illustrative examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol monotert-butyl ether acetate. These solvents may be used alone or in admixture of two or more. The solvents are not limited to these examples. Of these organic solvents, diethylene glycol dimethyl ether and 1-ethoxy-2-propanol ensuring the maximum solubility of photoacid generators, propylene glycol monomethyl ether acetate ensuring safety, and mixtures thereof are preferably used.

The amount of the organic solvent used is preferably 200 to 1,000 parts, more preferably 400 to 800 parts per 100 parts of component (B). All parts are by weight, hereinafter.

The photoacid generators used as component (C) include 1) onium salts of the following general formula (6a-1), (6a-2) or (6b), 2) diazomethane derivatives of the following general formula (7), 3) glyoxime derivatives of the following general formula (8), 4) bissulfone derivatives of the following general formula (9), 5) sulfonic acid esters of N-hydroxyimide compounds of the following general formula (10), 6) β-ketosulfonic acid derivatives, 7) disulfone derivatives, 8) nitrobenzylsulfonate derivatives, and 9) sulfonate derivatives.

(6a-1)

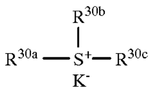

(6a-2)

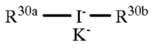

In the formulae, $R^{30a}$, $R^{30b}$ and $R^{30c}$ each are a normal, branched or cyclic alkyl, alkenyl, oxoalkyl or oxoalkenyl group of 1 to 12 carbon atoms, aryl group of 6 to 20 carbon atoms, or aralkyl or aryloxoalkyl group of 7 to 12 carbon atoms wherein some or all of the hydrogen atoms may be replaced by alkoxy or other groups. Alternatively, $R^{30b}$ and $R^{30c}$, taken together, may form a ring with the proviso that each of $R^{30b}$ and $R^{30c}$ is an alkylene group of 1 to 6 carbon atoms when they form a ring. $K^-$ is a non-nucleophilic counter ion.

$R^{30a}$, $R^{30b}$ and $R^{30c}$ may be the same or different. Illustratively stated, exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl and oxoalkenyl groups include 2-oxycyclopentyl and 2-oxocycloheptyl as well as 2-oxopropyl and 2-alkyl-2-oxoethyl groups such as 2-cyclopentyl-2-oxoethyl, 2-cyclohexyl-2-oxoethyl and 2-(4-methylcyclohexyl)-2-oxoethyl. Exemplary aryl groups are phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups are benzyl, phenylethyl and phenethyl. Exemplary aryloxoalkyl groups include 2-aryl-2 -oxoethyl groups such as 2-(phenyl)-2-oxoethyl, 2-(1-naphthyl)-2-oxoethyl and 2-(2-naphthyl)-2-oxoethyl. Examples of the non-nucleophilic counter ion represented by $K^-$ include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

(6b)

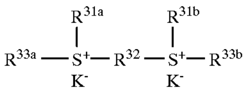

In the formula, $R^{31a}$ and $R^{31b}$ each are a normal, branched or cyclic alkyl group of 1 to 8 carbon atoms, $R^{32}$ is a normal, branched or cyclic alkylene group of 1 to 10 carbon atoms, $R^{33a}$ and $R^{33b}$ each are a 2-oxoalkyl group of 3 to 7 carbon atoms, and $K^-$ is a non-nucleophilic counter ion.

Illustrative examples of $R^{31a}$ and $R^{31b}$ include methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl and cyclohexylmethyl groups. Illustrative examples of $R^{32}$ include methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene and 1,4-cyclohexanedimethylene groups. Illustrative examples of $R^{33a}$ and $R^{33b}$ include 2-oxopropyl, 2-oxocyclopentyl, 2-oxocyclohexyl and 2-oxocycloheptyl groups. Examples of $K^-$ are as described in conjunction with formula (6a).

(7)

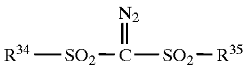

In the formula, $R^{34}$ and $R^{35}$ are normal, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Examples of the alkyl group represented by $R^{34}$ and $R^{35}$ include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Examples of the halogenated alkyl group include trifluoromethyl, 1,1,1-trifluoroethyl, 1,1,1-trichloroethyl, and nonafluorobutyl. Examples of the aryl group include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkyl phenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups are fluorobenzene, chlorobenzene, and 1,2,3,4,5-pentafluorobenzene. Exemplary aralkyl groups are benzyl and phenethyl.

(8)

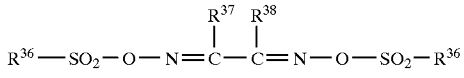

In the formula, $R^{36}$, $R^{37}$ and $R^{38}$ are normal, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Alternatively, $R^{37}$ and $R^{38}$, taken together, form a cyclic structure with the proviso that $R^{37}$ and $R^{38}$ each are a normal or branched alkylene group of 1 to 6 carbon atoms when they form a cyclic structure.

Examples of the alkyl, halogenated alkyl, aryl, halogenated aryl, and aralkyl groups represented by $R^{36}$, $R^{37}$ and $R^{38}$ are the same as described for $R^{34}$ and $R^{35}$. Examples of the alkylene group represented by $R^{37}$ and $R^{38}$ include methylene, ethylene, propylene, butylene, and hexylene.

(9)

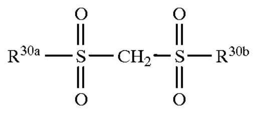

In the formula, $R^{30a}$ and $R^{30b}$ are as defined above.

(10)

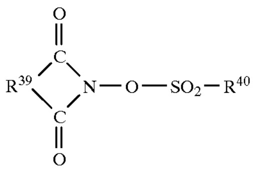

In the formula, $R^{39}$ represents an arylene group of 6 to 10 carbon atoms, alkylene group of 1 to 6 carbon atoms or alkenylene group of 2 to 6 carbon atoms, wherein some or all of the hydrogen atoms may be replaced by normal or branched alkyl or alkoxy groups of 1 to 4 carbon atoms, nitro groups, acetyl groups or phenyl groups. $R^{40}$ represents a normal, branched or substituted alkyl, alkenyl or alkoxyalkyl group, phenyl group or naphthyl group, wherein some or all of the hydrogen atoms may be replaced by alkyl or alkoxy groups of 1 to 4 carbon atoms, phenyl groups (which may be replaced by alkyl or alkoxy groups of 1 to 4 carbon atoms, nitro groups or acetyl groups), hetero-aromatic groups of 3 to 5 carbon atoms, or chlorine atoms.

Exemplary arylene groups represented by $R^{39}$ include 1,2-phenylene and 1,8-naphthylene groups; exemplary alkylene groups include methylene, 1,2-ethylene, 1,3-propylene, 1,4-butylene, 1-phenyl-1,2-ethylene, and norbornane-2,3-diyl groups; and exemplary alkenylene groups include 1,2-vinylene, 1-phenyl-1,2-vinylene and 5-norbornene-2,3-diyl groups. Exemplary alkyl groups represented by $R^{40}$ are similar to $R^{30a}$ to $R^{30c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl groups; exemplary alkoxyalkyl groups include methoxymethyl, ethoxymethyl, propoxymethyl, butoxymethyl, pentoxymethyl, hexyloxymethyl, heptyloxymethyl, methoxyethyl, ethoxyethyl, propoxyethyl, butoxyethyl, pentoxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl groups.

Examples of the normal or branched alkyl groups of 1 to 4 carbon atoms which may be further substituted include methyl, ethyl, propyl, isopropyl, n-butyl, isobutyl and tert-butyl groups; examples of the alkoxy groups include methoxy, ethoxy, propoxy, isopropoxy, n-butoxy, isobutoxy, and tert-butoxy groups; and examples of the monocyclic aromatic group include phenyl, pyridyl and furyl groups.

Illustrative examples are:

onium salts such as diphenyliodonium trifluoromethanesulfonate, (p-tert-butoxyphenyl) phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl) phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylene-bis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl) diazomethane, bis(p-toluenesulfonyl)diazomethane, bis (xylenesulfonyl)diazomethane, bis(cyclohexylsulfonyl) diazomethane, bis(cyclopentylsulfonyl)diazomethane, bis (n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-l-(tert-butylsulfonyl)diazomethane;

glyoxime derivatives such as bis-o-(p-toluenesulfonyl) α-dimethylglyoxime, bis-o-(p-toluenesulfonyl)-α-diphenylglyoxime, bis-o-(p-toluenesulfonyl)-α-dicyclohexylglyoxime, bis-o-(p-toluenesulfonyl)-2,3-pentanedioneglyoxime, bis-o-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-o-(n-butanesulfonyl)-α-dicyclohexylglyoxime, bis-o-(n-butanesulfonyl)-2,3-pentanedioneglyoxime, bis-o-(n-butanesulfonyl)-2-methyl-3,4-pentanedioneglyoxime, bis-o-(methanesulfonyl)-α-dimethyl-glyoxime, bis-o-(trifluoromethanesulfonyl)-α-dimethylglyoxime, bis-o-(1,1,1-trifluoroethanesulfonyl)-α-dimethylglyoxime, bis-o-(tert-butanesulfonyl)-α-dimethylglyoxime, bis-o-(perfluorooctanesulfonyl)-α-dimethylglyoxime, bis-o-(cyclohexanesulfonyl)-α-dimethylglyoxime, bis-o-(benzenesulfonyl)-α-dimethylglyoxime, bis-o-(p-fluorobenzenesulfonyl)-α-dimethylglyoxime, bis-o-(p-tert-butylbenzene-sulfonyl)-α-dimethylglyoxime, bis-o-(xylenesulfonyl)-α-dimethylglyoxime, and bis-o-(camphorsulfonyl)-α-dimethylglyoxime;

bissulfone derivatives such as bis(naphthylsulfonyl) methane, bis(trifluoromethylsulfonyl)methane, bis (methylsulfonyl)methane, bis(ethylsulfonyl)methane, bis(propylsulfonyl)methane, bis(isopropylsulfonyl) methane, bis(p-toluenesulfonyl)methane, and bis (benzenesulfonyl)methane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonate ester derivatives such as 1,2,3-tris (methanesulfonyloxy)benzene, 1,2,3-tris (trifluoromethanesulfonyloxy)benzene, and 1,2,3-tris (p-toluenesulfonyloxy)benzene; and sulfonic acid ester derivatives of N-hydroxyimide compounds such as N-hydroxysuccinimide methylsulfonate, N-hydroxysuccinimide trifluoromethylsulfonate, N-hydroxysuccinimide ethylsulfonate, N-hydroxysuccinimide propylsulfonate, N-hydroxysuccinimide isopropylsulfonate, N-hydroxysuccinimide pentylsulfonate, N-hydroxysuccinimide octylsulfonate, N-hydroxysuccinimide p-toluenesulfonate, N-hydroxysuccinimide p-anisylsulfonate, N-hydroxysuccinimide 2-chloroethylsulfonate, N-hydroxysuccinimide benzenesulfonate, N-hydroxysuccinimide 2,4,6-trimethylphenylsulfonate, N-hydroxysuccinimide naphthylsulfonate, N-hydroxy-2-phenylsuccinimide methylsulfonate, N-hydroxymaleimide methylsulfonate, N-hydroxymaleimide ethylsulfonate, N-hydroxy-2-phenylmaleimide methylsulfonate, N-hydroxyglutarimide methylsulfonate, N-hydroxyglutarimide phenylsulfonate, N-hydroxyphthalimide methylsulfonate, N-hydroxyphthalimide phenylsulfonate, N-hydroxyphthalimide trifluoromethanesulfonate, N-hydroxyphthalimide p-toluenesulfonate, N-hydroxy-1,8-naphthalimide methylsulfonate, N-hydroxy-1,8-naphthalimide phenylsulfonate, N-hydroxy-5-norbornene-2,3-dicarboxyimide methylsulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these are onium salts such as triphenylsulfonium trifluoromethanesulfonate, (p-tert-butoxyphenyl) diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl (2-oxocyclohexyl)sulfonium trifluoromethanesulfonate, (2-norbornyl)methyl(2-oxocyclohexyl)sulfonium trifluoromethanesulfonate, and 1,2'-naphthylcarbonylmethyltetrahydrothiophenium triflate; diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; glyoxime derivatives such as bis-o-(p-toluenesulfonyl)-α-dimethylglyoxime and bis-o-(n-butanesulfonyl)-α-dimethylglyoxime; bissulfone derivatives such as bisnaphthylsulfonylmethane; and sulfonic acid ester derivatives of N-hydroxyimide compounds such as N-hydroxysuccinimide methylsulfonate, N-hydroxysuccinimide trifluoromethyl-sulfonate, N-hydroxysuccinimide propylsulfonate, N-hydroxysuccinimide isopropylsulfonate, N-hydroxysuccinimide pentylsulfonate, N-hydroxysuccinimide p-toluenesulfonate, N-hydroxy-1,8-naphthalimide methylsulfonate, and N-hydroxy-1,8-naphthalimide phenylsulfonate. It is noted that the photoacid generators mentioned above may be used alone or in admixture of two or more. The onium salts are effective for improving rectangularity while the diazomethane derivatives and glyoxime derivatives are effective for reducing standing wave. A combination of an onium salt with a diazomethane or glyoxime derivative allows for finer profile adjustment.

Desirably, the photoacid generator is added in an amount of 0.1 to 15 parts, especially 0.5 to 8 parts per 100 parts of the base resin. Sensitivity would be low with less than 0.1 part of the photoacid generator. More than 15 parts of the photoacid generator would lower an alkali dissolution rate to detract from resolution. Additionally heat resistance may lower because monomeric components become excessive.

In the resist composition of the invention, a dissolution regulator may be blended as component (D). The dissolution regulator blended herein is a compound with an average molecular weight of 100 to 1,000, preferably 150 to 800 and having at least two phenolic hydroxyl groups in a molecule wherein the hydrogen atom of the phenolic hydroxyl group is replaced by an acid labile group in an average proportion of 0% to 100% of the entire phenolic hydroxyl groups, or a compound with an average molecular weight of 100 to 1,000, preferably 150 to 800 and having a carboxyl group in a molecule wherein the hydrogen atom of the carboxyl group is replaced by an acid labile group in an average proportion of 80% to 100% of the entire carboxyl groups.

The percent average replacement of the hydrogen atom of phenolic hydroxyl group or carboxyl group by an acid labile group is at least 0 mol %, preferably at least 30 mol % of the entire phenolic hydroxyl groups or carboxyl groups, with the upper limit being 100 mol %, more preferably 80 mol %.

The compounds having at least two phenolic hydroxyl groups or the compounds having a carboxyl group are preferably compounds of the following formulae (i) to (xiv):

(i)

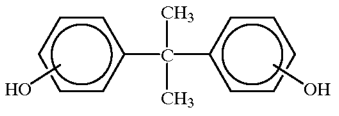

(ii)

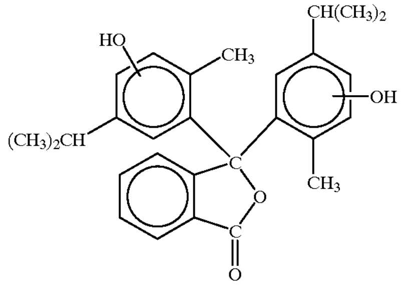

(iii)

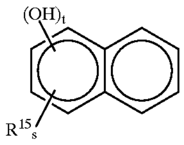

(iv)

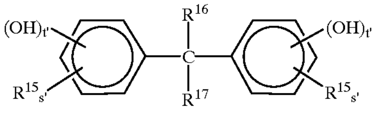

(v)

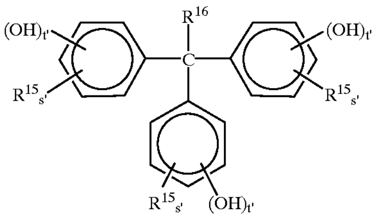

(vi)

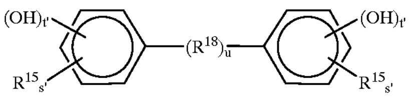

-continued (vii)

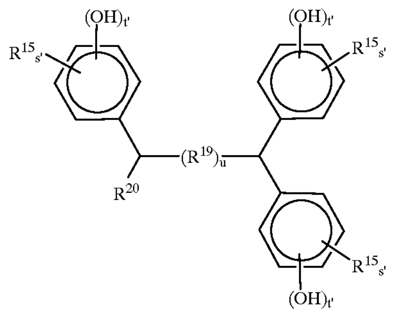

(viii)

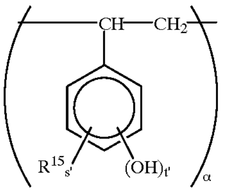

(ix)

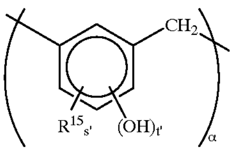

(x)

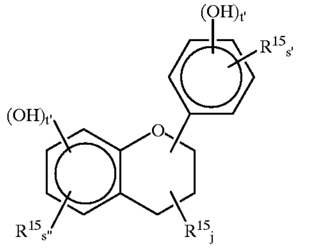

(xi)

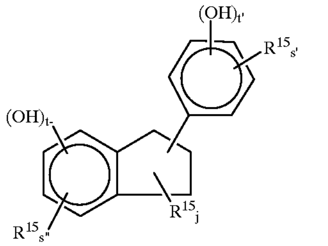

(xii)

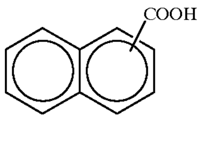

(xiii)

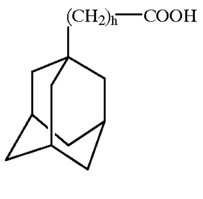

-continued (xiv)

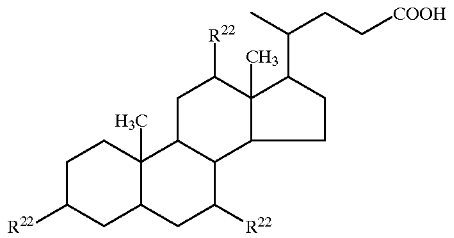

In the formulae, $R^{15}$ and $R^{16}$ are independently a hydrogen atom or normal or branched alkyl or alkenyl group having 1 to 8 carbon atoms. $R^{17}$ is a hydrogen atom, normal or branched alkyl or alkenyl group having 1 to 8 carbon atoms, or $-(R^{21})_h-COOH$. $R^{18}$ is a group $-(CH_2)_i-$ wherein i is 2 to 10, arylene group having 6 to 10 carbon atoms, carbonyl group, sulfonyl group, oxygen atom or sulfur atom. $R^{19}$ is an alkylene group having 1 to 10 carbon atoms, arylene group having 6 to 10 carbon atoms, carbonyl group, sulfonyl group, oxygen atom or sulfur atom. $R^{20}$ is a hydrogen atom, normal or branched alkyl group having 1 to 8 carbon atoms, alkenyl group, hydroxyl-substituted phenyl group or hydroxyl-substituted naphthyl group. $R^{21}$ is a normal or branched alkylene group having 1 to 10 carbon atoms. $R^{22}$ is a hydrogen atom or hydroxyl group. Letter j is an integer of 0 to 5, u and h each are 0 or 1, and s, t, s', t', s", and t" are numbers satisfying s+t=8, s'+t'=5, and s"+t"=4 such that at least one hydroxyl group is attached to each phenyl skeleton. $\alpha$ is such a number that the compound of formula (viii) or (ix) may have a molecular weight of 100 to 1,000.

Exemplary groups represented by $R^{15}$ and $R^{16}$ are hydrogen, methyl, ethyl, butyl, propyl, ethynyl, and cyclohexyl groups. Exemplary groups represented by $R^{17}$ are as exemplified for $R^{15}$ and $R^{16}$ as well as $-COOH$ and $-CH_2COOH$. Exemplary groups represented by $R^{18}$ are ethylene, phenylene, carbonyl, and sulfonyl groups, oxygen and sulfur atoms. Exemplary groups represented by $R^{19}$ are methylene and as exemplified for $R^{18}$. Exemplary groups represented by $R^{20}$ are hydrogen, methyl, ethyl, butyl, propyl, ethynyl, cyclohexyl, and hydroxyl-substituted phenyl and naphthyl groups.

The acid labile group in the dissolution regulator includes groups of the general formulae (4) and (5), tert-alkyl groups of 4 to 20 carbon atoms, trialkylsilyl groups whose alkyl groups each have 1 to 6 carbon atoms, and oxoalkyl groups of 4 to 20 carbon atoms.

The dissolution regulators are blended in the resist composition in an amount of 0 to 50 parts, preferably 5 to 50 parts, more preferably 10 to 30 parts per 100 parts of the base resin while they may be used alone or in admixture of two or more. Less than 5 parts of the dissolution regulator would be ineffective for improving resolution whereas more than 50 parts would induce pattern thinning and detract from resolution.

The dissolution regulator mentioned above can be synthesized by chemically reacting an acid labile group with a compound having a phenolic hydroxyl group or carboxyl group as in the preparation of the base resin.

In addition to or instead of the dissolution regulator described above, there may be blended as another dissolution regulator a compound having a weight average molecular weight of less than 1,000 and a carboxyl group in a molecule wherein the hydrogen atom of the carboxyl group is partially replaced by an acid labile group in an average proportion of 0% to 100% of the entire carboxyl groups.

The compound in which the hydrogen atom of a carboxyl group is partially replaced by an acid labile group is preferably at least one member selected from compounds comprising recurring units of the following general formula (11) and having a weight average molecular weight of less than 1,000.

(11)

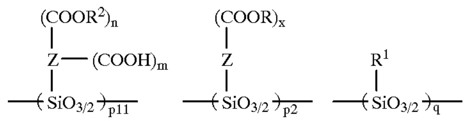

In the formula, $R^1$, $R^2$, Z, n, m, x, p2 and q are as defined above while p1 is 0 or a positive number in the range: $0 \leqq p1/(p1+p2+q) \leqq 1$.

The acid labile group in the above-mentioned dissolution regulator includes groups of the general formulae (4) and (5), tert-alkyl groups of 4 to 20 carbon atoms, trialkylsilyl groups whose alkyl groups each have 1 to 6 carbon atoms, and oxoalkyl groups of 4 to 20 carbon atoms.

The blending amount of the other dissolution regulator is preferably such that the combined amount with the first-mentioned dissolution regulator is 0 to 50 parts, more preferably 0 to 30 parts, especially 0 to 5 parts per 100 parts of the base resin.

The other dissolution regulator can be synthesized by chemically reacting an acid labile group with a compound having a carboxyl group as in the preparation of the base resin.

A silicone compound is also useful as the dissolution regulator (D) because it does not adversely affect oxygen plasma etching resistance. The silicone compound dissolution regulators which can be used herein are preferably silicone compounds of the following general formulae (12) to (16) wherein carboxyl groups or hydroxyl groups are protected with tert-butyl or tert-butoxycarbonylmethyl groups.

(12)

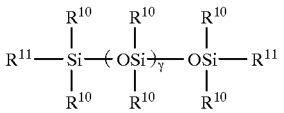

(13)

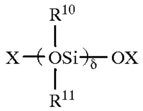

(14)

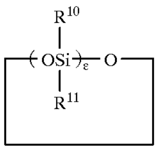

In the formulae, $R^{10}$ is a methyl or phenyl group. $R^{11}$ is a carboxyethyl or p-hydroxyphenylalkyl group (wherein the alkyl groups are normal, branched or cyclic alkyl groups of 1 to 8 carbon atoms). X is a trimethylsilyl, triphenylsilyl or $—SiR^{10}R^{11}$ group wherein $R^{10}$ and $R^{11}$ are as defined above. Letter γ is an integer of 0 to 50, δ is an integer of 1 to 50, and ε is an integer of 3 to 10.

The silicone compounds obtained by protecting the carboxyl or hydroxyl groups of the silicone compounds of formulae (12) to (14) with alkali-soluble groups (e.g., tert-butyl or tert-butoxycarbonylmethyl groups) are exemplified by groups of the following classes A to C. Me is methyl and t-Bu is tert-butyl.

Class A

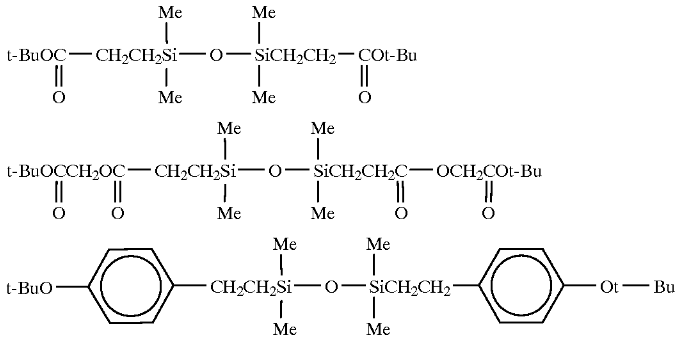

Class B

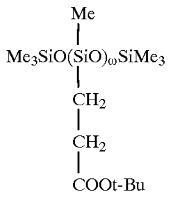

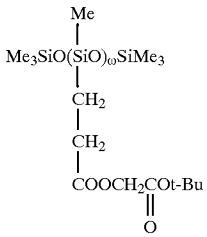

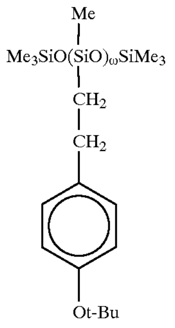

ω is 1 to 50.

-continued

Class C

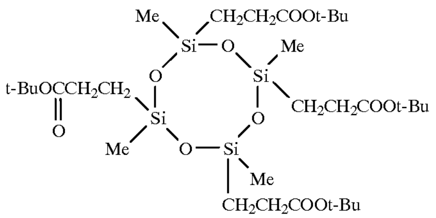

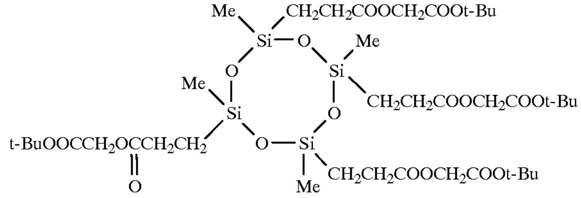

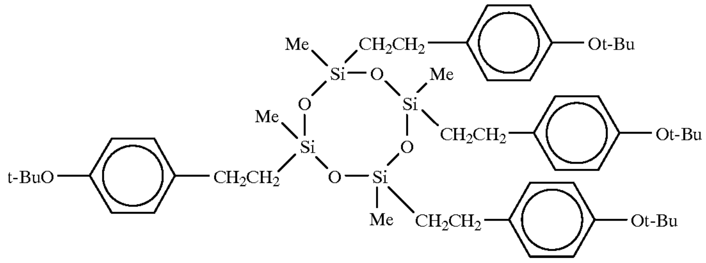

The amount of the dissolution regulator blended is preferably up to 40% by weight, more preferably 10 to 30% by weight based on the entire base resin. More than 40% by weight of the dissolution regulator would cause a marked decline of the oxygen plasma etching resistance of resist film to such an extent that the composition might not be applicable as the two-layer resist.

In the resist composition of the invention, a basic compound may be blended as component (E).

The basic compound blended as component (E) is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure latitude and pattern profile.

Included in the basic compound are primary, secondary and tertiary aliphatic amines, hybrid amines, aromatic amines, heterocyclic amines, carboxyl-bearing nitrogenous compounds, sulfonyl-bearing nitrogenous compounds, hydroxyl-bearing nitrogenous compounds, hydroxyphenyl-bearing nitrogenous compounds, alcoholic nitrogenous compounds, amide derivatives, and imide derivatives.

Examples of the primary aliphatic amine include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of the secondary aliphatic amine include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of the tertiary aliphatic amine include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of the hybrid amine include dimethylethylamine, methylethylpropylamine, benzylamine, phenethylamine, and benzyldimethylamine. Examples of the aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazane derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of the carboxyl-bearing nitrogenous compound include aminobenzoic acid, indolecarboxylic acid, amino acid derivatives such as nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine. Examples of the sulfonyl-bearing nitrogenous compound include 3-pyridinesulfonic acid and pyridinium p-toluenesulfonate. Examples of the hydroxyl-bearing nitrogenous compound, hydroxyphenyl-bearing nitrogenous compound, and alcoholic nitrogenous compound include 2-hydroxypyridine, aminocresole, 2,4-quinoline diol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propane diol, 3-pyrrolidino-1,2-propane diol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl) isonicotinamide. Examples of the amide derivative include formamide, N-methylformamide, N,N-dimethylformamide, acetamide, N-methylacetamide, N,N-dimethylacetamide, propionamide, and benzamide. Exemplary imide derivatives are phthalimide, succinimide, and maleimide.

Further, basic compounds of the following general formulae (15) and (16) may also be blended.

(15)

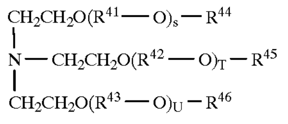

(16)

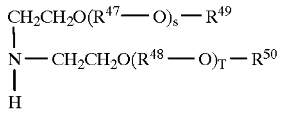

In the formulae, $R^{41}$, $R^{42}$, $R^{43}$, $R^{47}$, and $R^{48}$ are independently normal, branched or cyclic alkylene groups of 1 to 20 carbon atoms. $R^{44}$, $R^{45}$, $R^{46}$, $R^{49}$, and $R^{50}$ are independently hydrogen, alkyl groups of 1 to 20 carbon atoms, or amino groups. Alternatively, $R^{44}$ and $R^{45}$, $R^{45}$ and $R^{46}$, $R^{44}$ and $R^{46}$, or $R^{44}$ and $R^{45}$ and $R^{46}$, and $R^{49}$ and $R^{50}$, taken together, may form a ring. S, T and U are integers of 0 to 20, with the proviso that hydrogen is excluded from $R^{44}$, $R^{45}$, $R^{46}$, $R^{49}$, and $R^{50}$ when S, T and U are equal to 0.

The alkylene groups represented by $R^{41}$, $R^{42}$, $R^{43}$, $R^{47}$, and $R^{48}$ are preferably those of 1 to 20 carbon atoms, more preferably 1 to 10 carbon atoms, most preferably 1 to 8 carbon atoms, such as methylene, ethylene, n-propylene, isopropylene, n-butylene, isobutylene, n-pentylene, isopentylene, hexylene, nonylene, decylene, cyclopentylene, and cyclohexylene.

The alkyl groups represented by $R^{44}$, $R^{45}$, $R^{46}$, $R^{49}$, and $R^{50}$ are preferably those of 1 to 20 carbon atoms, more preferably 1 to 8 carbon atoms, most preferably 1 to 6 carbon atoms, while they may be normal, branched or cyclic. Exemplary alkyl groups are methyl, ethyl, n-propyl, isopropyl, n-butyl, isobutyl, tert-butyl, n-pentyl, isopentyl, hexyl, nonyl, decyl, dodecyl, tridecyl, cyclopentyl, and cyclohexyl.

Where $R^{44}$ and $R^{45}$, $R^{45}$ and $R^{46}$, $R^{44}$ and $R^{46}$, $R^{44}$ and $R^{45}$ and $R^{46}$, or $R^{49}$ and $R^{50}$ form a ring, the ring preferably has 1 to 20 carbon atoms, more preferably 1 to 8 carbon atoms, most preferably 1 to 6 carbon atoms and may have branched therefrom an alkyl group of 1 to 6 carbon atoms, especially 1 to 4 carbon atoms.

Each of S, T and U is an integer of 0 to 20, preferably 1 to 10, more preferably 1 to 8.

Illustrative examples of the compounds of formulae (15) and (16) include tris{2-(methoxymethoxy)ethyl}amine, tris{2-(methoxyethoxy)ethyl}amine, tris[2-{(2-methoxyethoxy)methoxy}ethyl]amine, tris{2-(2-methoxyethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4, 1-aza-15-crown-5, and 1-aza-18-crown-6. Especially preferred basic compounds are tertiary amines, aniline derivatives, pyrrolidine derivatives, pyridine derivatives, quinoline derivatives, amic acid derivatives, nitrogenous compounds having a hydroxyl group, nitrogenous compounds having a hydroxyphenyl group, alcoholic nitrogenous compounds, amide derivatives, imide derivatives, tris{2-(methoxymethoxy)ethyl}amine, tris{2-(2-methoxyethoxy)ethyl}amine, tris[2-{(2-methoxyethoxy)methyl}ethyl]amine, and 1-aza-15-crown-5.

Preferably the basic compound is blended in an amount of 0.001 to 10 parts, especially about 0.01 to 1 part per part of the photoacid generator. An addition amount of less than 0.001 part would fail to provide an additive effect whereas more than 10 parts would adversely affect resolution and sensitivity.

In the resist composition of the invention, a compound having a group represented by ≡C—COOH in a molecule may be blended as component (F).

The compound having a group ≡C—COOH in a molecule blended as component (F) may be at least one compound selected from the following classes I and II although the invention is not limited thereto. Blending of component (F) is effective for improving the PED stability of resist and improving the edge roughness of resist on nitride film substrates.

Class I

Compounds of the following general formulae (17) to (26) wherein some or all of the hydrogen atoms of phenolic hydroxyl groups are replaced by —$R^{51}$—COOH wherein $R^{51}$ is a normal or branched alkylene group having 1 to 10 carbon atoms and the molar fraction of the phenolic hydroxyl group (C mol) in the molecule to the group ≡C—COOH (D mol) is C/(C+D)=0.1 to 1.0.

Class II

Compounds of the following general formulae (27) to (31)

(17)

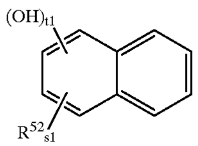

(18)

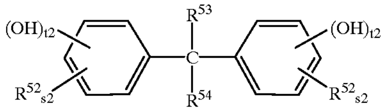

(19)

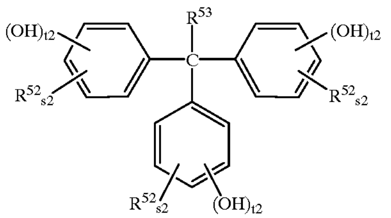

(20)

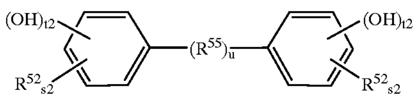

(21)

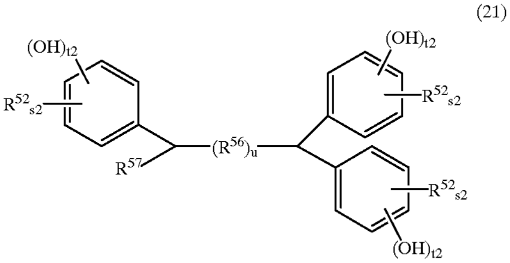

(22)

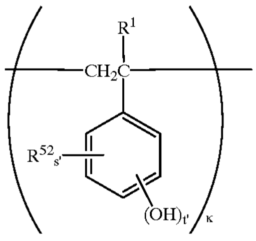

(23)

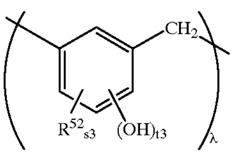

-continued (24)

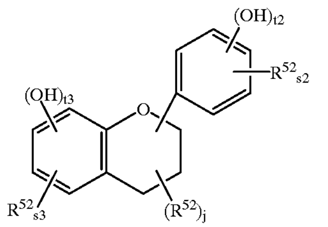

(25)

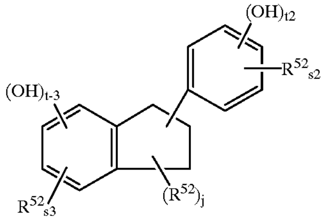

(26)

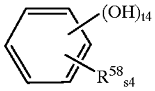

In the formulae, $R^1$ is a hydrogen atom or methyl group. $R^{52}$ and $R^{53}$ are independently a hydrogen atom or normal or branched alkyl or alkenyl group having 1 to 8 carbon atoms. $R^{54}$ is a hydrogen atom, normal or branched alkyl or alkenyl group having 1 to 8 carbon atoms, or $-(R^{59})_h-$COOR' wherein R' is a hydrogen atom or —$R^{59}$—COOH. $R^{55}$ is a group $-(CH_2)_i-$ wherein i is 2 to 10, arylene group having 6 to 10 carbon atoms, carbonyl group, sulfonyl group, oxygen atom or sulfur atom. $R^{56}$ is an alkylene group having 1 to 10 carbon atoms, arylene group having 6 to 10 carbon atoms, carbonyl group, sulfonyl group, oxygen atom or sulfur atom. $R^{57}$ is a hydrogen atom, normal or branched alkyl group having 1 to 8 carbon atoms, alkenyl group, hydroxyl-substituted phenyl group or hydroxyl-substituted naphthyl group. $R^{58}$ is a hydrogen atom, normal or branched alkyl or alkenyl group having 1 to 8 carbon atoms, or —$R^{59}$—COOH. $R^{59}$ is a normal or branched alkylene group having 1 to 10 carbon atoms. Letter j is an integer of 0 to 5, u and h each are 0 or 1, and s1, t1, s2, t2, s3, t3, s4, and t4 are numbers satisfying s1+t1=8, s2+t2=5, s3+t3=4, and s4+t4=6 such that at least one hydroxyl group is attached to each phenyl skeleton. κ is such a number that the compound of formula (23) may have a weight average molecular weight of 1,000 to 5,000. λ is such a number that the compound of formula (24) may have a weight average molecular weight of 1,000 to 10,000.

Class II (27)

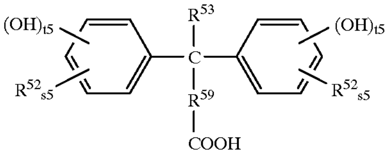

-continued (28)

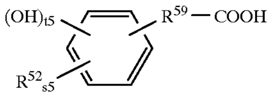

(29)

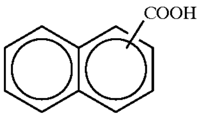

(30)

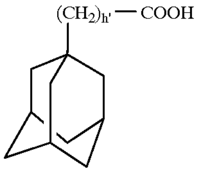

(31)

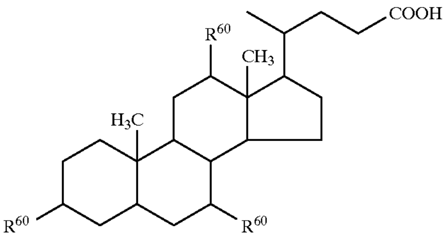

In the formulae, $R^{52}$, $R^{53}$, and $R^{59}$ are as defined above, and s5 and t5 are numbers satisfying s5≧0, t5≧0, and s5+t5=5. $R^{60}$ is hydrogen or a hydroxyl group, and h' is equal to 0 or 1.

Exemplary of component (F) are compounds of the following formulae VIII-1 to VIII-14 and IX-1 to IX-10 although component (F) is not limited thereto.

[VIII-1]

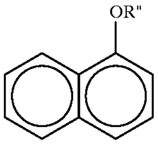

[VIII-2]

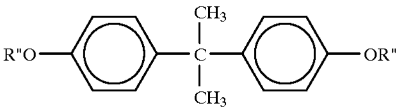

[VIII-3]

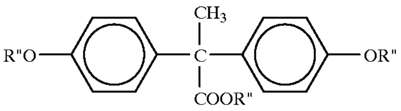

[VIII-4]

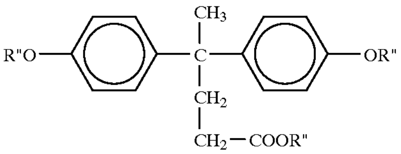

-continued

[VIII-5]

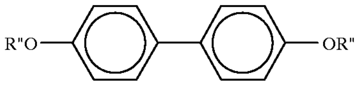

[VIII-6]

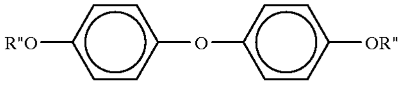

[VIII-7]

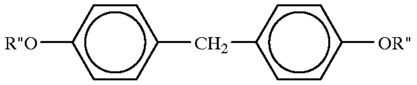

[VIII-8]

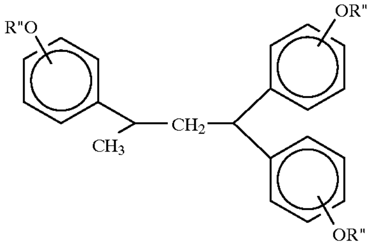

[VIII-9]

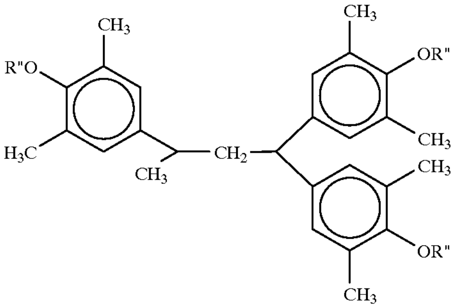

[VIII-10]

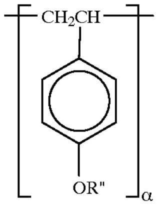

[VIII-11]

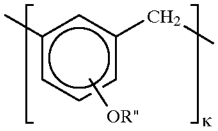

[VIII-12]

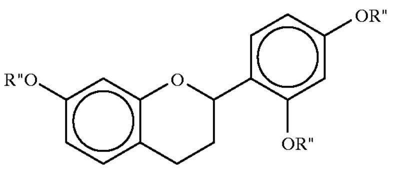

-continued

[VIII-13]

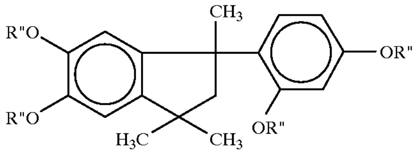

[VIII-14]

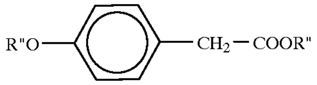

R" is a hydrogen atom or a group $CH_2COOH$. In each compound, 10 to 100 mol % of R" is $CH_2COOH$. Letters α and κ are as defined above.

[IX-1]

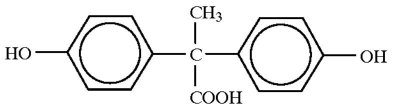

[IX-2]

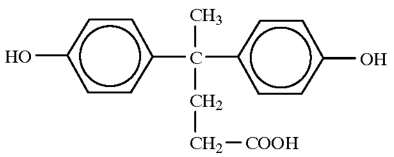

[IX-3]

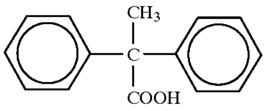

[IX-4]

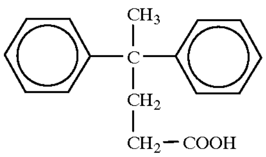

[IX-5]

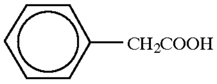

[IX-6]

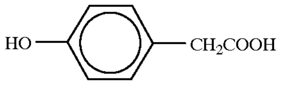

[IX-7]

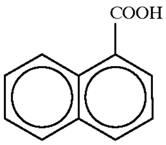

[IX-8]

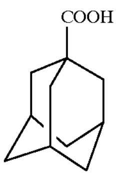

-continued

[IX-9]

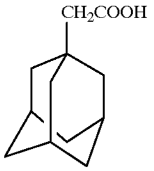

[IX-10]

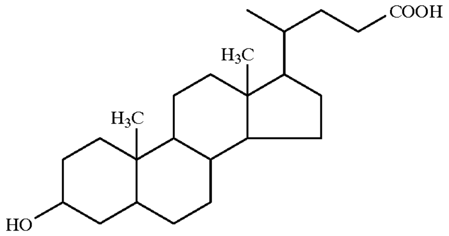

The compounds having a group ≡C—COOH in a molecule may be used alone or in admixture of two or more.

The compound having a group ≡C—COOH in a molecule is blended in the resist composition in an amount of 0 to 5 parts, preferably 0.1 to 5 parts, more preferably 0.1 to 3 parts, most preferably 0.1 to 2 parts per 100 parts of the base resin. More than 5 parts of the compound would adversely affect the resolution of the result composition.

In the resist composition of the invention, an acetylene alcohol derivative may be blended as component (G) for thereby improving shelf stability.

The acetylene alcohol derivative used herein is preferably selected from compounds of the following general formulae (32) and (33).

(32)

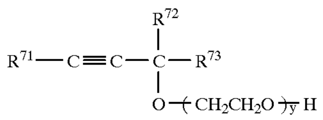

(33)

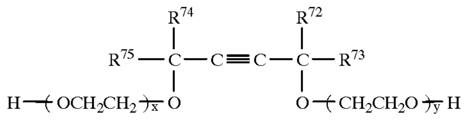

In the formulae, $R^{71}$, $R^{72}$, $R^{73}$, $R^{74}$, and $R^{75}$ each are hydrogen or a normal, branched or cyclic alkyl group having 1 to 8 carbon atoms, X and Y are 0 or positive numbers satisfying $0 \leqq X \leqq 30$, $0 \leqq Y \leqq 30$, and $0 \leqq X+Y \leqq 40$.

Useful acetylene alcohol derivatives are commercially available under the trade name of Surfynol 61, Sufrynol 82, Sufrynol 104, Sufrynol 104E, Sufrynol 104H, Sufrynol 104A, Sufrynol TG, Sufrynol PC, Sufrynol 440, Sufrynol 465, and Sufrynol 485 from Air Products and Chemicals Inc. and Sufrynol E1004 from Nisshin Chemical Industry K.K.

The acetylene alcohol derivative is added in an amount of 0.01 to 2%, more preferably 0.02 to 1% by weight based on 100% by weight of the resist composition. Less than 0.01% by weight of the acetylene alcohol derivative would be ineffective for improving coating and shelf stability whereas more than 2% by weight would result in a resist composition with low resolution.

In the resist composition of the invention, a surface-active agent commonly used for facilitating coating may be blended as an optional component in addition to the aforementioned components. The amounts of such optional additives blended are conventional insofar as the objects of the invention are not impaired.

Nonionic surfactants are preferred. Examples of the surfactant include perfluoroalkylpolyoxyethylene ethanols, fluorinated alkyl esters, perfluoroalkylamine oxides, perfluoroalkyl EO addition products, and fluorinated organosiloxane compounds. Useful surfactants are commercially available under the trade name of Florade FC-430 and FC-431 from Sumitomo 3M K.K., Surflon S-141 and S-145 from Asahi Glass K.K., Unidine DS-401, DS-403 and DS-451 from Daikin Industry K.K., Megafac F-8151 from Dai-Nippon Ink & Chemicals K.K., and X-70-092 and X-70-093 from Shin-Etsu Chemical Co., Ltd. Preferred surfactants are Florade FC-430 from Sumitomo 3M K.K. and X-70-093 from Shin-Etsu Chemical Co., Ltd.

Any well-known lithography may be used to form a resist pattern from a chemically amplified positive resist composition of the invention. For example, the resist composition is applied to a substrate such as a silicon wafer so as to provide a film thickness of 0.5 to 2.0 μm by a technique such as spin coating, and prebaked on a hot plate at a temperature of 60 to 150° C. for 1 to 10 minutes, preferably 80 to 120° C. for 1 to 5 minutes. With a mask having a desired pattern placed above the resist film, the resist film is then exposed to actinic radiation having a wavelength of up to 300 nm such as deep-UV, excimer laser light, and x-ray or electron beam in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB). Thereafter the resist film is developed with a developer in the form of an aqueous base solution, for example, 0.1 to 5%, preferably 2 to 3% aqueous solution of tetramethylammonium hydroxide (TMAH) for 0.1 to 3 minutes, preferably ½ to 2 minutes by a conventional technique such as dipping, puddling or spraying. In this way, a desired positive resist pattern is formed on the substrate. The resist composition of the invention is best suited for fine patterning with actinic radiation, especially radiation having a wavelength of 254 to 193 nm such as deep-UV, excimer laser light, and X-ray and electron beam. Outside the upper and lower limits of the range, a failure to provide the desired pattern can occur.

The resist material of the invention is useful as a two-layer resist since it uses a silicone polymer as the base resin and is fully resistant to oxygen plasma etching.

More particularly, in a conventional way, a relatively thick organic polymer layer is formed on a substrate as a lower resist layer before a resist solution formulated according to the invention is spin coated thereon. The upper resist film of the invention is patterned as above. On subsequent etching, the lower resist layer is selectively etched away whereby the pattern of the upper resist layer is formed in the lower resist layer.

For the lower resist layer, a novolak resin based positive resist composition may be used. After it is coated onto a substrate, it is subject to hard baking at 200° C. for one hour, thereby preventing intermixing with the silicone resist.

The positive working resist composition comprising the silicone polymer as a base resin is sensitive to actinic radiation, has superior sensitivity and resolution, and lends itself to fine processing technology using electron beam and deep-UV radiation. Because of very low absorption at the exposure wavelength of a ArF excimer laser or KrF excimer laser, the resist composition forms a fine pattern having a wall perpendicular to the substrate. Because the resist composition of the invention has high oxygen plasma etching resistance, a two-layer resist having a resist film of the invention coated on a lower resist layer can be finely patterned at a high aspect ratio.

EXAMPLE

Synthesis Examples and Examples are given below for illustrating the present invention although the invention is not limited thereto.

Synthesis Example 1

Synthesis of poly(3-carboxycyclohexylsilsesquioxane)

In 150 g of toluene was dissolved 150.0 g (0.544 mol) of methyl 3-trichlorosilyl-1-cyclohexylcarboxylate. With stirring, the solution was added dropwise to 300 g of water at room temperature. After the completion of dropwise addition, the acidic aqueous layer was separated from the reaction mixture. The organic layer was then washed with 1 liter of water. After the water layer became neutral, the organic layer was two more times washed with water. The solvent was distilled off from the organic layer by means of an evaporator. The concentrate was heated at 200° C. for 2 hours for effecting polymerization. To the polymer was added 800 g of tetrahydrofuran. The resulting solution was added dropwise to 1,000 g of a 10% aqueous solution of sodium hydroxide, which was heated at 40° C. for 3 hours for effecting hydrolysis of methyl ester groups. The reaction solution was made acidic with hydrochloric acid whereupon the polymer precipitated. The polymer was collected by filtration and dried, obtaining poly(3-carboxycyclohexylsilsesquioxane) in a yield of 83.4 g. The polymer had a weight average molecular weight of 3,000.

Synthesis Example 2

Synthesis of poly[(3-carboxycyclohexylsilsesquioxane)-(cyclohexylsilsesquioxane)]

In 150 g of toluene were dissolved 75.0 g (0.272 mol) of methyl 3-trichlorosilyl-1-cyclohexylcarboxylate and 59.2 g (0.272 mol) of cyclohexyltrichlorosilane. With stirring, the solution was added dropwise to 300 g of water at room temperature. After the completion of dropwise addition, the acidic aqueous layer was separated from the reaction mixture. The organic layer was then washed with 1 liter of water. After the water layer became neutral, the organic layer was two more times washed with water. The solvent was distilled off from the organic layer by means of an evaporator. The concentrate was heated at 200° C. for 2 hours for effecting polymerization. To the polymer was added 800 g of tetrahydrofuran. The resulting solution was added dropwise to 1,000 g of a 10% aqueous solution of sodium hydroxide, which was heated at 40° C. for 3 hours for effecting hydrolysis of methyl ester groups. The reaction solution was made acidic with hydrochloric acid whereupon the polymer precipitated. The polymer was collected by filtration and dried, obtaining poly[(3-carboxycyclohexylsilsesquioxane)-(cyclohexylsilsesquioxane)] in a yield of 82.0 g. The polymer had a weight average molecular weight of 3,500. On $^1H$—NMR analysis of the polymer, the compositional ratio of 3-carboxycyclohexylsilsesquioxane to cyclohexylsilsesquioxane was 50/50 (molar ratio).

Synthesis Examples 3–8

Silicone polymers as shown in Table 1 were obtained by the same procedure as in Synthesis Examples 1 and 2. The thus obtained polymers had the weight average molecular weight and compositional ratio shown in Table 1.

TABLE 1

| | Polymer prior to introduction of acid labile group | | |
|---|---|---|---|
| Synthesis Example | Polymer | p1 + p2/q (molar ratio) | Mw |
| 1 | (A) | 100/0 | 3,000 |
| 2 | (B) | 70/30 | 4,500 |
| 3 | (C) | 40/60 | 3,500 |
| 4 | (C) | 60/40 | 3,800 |
| 5 | (D) | 100/0 | 2,500 |
| 6 | (E) | 50/50 | 4,000 |
| 7 | (F) | 100/0 | 3,100 |
| 8 | (G) | 100/0 | 2,500 |

(A)
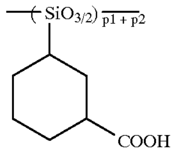

(B)
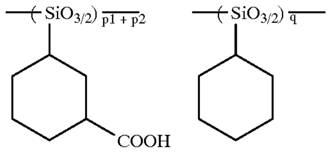

(C)
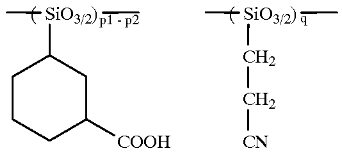

(D)
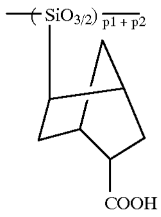

(E)
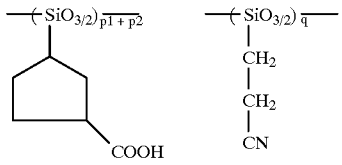

(F)
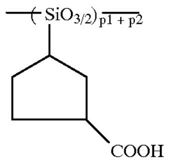

(G)
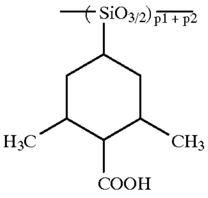

Synthesis Example 9

In 180 ml of tetrahydrofuran was dissolved 50 g of the polymer obtained in Synthesis Example 1. A catalytic amount of p-toluenesulfonic acid was added. With stirring at 20° C., 23.0 g of ethyl vinyl ether was added. After one hour of reaction, the reaction solution was neutralized with conc. aqueous ammonia, and the neutralized solution was added dropwise to 5 liters of water whereupon a white solid formed. After filtration, the solid was dissolved in 100 ml of acetone, which was added dropwise to 5 liters of water. After filtration, the polymer was dried in vacuum. The polymer had the structure of the rational formula (Polym.1) shown below, and it was ascertained from $^1$H—NMR analysis that 80% of the hydrogen atoms of carboxyl groups in the polymer were ethoxyethylated.

Synthesis Examples 10–19

By following the procedure of Synthesis Example 9 except that each of the polymers of Synthesis Examples 1 to 8 was used and a compound capable of introducing an acid labile group as shown in Polym.2 to 11 was used instead of the ethyl vinyl ether, silicone polymers represented by the following rational formulae (Polym.2 to 11) were obtained.

Synthesis Example 20

In 200 ml of dimethylformamide was dissolved 20 g of the polymer obtained in Synthesis Example 1. Potassium carbonate was added thereto in solid form. With stirring, 1.0 g of tert-butyl chloroacetate was added. Reaction was conducted at 60° C. for 6 hours. The solid potassium carbonate was filtered off from the reaction solution, to which 10 liters of water was added dropwise, yielding a white solid. After filtration, the solid was dissolved in 100 ml of acetone, which was added dropwise to 5 liters of water. Filtration and vacuum drying yielded a polymer. The polymer had the structure of the rational formula (Polym.12) shown below, and it was ascertained from $^1$H-NMR analysis that 75% of the hydrogen atoms of carboxyl groups in the polymer were ethoxyethylated and the rate of tert-butylcarbonylation was 5%.

Synthesis Example 21

In 200 ml of dimethylformamide was dissolved 20 g of the polymer obtained in Synthesis Example 1. Potassium carbonate was added thereto in solid form. With stirring, 13.0 g of tert-butyl chloroacetate was added. Reaction was conducted at 60° C. for 6 hours. The solid potassium carbonate was filtered off from the reaction solution, to which 10 liters of water was added dropwise, yielding a white solid. After filtration, the solid was dissolved in 100 ml of acetone, which was added dropwise to 5 liters of water. Filtration and vacuum drying yielded a polymer. The polymer had the structure of the rational formula (Polym.13) shown below, and it was ascertained from $^1$H-NMR analysis that 65% of the hydrogen atoms of carboxyl groups in the polymer were ethoxyethylated.

Synthesis Example 22

In 180 ml of tetrahydrofuran was dissolved 50 g of the polymer obtained in Synthesis Example 1. After trifluoroacetic anhydride was added thereto, with stirring below 5° C., 18.2 g of tert-butyl alcohol was added. After 2 hours of reaction, the reaction solution was neutralized with conc. aqueous ammonia and added dropwise to 5 liters of water whereupon a white solid was obtained. After filtration, the solid was dissolved in 100 ml of acetone, which was added dropwise to 5 liters of water. Filtration and vacuum drying yielded a polymer. The polymer had the structure of the rational formula (Polym.14) shown below, and it was ascertained from $^1$H-NMR analysis that 80% of the hydrogen atoms of carboxyl groups in the polymer were tert-butylated.

Synthesis Example 23
A silicone polymer of the rational formula (Polym.15) shown below was obtained by following the procedure of Synthesis Example 22 except that the polymer of Synthesis Example 5 was used.
Polym.1
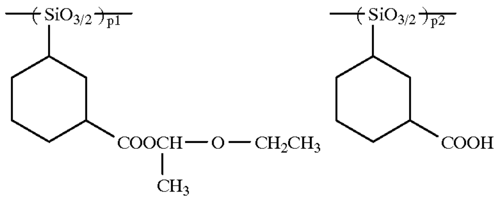
p1:p2 = 80:20
Mw = 4,000
Polym.2
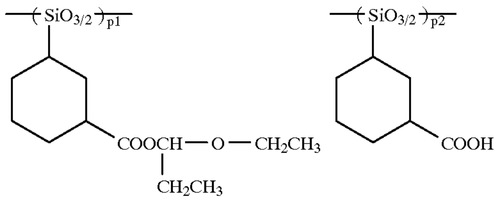
p1:p2 = 75:25
Mw = 4,000
Polym.3
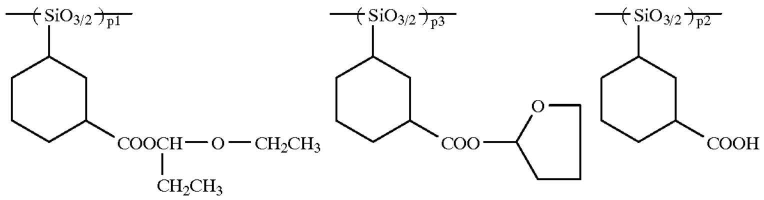
p1:p3:p2 = 50:25:25
Mw = 4,000
Polym.4
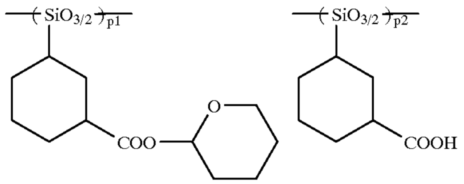
p1:p2 = 70:30
Mw = 3,900
Polym.5
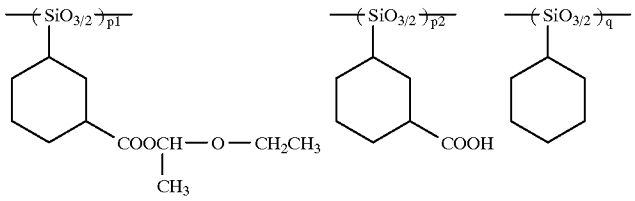
p1:p2:q = 40:30:30
Mw = 5,200

-continued
Polym.6
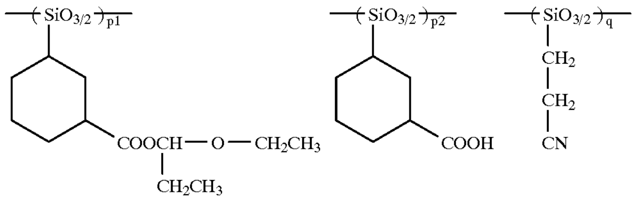
p1:p2:q = 35:5:60
Mw = 4,100
Polym.7
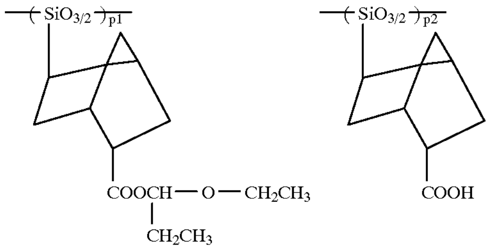
p1:p2 = 80:20
Mw = 3,400
Polym.8
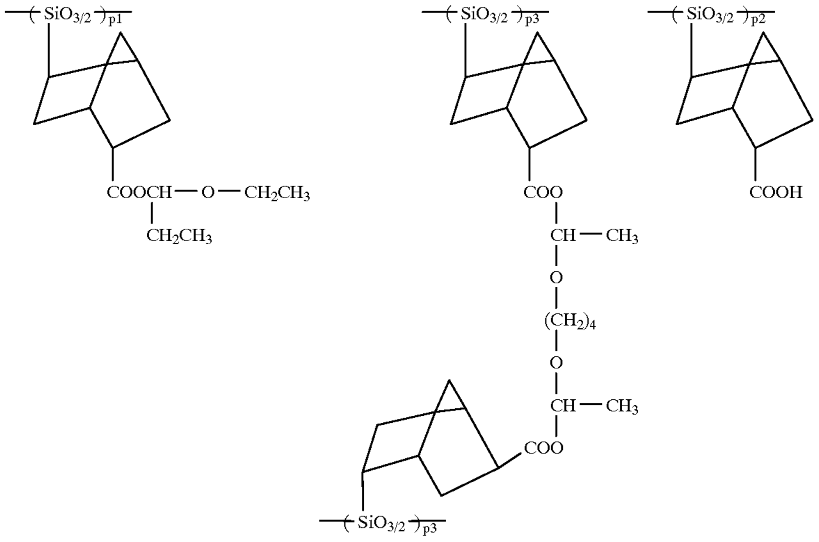
p1:p3:p2 = 75:5:20
Mw = 12,000
Polym.9
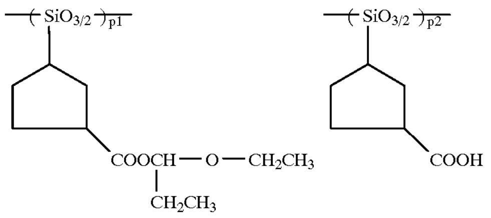
p1:p2 = 80:20
Mw = 4,400

-continued
Polym.10
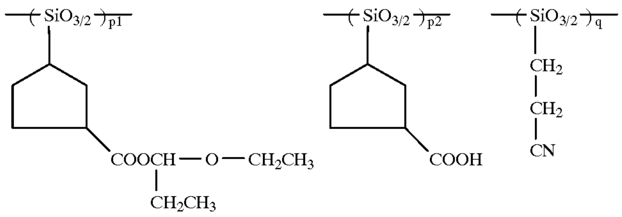
p1:p2:q = 20:30:50
Mw = 4,200
Polym.11
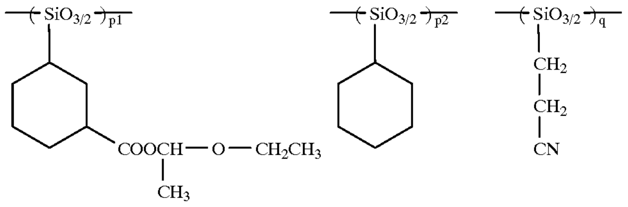
p1:p2:q = 30:30:40
Mw = 5,100
Polym.12
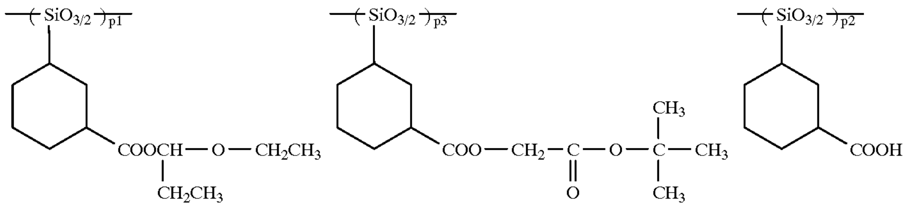
p1:p3:p2 = 75:5:20
Mw = 4,200
Polym.13
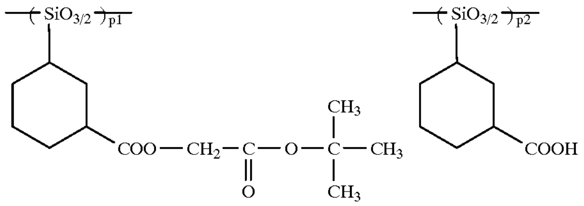
p1:p2 = 65:35
Mw = 4,250
Polym.14
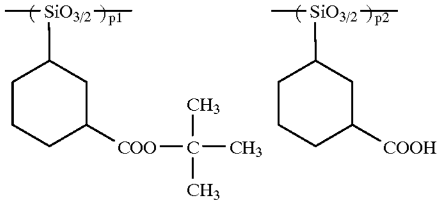
p1:p2 = 80:20
Mw = 5,650

-continued

Polym.15

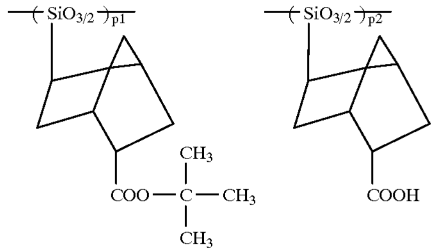

p1:p2 = 70:30
Mw = 3,000

Synthesis Example 24

Synthesis of poly(3-carboxycyclohexylsilsesquioxane)

In 150 g of toluene was dissolved 150.0 g (0.544 mol) of methyl 3-trichlorosilyl-1-cyclohexylcarboxylate. With stirring, the solution was added dropwise to 300 g of water at room temperature. After the completion of dropwise addition, the acidic aqueous layer was separated from the reaction mixture. The organic layer was then washed with 1 liter of water. After the water layer became neutral, the organic layer was two more times washed with water. The solvent was distilled off from the organic layer by means of an evaporator. The concentrate was heated at 200° C. for 2 hours for effecting polymerization. To the polymer was added 800 g of tetrahydrofuran. The resulting solution was added dropwise to 1,000 g of a 10% aqueous solution of sodium hydroxide, which was heated at 40° C. for 3 hours for effecting hydrolysis of methyl ester groups. The reaction solution was made acidic with hydrochloric acid whereupon the polymer precipitated. The polymer was collected by filtration and dried, obtaining poly(3-carboxycyclohexylsilsesquioxane) in a yield of 83.4 g. The polymer had a weight average molecular weight of 3,000.

Synthesis Example 25

Synthesis of poly[(3-carboxycyclohexylsilsesquioxane)-(cyclohexylsilsesquioxane)]

In 150 g of toluene were dissolved 75.0 g (0.272 mol) of methyl 3-trichlorosilyl-1-cyclohexylcarboxylate and 59.2 g (0.272 mol) of cyclohexyltrichlorosilane. With stirring, the solution was added dropwise to 300 g of water at room temperature. After the completion of dropwise addition, the acidic aqueous layer was separated from the reaction mixture. The organic layer was then washed with 1 liter of water. After the water layer became neutral, the organic layer was two more times washed with water. The solvent was distilled off from the organic layer by means of an evaporator. The concentrate was heated at 200° C. for 2 hours for effecting polymerization. To the polymer was added 800 g of tetrahydrofuran. The resulting solution was added dropwise to 1,000 g of a 10% aqueous solution of sodium hydroxide, which was heated at 40° C. for 3 hours for effecting hydrolysis of methyl ester. The reaction solution was made acidic with hydrochloric acid whereupon the polymer precipitated. The polymer was collected by filtration and dried, obtaining poly[(3-carboxycyclohexylsilsesquioxane)-(cyclohexylsilsesquioxane)] in a yield of 82.0 g. The polymer had a weight average molecular weight of 3,500. On $^1$H-NMR analysis of the polymer, the compositional ratio of 3-carboxycyclohexylsilsesquioxane to cyclohexylsilsesquioxane was 50/50 (molar ratio).

Synthesis Examples 26–31

Silicone polymers were obtained by the same procedure as in Synthesis Example 25 except that the cyclohexyltrichlorosilane compound was changed as shown in Table 1. Table 2 shows the compositional ratio and weight average molecular weight of these polymers.

Synthesis Example 32

In 180 ml of tetrahydrofuran was dissolved 50 g of the polymer obtained in Synthesis Example 24. A catalytic amount of p-toluenesulfonic acid was added. With stirring at 20° C., 13.7 g of ethyl vinyl ether and 2.5 g of 4-butanediol divinyl ether were added. After one hour of reaction, the reaction solution was neutralized with conc. aqueous ammonia, and the neutralized solution was added dropwise to 5 liters of water whereupon a white solid formed. After filtration, the solid was dissolved in 100 ml of acetone, which was added dropwise to 5 liters of water. After filtration, the polymer was dried in vacuum. The polymer had the structure of the rational formula (Polym.16) shown below, and it was ascertained from $^1$H-NMR analysis that 53% of the hydrogen atoms of carboxyl groups in the polymer were ethoxyethylated and 5% of the hydrogen atoms of carboxyl groups crosslinked.

Synthesis Examples 33–39

Silicone polymers of the rational formulae (Polym.17 to 23) shown below were obtained by following the procedure of Synthesis Example 32 except that compounds capable of introducing an acid labile group and a crosslinking group as shown in Polym.17 to 23 were used instead of the ethyl vinyl ether and 4-butanediol divinyl ether.

Synthesis Example 40

In 200 ml of dimethylformamide was dissolved 20 g of the polymer obtained in Synthesis Example 32. Potassium carbonate was added thereto in solid form. With stirring, 1.0 g of tert-butyl chloroacetate was added. Reaction was conducted at 6020 C. for 6 hours. The solid potassium carbonate was filtered off from the reaction solution, to which 10 liters of water was added dropwise, yielding a white solid. After filtration, the solid was dissolved in 100 ml of acetone, which was added dropwise to 5 liters of water. Filtration and vacuum drying yielded a polymer. The polymer had the structure of the rational formula (Polym.24) shown below, and it was ascertained from $^1$H-NMR analysis that 53% of the hydrogen atoms of carboxyl groups in the polymer were ethoxyethylated, 5% of the hydrogen atoms of carboxyl groups crosslinked, and the rate of tert-butylcarbonylation was 5%.

Synthesis Examples 41–47

Silicone polymers of the rational formulae (Polym.25 to 31) shown below were obtained by following the procedure of Synthesis Example 32 except that the base polymer was replaced by the polymers of Synthesis Examples 25 to 31.

The thus obtained polymers had structures as shown by the following rational formula, and their percent substitutions are shown in Table 3. In the following formulae, R represents a group providing intermolecular or intramolecular crosslinking of the following units, and (R) represents the attachment of the crosslinking group R.

TABLE 2

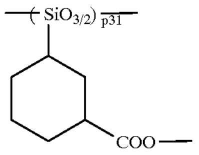

| Synthesis Example | p | q | p/q (molar ratio) | Mw |
|---|---|---|---|---|
| | Polymer of general formula (3a) | | | |
| 24 | (H) | — | 100/0 | 3,000 |
| 25 | (H) | (I) | 50/50 | 5,000 |
| 26 | (H) | (J) | 50/50 | 3,200 |
| 27 | (H) | (K) | 25/75 | 3,400 |
| 28 | (H) | (K) | 50/50 | 3,300 |
| 29 | (H) | (K) | 25/75 | 3,500 |
| 30 | (H) | (L) | 50/50 | 10,000 |
| 31 | (H) | (M) | 50/50 | 3,300 |

(H)

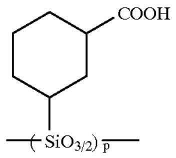

(I)

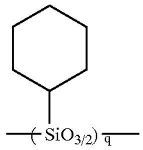

TABLE 2-continued (J)

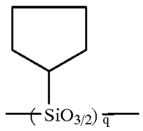

(K)

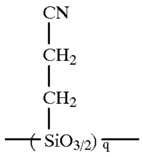

(L)

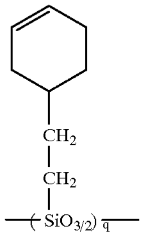

(M)

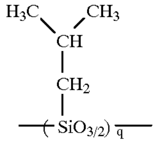

TABLE 3

| Synthesis Example | Polym. | p31 | p41 | p42 | p32 | q | Mw |
|---|---|---|---|---|---|---|---|
| 32 | 16 | 5.0 | 53.0 | 0.0 | 42.0 | 0.0 | 12,000 |
| 33 | 17 | 7.0 | 53.0 | 0.0 | 40.0 | 0.0 | 15,000 |
| 34 | 18 | 5.0 | 53.0 | 0.0 | 42.0 | 0.0 | 9,000 |
| 35 | 19 | 4.8 | 60.0 | 0.0 | 35.2 | 0.0 | 8,500 |
| 36 | 20 | 4.8 | 60.0 | 0.0 | 35.2 | 0.0 | 7,900 |
| 37 | 21 | 4.8 | 60.0 | 0.0 | 35.2 | 0.0 | 9,000 |
| 38 | 22 | 5.0 | 63.0 | 0.0 | 32.0 | 0.0 | 8,500 |
| 39 | 23 | 2.3 | 70.0 | 0.0 | 27.7 | 0.0 | 6,000 |
| 40 | 24 | 2.5 | 65.0 | 5.0 | 27.5 | 0.0 | 7,500 |
| 41 | 25 | 1.5 | 25.0 | 0.0 | 13.5 | 60.0 | 7,000 |
| 42 | 26 | 2.4 | 15.3 | 0.0 | 32.3 | 50.0 | 6,400 |
| 43 | 27 | 3.0 | 40.1 | 0.0 | 31.9 | 25.0 | 7,100 |
| 44 | 28 | 2.7 | 32.0 | 0.0 | 15.3 | 50.0 | 6,900 |
| 45 | 29 | 2.0 | 28.0 | 0.0 | 20.0 | 50.0 | 9,000 |
| 46 | 30 | 2.0 | 28.0 | 0.0 | 20.0 | 50.0 | 20,000 |
| 47 | 31 | 2.0 | 28.0 | 0.0 | 20.0 | 50.0 | 7,500 |

TABLE 3-continued
| | |
|---|---|
| Polym. 16~19 | 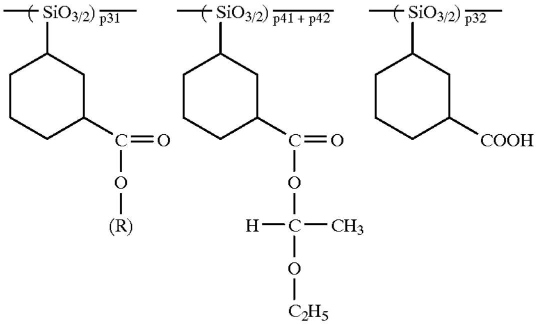 |
| | ~ |
| R: | |
| — | |
| Polym. 16 | 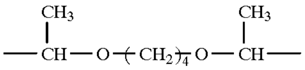 |
| Polym. 17 | 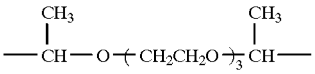 |
| Polym. 18 | 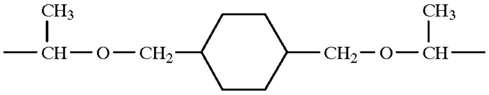 |
| Polym. 19 | 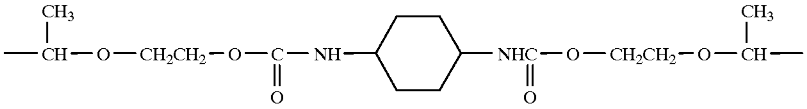 |
| Polym. 20~22 | 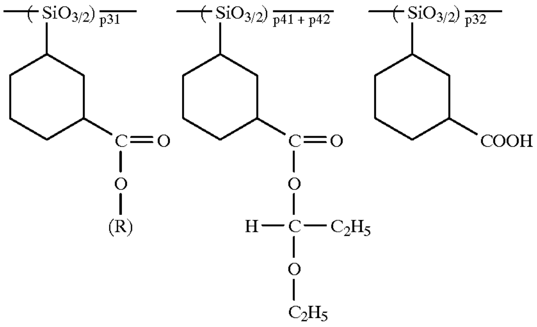 |
| | ~ |
| R: | |
| — | |
| Polym. 20 | 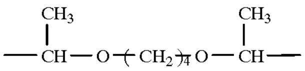 |
| Polym. 21 | 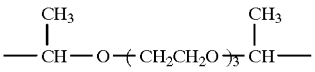 |
| Polym. 22 | 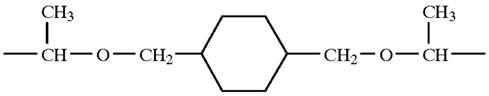 |

TABLE 3-continued
| | |
|---|---|
| Polym. 23 | 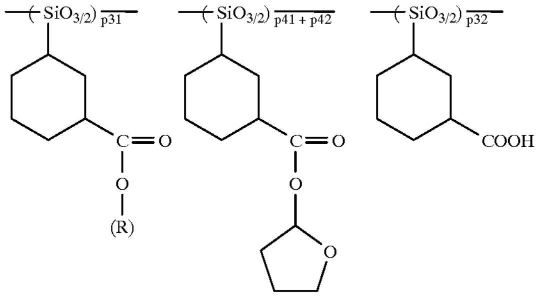 |
| R | 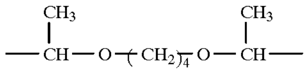 |
| Polym. 24 | 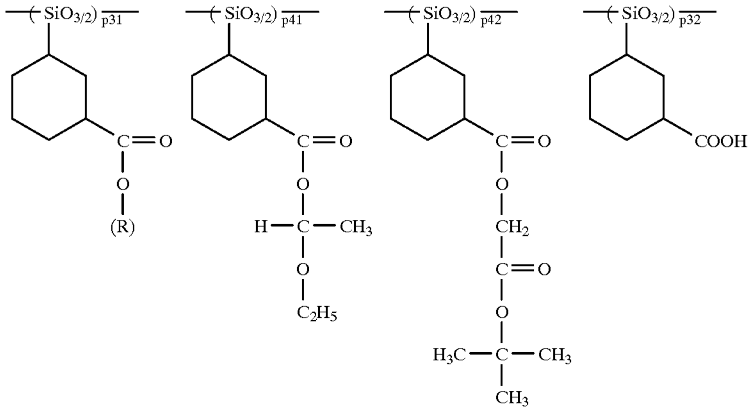 |
| R: | 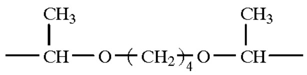 |
| Polym. 25~31 | 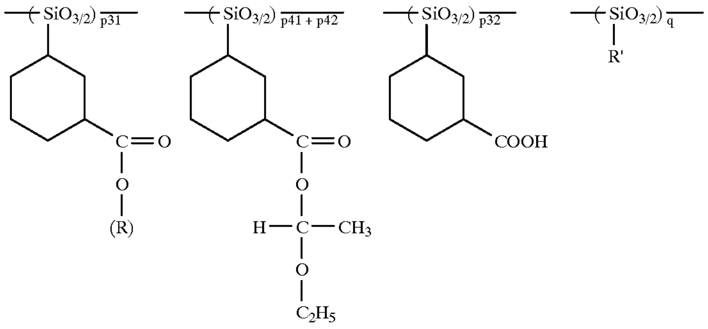 |
| R: | 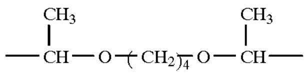 |
| R': | |
| Polym. 25 | 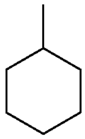 |
| Polym. 26 | 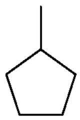 |
| Polym. 27~29 | $—CH_2CH_2CN$ |

TABLE 3-continued

| | |
|---|---|
| Polym. 30 | 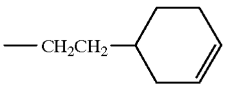 |
| Polym. 31 | 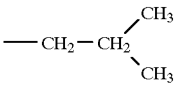 |

Examples 1–56

Liquid resist compositions were prepared by using polymers (Polym.1 to Polym.31) obtained in the foregoing Synthesis Examples as a base resin, and dissolving a photoacid generator designated PAG.1 to PAG.7, a dissolution regulator designated DRR.1 to DRR.4, a basic compound, and a compound having a group ≡C—COOH in a molecule designated ACC.1 in propylene glycol methyl ether acetate (PGMEA) in accordance with the formulation shown in the following Tables. Each of the compositions was passed through a 0.2-μm Teflon filter.

Examples 1–27

Using Polym.1 to 15

The thus obtained liquid resist composition was spin coated onto a silicon wafer to a thickness of 0.3 μm. With the silicon wafer rested on a hot plate, the coating was pre-baked at 100° C. for 90 seconds. The film was exposed to light by means of an ArF excimer laser stepper (manufactured by Nikon K.K., NA=0.55), baked at 110° C. for 90 seconds, and developed with an aqueous solution of 0.12% tetramethylammonium hydroxide, obtaining a positive pattern. The resulting resist pattern was evaluated as follows. The results are shown in Tables 4 and 5.

Test Methods

First, a sensitivity (Eth value) was determined. Provided that the exposure dose with which a 0.20-μm line-and-space pattern was resolved at 1:1 was the optimum exposure dose (Eop), the minimum line width of a line-and-space pattern which was recognized separate at this exposure dose was the resolution of a test resist. The profile of the resist pattern resolved was observed under a scanning electron microscope. The edge roughness of a 0.18-μm line-and-space pattern was also observed under a scanning electron microscope with a built-in distance meter S7280 (Hitachi K.K.).

Examples 28–56

Using Polym.16 to 31

The above-obtained liquid resist composition was spin coated onto a silicon wafer to a thickness of 0.4 μm. With the silicon wafer rested on a hot plate, the coating was pre-baked at 100° C. for 90 seconds. The film was exposed to light by means of an excimer laser stepper NSR-2005EX8A (manufactured by Nikon K.K., NA=0.5), baked at 110° C. for 90 seconds, and developed with an aqueous solution of 2.38% tetramethylammonium hydroxide, obtaining a positive pattern. The resulting resist pattern was evaluated as follows. The results are shown in Tables 6 and 7.

Test Methods

First, a sensitivity (Eth value) was determined. Provided that the exposure dose with which a 0.24-μm line-and-space pattern was resolved at 1:1 was the optimum exposure dose (Eop), the minimum line width of a line-and-space pattern which was recognized separate at this exposure dose was the resolution of a test resist. The profile of the resist pattern resolved was observed under a scanning electron microscope. The edge roughness of a 0.25-μm line-and-space pattern was also observed under a scanning electron microscope S7280 (Hitachi K.K.).

It is evident from Tables 4 to 7 that chemically amplified resist compositions of the invention form resist patterns having a high resolution and free of asperities (having a minimized edge roughness).

(PAG.1)

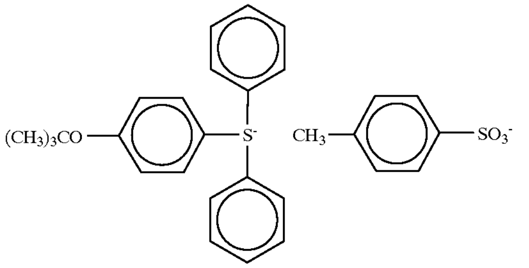

(PAG.2)

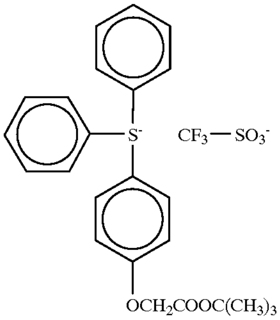

(PAG.3)

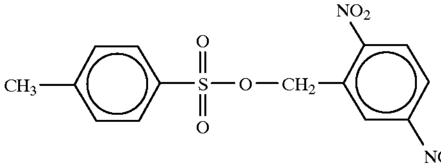

(PAG.4)

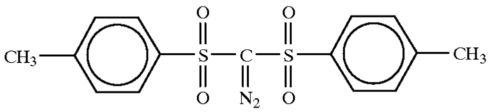

(PAG.5)

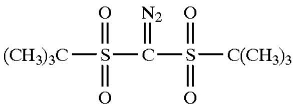

-continued (PAG.6)

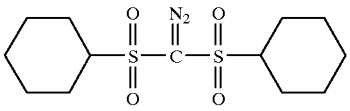

(PAG.7)

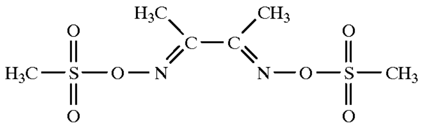

(DRR.1)

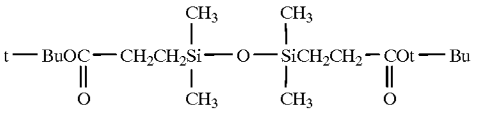

(DRR.2)

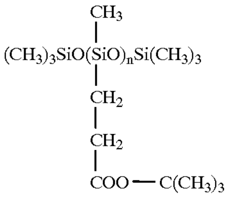

-continued (DRR.3)

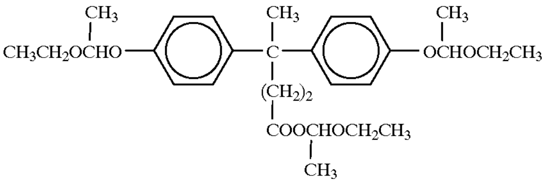

(DRR.4)

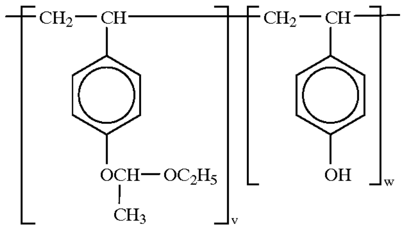

v/(v + w) = 0.09
Weight average molecular weight = 3,000

ACC.1

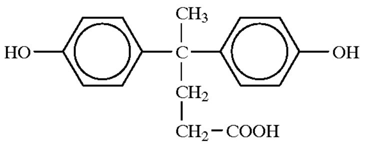

TABLE 4

| No. | Resist composition (compositional ratio in parentheses, unit: pbw) Base resin | Photoacid generator | Dissolution regulator | Basic compound | Solvent | Sensitivity Eop (mJ/cm$^2$) | Resolution ($\mu$m) | Profile | Edge roughness (nm) |
|---|---|---|---|---|---|---|---|---|---|
| 1 | Polym.1 (98) | PAG.1 (2) | — | tributylamine (0.1) | PGMEA (600) | 4.5 | 0.16 | rectangular | 5 |
| 2 | Polym.2 (98) | PAG.1 (2) | — | tributylamine (0.1) | PGMEA (600) | 4.6 | 0.16 | rectangular | 5 |
| 3 | Polym.3 (98) | PAG.1 (2) | — | tributylamine (0.1) | PGMEA (600) | 4.5 | 0.18 | rectangular | 7 |
| 4 | Polym.4 (98) | PAG.1 (2) | — | tributylamine (0.1) | PGMEA (600) | 5.0 | 0.18 | rectangular | 7 |
| 5 | Polym.5 (98) | PAG.1 (2) | — | tributylamine (0.1) | PGMEA (600) | 4.6 | 0.16 | rectangular | 5 |
| 6 | Polym.6 (98) | PAG.1 (2) | — | tributylamine (0.1) | PGMEA (600) | 4.0 | 0.16 | rectangular | 5 |
| 7 | Polym.7 (98) | PAG.1 (2) | — | tributylamine (0.1) | PGMEA (600) | 4.9 | 0.16 | rectangular | 4 |
| 8 | Polym.8 (98) | PAG.1 (2) | — | tributylamine (0.1) | PGMEA (600) | 4.7 | 0.16 | rectangular | 3 |
| 9 | Polym.9 (98) | PAG.1 (2) | — | tributylamine (0.1) | PGMEA (600) | 4.7 | 0.16 | rectangular | 5 |
| 10 | Polym.10 (98) | PAG.1 (2) | — | tributylamine (0.1) | PGMEA (600) | 4.7 | 0.16 | rectangular | 5 |
| 11 | Polym.11 (98) | PAG.1 (2) | — | tributylamine (0.1) | PGMEA (600) | 4.0 | 0.16 | rectangular | 6 |
| 12 | Polym.12 (98) | PAG.1 (2) | — | tributylamine (0.1) | PGMEA (600) | 4.8 | 0.18 | rectangular | 8 |
| 13 | Polym.13 (98) | PAG.1 (2) | — | tributylamine (0.1) | PGMEA (600) | 5.5 | 0.18 | rectangular | 10 |
| 14 | Polym.14 (98) | PAG.1 (2) | — | tributylamine (0.1) | PGMEA (600) | 7.0 | 0.18 | rectangular | 8 |
| 15 | Polym.15 (98) | PAG.1 (2) | — | tributylamine (0.1) | PGMEA (600) | 7.2 | 0.18 | rectangular | 9 |

TABLE 5

| No. | Resist composition (compositional ratio in parentheses, unit: pbw) Base resin | Photoacid generator | Dissolution regulator | Basic compound | Solvent | Sensitivity Eop (mJ/cm$^2$) | Resolution ($\mu$m) | Profile | Edge roughness (nm) |
|---|---|---|---|---|---|---|---|---|---|
| 16 | Polym.1 (98) | PAG.2 (2) | — | — | PGMEA (600) | 5.1 | 0.17 | rectangular | 5 |
| 17 | Polym.1 (98) | PAG.3 (2) | — | — | PGMEA (600) | 12 | 0.17 | rectangular | 7 |
| 18 | Polym.1 (98) | PAG.4 (2) | — | — | PGMEA (600) | 8.5 | 0.17 | rectangular | 7 |
| 19 | Polym.1 (82) | PAG.1 (2) | DRR.1 (16) | — | PGMEA (600) | 4.7 | 0.17 | rectangular | 7 |

TABLE 5-continued

| | Resist composition (compositional ratio in parentheses, unit: pbw) | | | | | | | | Edge |
|---|---|---|---|---|---|---|---|---|---|
| No. | Base resin | Photoacid generator | Dissolution regulator | Basic compound | Solvent | Sensitivity Eop (mJ/cm$^2$) | Resolution ($\mu$m) | Profile | roughness (nm) |
| 20 | Polym.1 (82) | PAG.1 (2) | DRR.2 (16) | — | PGMEA (600) | 4.7 | 0.17 | rectangular | 7 |
| 21 | Polym.1 (98) | PAG.1 (2) | — | triethanolamine (0.1) | PGMEA (600) | 5.5 | 0.16 | rectangular | 4 |
| 22 | Polym.1 (98) | PAG.1 (2) | — | N-methylpyrrolidone (0.05) | PGMEA (600) | 1 | 0.18 | rectangular | 10 |
| 23 | Polym.1 (82) | PAG.1 (2) | DRR.1 (16) | quinoline (0.05) | PGMEA (600) | 1.8 | 0.18 | rectangular | 9 |
| 24 | Polym.1 (98) | PAG.1 (2) | — | tributylamine (0.1) piperidine ethanol (0.05) | PGMEA (600) | 6.5 | 0.16 | rectangular | 6 |
| 25 | Polym.1 (80) | PAG.7 (2) | — | — | PGMEA (600) | 4.7 | 0.17 | rectangular | 7 |
| 26 | Polym.1 (80) | PAG.7 (2) | DRR.3 (4) | — | PGMEA (600) | 12.5 | 0.17 | rectangular | 7 |
| 27* | Polym.1 (80) | PAG.7 (2) | — | triethanolamine (0.1) | PGMEA (600) | 5 | 0.17 | rectangular | 4 |

*further addition of 0.2 parts of ACC.1

TABLE 6

| | Resist composition (compositional ratio in parentheses, unit: pbw) | | | | | | | |
|---|---|---|---|---|---|---|---|---|
| No. | Base resin | Photoacid generator | Dissolution regulator | Basic compound | Solvent | Sensitivity Eop (mJ/cm$^2$) | Resolution ($\mu$m) | Profile |
| 28 | Polym.16 (80) | PAG.1 (2) | — | — | PGMEA (600) | 4.5 | 0.20 | rectangular |
| 29 | Polym.17 (80) | PAG.1 (2) | — | — | PGMEA (600) | 4.6 | 0.20 | rectangular |
| 30 | Polym.18 (80) | PAG.1 (2) | — | — | PGMEA (600) | 4.5 | 0.20 | rectangular |
| 31 | Polym.19 (80) | PAG.1 (2) | — | — | PGMEA (600) | 5.0 | 0.20 | rectangular |
| 32 | Polym.20 (80) | PAG.1 (2) | — | — | PGMEA (600) | 4.6 | 0.20 | rectangular |
| 33 | Polym.21 (80) | PAG.1 (2) | — | — | PGMEA (600) | 5.5 | 0.22 | rectangular |
| 34 | Polym.22 (80) | PAG.1 (2) | — | — | PGMEA (600) | 4.9 | 0.20 | rectangular |
| 35 | Polym.23 (80) | PAG.1 (2) | — | — | PGMEA (600) | 4.7 | 0.20 | rectangular |
| 36 | Polym.24 (80) | PAG.1 (2) | — | — | PGMEA (600) | 4.7 | 0.20 | rectangular |
| 37 | Polym.25 (80) | PAG.1 (2) | — | — | PGMEA (600) | 4.7 | 0.20 | rectangular |
| 38 | Polym.26 (80) | PAG.1 (2) | — | — | PGMEA (600) | 4.8 | 0.20 | rectangular |
| 39 | Polym.27 (80) | PAG.1 (2) | — | — | PGMEA (600) | 4.8 | 0.20 | rectangular |
| 40 | Polym.28 (80) | PAG.1 (2) | — | — | PGMEA (600) | 5.5 | 0.20 | rectangular |
| 41 | Polym.29 (80) | PAG.1 (2) | — | — | PGMEA (600) | 10.0 | 0.20 | rectangular |
| 42 | Polym.30 (80) | PAG.1 (2) | — | — | PGMEA (600) | 5.1 | 0.20 | rectangular |
| 43 | Polym.31 (80) | PAG.1 (2) | — | — | PGMEA (600) | 5.3 | 0.20 | rectangular |

TABLE 7

| | Resist composition (compositional ratio in parentheses, unit: pbw) | | | | | | | |
|---|---|---|---|---|---|---|---|---|
| No. | Base resin | Photoacid generator | Dissolution regulator | Basic compound | Solvent | Sensitivity Eop (mJ/cm$^2$) | Resolution ($\mu$m) | Profile |
| 44 | Polym.16 (80) | PAG.2 (2) | — | — | PGMEA (600) | 5.1 | 0.20 | rectangular |
| 45 | Polym.16 (80) | PAG.3 (2) | — | — | PGMEA (400) | 7.5 | 0.22 | rectangular |
| 46 | Polym.16 (80) | PAG.4 (2) | — | — | PGMEA (600) | 8.5 | 0.22 | rectangular |
| 47 | Polym.16 (80) | PAG.1 (2) | DRR.1 | — | PGMEA (600) | 4.7 | 0.20> | rectangular |
| 48 | Polym.16 (80) | PAG.1 (2) | DRR.2 | — | PGMEA (400) | 4.7 | 0.20> | rectangular |
| 49 | Polym.16 (80) | PAG.1 (2) | — | triethanolamine | PGMEA (600) | 60.0 | 0.20> | rectangular |
| 50 | Polym.16 (80) | PAG.1 (2) | — | N-methylpyrrolidone (0.05) | PGMEA (600) | 6.0 | 0.22 | rectangular |
| 51 | Polym.16 (80) | PAG.1 (2) | DRR.1 | quinoline (0.05) | PGMEA (600) | 6.5 | 0.22 | rectangular |
| 52 | Polym.16 (80) | PAG.1 (2) | — | triethanolamine (0.1) piperidine ethanol | PGMEA (600) | 11.0 | 0.20> | rectangular |
| 53 | Polym.16 (80) | PAG.1 (2) | — | tributylamine (0.1) | PGMEA (600) | 10.0 | 0.20 | rectangular |
| 54 | Polym.16 (80) | PAG.5 (2) | — | — | PGMEA (600) | 4.7 | 0.17 | rectangular |
| 55 | Polym.16 (80) | PAG.6 (2) | — | — | PGMEA (600) | 4.5 | 0.17 | rectangular |
| 56 | Polym.16 (80) | PAG.6 (2) | DRR.4 (4) | — | PGMEA (600) | 12 | 0.17 | rectangular |

Example 57

A silicon wafer was coated with a lower resist film of 2.0 $\mu$m thick using OFPR 800 (Tokyo Oka K.K.), and the film was cured by heating at 200° C. for 5 minutes. The resist composition used in Example 1 was similarly coated onto the lower resist film to a thickness of about 0.35 $\mu$m and pre-baked. The resist film was then exposed to a KrF excimer laser beam and developed, forming a pattern on the lower resist film. The resist composition could form a pattern having perpendicular side walls on the lower resist film without footing.

Using a parallel plate type sputter etching apparatus, the resist was etched with oxygen gas as an etchant gas. The lower resist film was etched at a rate of 150 nm/min. while the inventive resist film was etched at a rate of less than 15 nm/min. After 15 minutes of etching, those portions of the lower resist film which were not covered with the inventive resist film were completely eliminated, leaving a two-layer resist pattern having a thickness of more than 1 μm. The etching conditions are shown below.

Gas flow rate: 50 SCCM

Gas pressure: 1.3 Pa

RF power: 50 w

DC bias: 450 V

Example 58

A silicon wafer was coated with a lower resist film of 2.0 μm thick using OFPR 800 (Tokyo Oka K.K.), and the film was cured by heating at 200° C. for 5 minutes. The resist composition used in Example 28 was similarly coated onto the lower resist film to a thickness of about 0.35 μm and pre-baked. The resist film was then exposed to a KrF excimer laser beam and developed, forming a pattern on the lower resist film. The resist composition could form a pattern having perpendicular side walls on the lower resist film without footing.

Using a parallel plate type sputter etching apparatus, the resist was etched with oxygen gas as an etchant gas. The lower resist film was etched at a rate of 150 nm/min. while the inventive resist film was etched at a rate of less than 3 nm/min. After 15 minutes of etching, those portions of the lower resist film which were not covered with the inventive resist film were completely eliminated, leaving a two-layer resist pattern having a thickness of more than 2 μm. The etching conditions are shown below.

Gas flow rate: 50 SCCM

Gas pressure: 1.3 Pa

RF power: 50 W

DC bias: 450 V

Additionally, an acetylene alcohol derivative, Sufrynol E1004 (Nisshin Chemical Industry K.K.) of the structural formula shown below was added to the resist compositions of Examples 1, 6, 19, and 21 in an amount of 0.05% by weight of the composition. The resist compositions were observed whether or not particles (foreign matter) increased as a rating of storage stability. The results are shown in Table 7. In an accelerated test of storage at 40° C., particles having a particle size of more than 0.3 μm were monitored using a counter KL-20A (Rion K.K.) for counting the number of particles in liquid.

TABLE 8

Sufrynol E1004

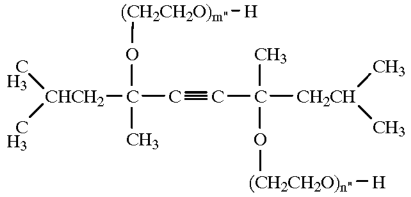

m" + n" = 3.5

| | As filtered (particles/ml) | Surfynol-free After 4 months (particles/ml) | Surfynol added After 4 months (particles/ml) |
|---|---|---|---|
| Example 1 | 5 | 30 | 7 |
| Example 6 | 6 | 35 | 6 |
| Example 19 | 6 | 25 | 6 |
| Example 21 | 5 | 21 | 6 |

We claim:

1. A high molecular weight silicone compound comprising recurring units of the following general formula (1) and having a weight average molecular weight of 1,000 to 50,000, (1)

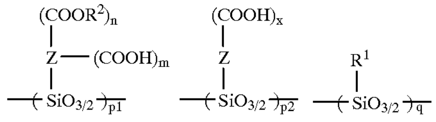

wherein Z is a di- to hexavalent, monocyclic or polycyclic hydrocarbon group or bridged cyclic hydrocarbon group of 5 to 12 carbon atoms, $R^1$ is a normal, branched or cyclic, substituted or unsubstituted alkyl or alkenyl group of 1 to 8 carbon atoms, $R^2$ is an acid labile group, letter m is 0 or a positive integer, n is a positive integer, m and n satisfying $m+n \leqq 5$, x is a positive integer, p1 and p2 are positive numbers, q is 0 or a positive number, p1, p2 and q satisfying $0<p1/(p1+p2+q) \leqq 0.9$, $0<p2/(p1+p2+q) \leqq 0.9$, $0 \leqq q/(p1+p2+q) \leqq 0.7$, and $p1+p2+q=1$;

wherein more than 0 mol % to 90 mol % of the entire hydrogen atoms of carboxyl groups may be crosslinked within a molecule and/or between molecules with crosslinking groups having C—O—C linkages of the following general formula (2a) or (2b):

(2a)

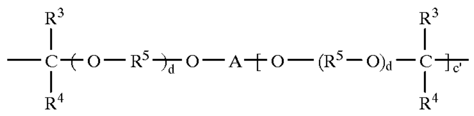

(2b)

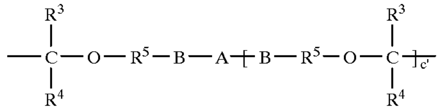

wherein each of $R^3$ and $R^4$ is hydrogen or a normal, branched or cyclic alkyl group of 1 to 8 carbon atoms, or $R^3$ and $R^4$, taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7.

2. The high molecular weight silicone compound of claim 1 comprising recurring units of the following general formula (3):

(3)

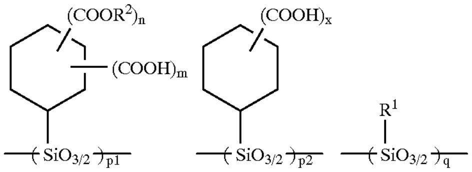

wherein $R^1$, $R^2$, m, n, x, p1, p2, and q are as defined above.

3. The high molecular weight silicone compound of claim 1 wherein the crosslinking group having C—O—C linkages represented by the general formula (2a) or (2b) is represented by the following general formula (2a''') or (2b'''):

(2a''')

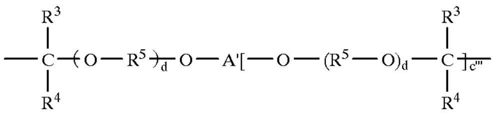

(2b''')

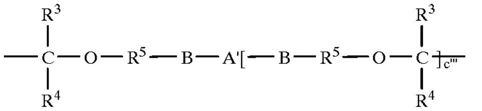

wherein each of $R^3$ and $R^4$ is hydrogen or a normal, branched or cyclic alkyl group of 1 to 8 carbon atoms, or $R^3$ and $R^4$, taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 5, A' is a c''-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c'' is an integer of 2 to 4, and c''' is an integer of 1 to 3.

4. The high molecular weight silicone compound of claim 1 wherein $R^2$ is at least one group selected from the class consisting of groups of the following general formula (4), groups of the following general formula (5), tertiary alkyl groups of 4 to 20 carbon atoms, trialkylsilyl groups whose alkyl groups each have 1 to 6 carbon atoms, and oxoalkyl groups of 4 to 20 carbon atoms, (4)

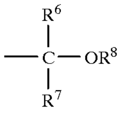

(5)

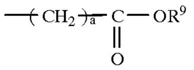

wherein $R^6$ and $R^7$ each are hydrogen or a normal, branched or cyclic alkyl group of 1 to 8 carbon atoms, $R^8$ is a monovalent hydrocarbon group of 1 to 18 carbon atoms which may have a hetero atom, or $R^6$ and $R^7$, $R^6$ and $R^8$, or $R^7$ and $R^8$, taken together, may form a ring, with the proviso that $R^6$, $R^7$ and $R^8$ each are a normal or branched alkylene group of 1 to 18 carbon atoms when they form a ring, $R^9$ is a tertiary alkyl group of 4 to 20 carbon atoms, a trialkylsilyl group whose alkyl groups each have 1 to 6 carbon atoms, an oxyalkyl group of 4 to 20 carbon atoms or a group of the above general formula (4), and letter a is an integer of 0 to 6.

5. A high molecular weight silicone compound comprising recurring units of the following general formula (3a), wherein the hydrogen atoms of some of the carboxyl groups are partially replaced by acid labile groups, the silicone compound is crosslinked within a molecule and/or between molecules with crosslinking groups having C—O—C linkages resulting from reaction between some of the remaining carboxyl groups and an alkenyl ether compound and/or halogenated alkyl ether compound, and the amount of said acid labile groups and said crosslinking groups combined is on the average more than 0 mol % to 80 mol % of the entire carboxyl groups in formula (1), (3a)

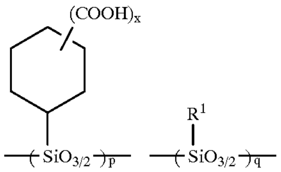

wherein $R^1$ is a normal, branched or cyclic, substituted or unsubstituted alkyl or alkenyl group of 1 to 8 carbon atoms, letter x is a positive integer, p is a positive number, and q is 0 or a positive number, p and q satisfy $0 \leq q/(p+q) \leq 0.6$ and $p+q=1$.

6. A high molecular weight silicone compound of claim 5 comprising recurring units of the following general formula (3b), wherein the silicone compound is crosslinked within a molecule and/or between molecules with crosslinking groups having C—O—C linkages resulting from reaction between some of the carboxyl groups represented by R and an alkenyl ether compound and/or halogenated alkyl ether compound, and the amount of said acid labile groups and said crosslinking groups combined is on the average more than 0 mol % to 80 mol % of the entire carboxyl groups in formula (3a), (3b)

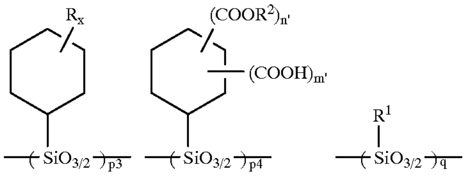

wherein R is a carboxyl group or $COOR^2$, at least one of R groups being a carboxyl group, $R^1$ is a normal, branched or cyclic, substituted or unsubstituted alkyl or alkenyl group of 1 to 8 carbon atoms, $R^2$ is an acid labile group, letter x is a positive integer, m' is 0 or a positive integer, n' is a positive integer, m' and n' satisfy $m'+n' \leqq 5$, p3 is a positive number, p4 is 0 or a positive number, q is 0 or a positive number, p3, p4 and q satisfy $0<p3/(p3+p4+q) \leqq 0.8$, $0 \leqq q/(p3+p4+q) \leqq 0.6$, $0.4 \leqq (p3+p4)/(p3+p4+q) \leqq 1$, and $p3+p4+q=1$.

7. The high molecular weight silicone compound of claim 6 comprising recurring units of the following general formula (3c), wherein some hydrogen atoms are eliminated from the carboxyl groups represented by R to leave terminal oxygen atoms which are crosslinked with divalent or polyvalent crosslinking groups having C—O—C linkages of the following general formula (2a) or (2b) within a molecule and/or between molecules, and the amount of said acid labile groups and said crosslinking groups combined is on the average more than 0 mol % to 80 mol % of the entire carboxyl groups in formula (3a), (3c)

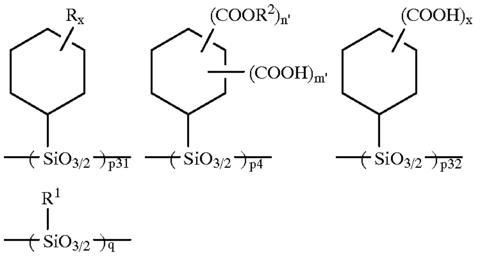

wherein R is a carboxyl group or $COOR^2$, at least one of R groups being a carboxyl group, $R^1$ is a normal, branched or cyclic, substituted or unsubstituted alkyl or alkenyl group of 1 to 8 carbon atoms, $R^2$ is an acid labile group, letter p31 is a positive number, p32, p4 and q each are 0 or a positive number, p31, p32, p4 and q satisfy $0<p31/(p31+p32+p4+q) \leqq 0.8$, $0 \leqq p4/(p31+p32+p4+q) \leqq 0.8$, $0 \leqq q/(p31+p32+p4+q) \leqq 0.6$, $0.4 \leqq (p31+p32+p4)/(p31+p32+p4+q) \leqq 1$, and $p31+p32+p4+q=1$, x is a positive integer, m' is 0 or a positive integer, n' is a positive integer, m' and n' satisfy $m'+n' \leqq 5$, (2a)

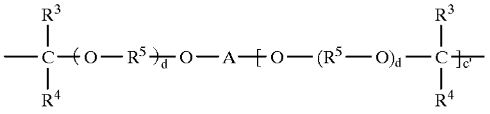

-continued (2b)

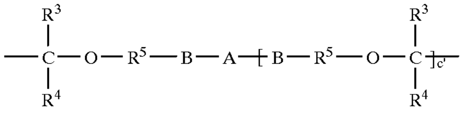

wherein each of $R^3$ and $R^4$ is hydrogen or a normal, branched or cyclic alkyl group of 1 to 8 carbon atoms, or $R^3$ and $R^4$, taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 10, A is a c-valent aliphatic or alicyclic saturated hydrocarbon group, aromatic hydrocarbon group or heterocyclic group of 1 to 50 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c is an integer of 2 to 8, and c' is an integer of 1 to 7.

8. The high molecular weight silicone compound of claim 7 wherein the crosslinking group having C—O—C linkages represented by the general formula (2a) or (2b) is represented by the following general formula (2a''') or (2b'''):

(2a''')

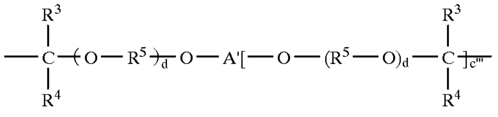

wherein each of $R^3$ and $R^4$ is hydrogen or a normal, branched or cyclic alkyl group of 1 to 8 carbon atoms, or $R^3$ and $R^4$, taken together, may form a ring, with the proviso that each of $R^3$ and $R^4$ is a normal or branched alkylene group of 1 to 8 carbon atoms when they form a ring, $R^5$ is a normal or branched alkylene group of 1 to 10 carbon atoms, letter d is 0 or an integer of 1 to 5, A' is a c''-valent normal, branched or cyclic alkylene, alkyltriyl or alkyltetrayl group of 1 to 20 carbon atoms or an arylene group of 6 to 30 carbon atoms, which may have an intervening hetero atom and in which the hydrogen atom attached to a carbon atom may be partially replaced by a hydroxyl group, carboxyl group, acyl group or fluorine atom, B is —CO—O—, —NHCO—O— or —NHCONH—, letter c'' is an integer of 2 to 4, and c''' is an integer of 1 to 3.

9. The high molecular weight silicone compound of claim 8 wherein $R^2$ is at least one group selected from the class consisting of groups of the following general formula (4), groups of the following general formula (5), tertiary alkyl groups of 4 to 20 carbon atoms, trialkylsilyl groups whose alkyl groups each have 1 to 6 carbon atoms, and oxoalkyl groups of 4 to 20 carbon atoms, (4)

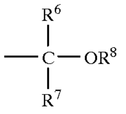

-continued

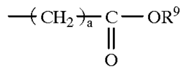

(5)

wherein $R^6$ and $R^7$ each are hydrogen or a normal, branched or cyclic alkyl group of 1 to 8 carbon atoms, $R^8$ is a monovalent hydrocarbon group of 1 to 18 carbon atoms which may have a hetero atom, or $R^6$ and $R^7$, $R^6$ and $R^8$, or $R^7$ and $R^8$, taken together, may form a ring, with the proviso that $R^6$, $R^7$ and $R^8$ each are a normal or branched alkylene group of 1 to 18 carbon atoms when they form a ring, $R^9$ is a tertiary alkyl group of 4 to 20 carbon atoms, a trialkylsilyl group whose alkyl groups each have 1 to 6 carbon atoms, an oxyalkyl group of 4 to 20 carbon atoms or a group of the above general formula (4), and letter a is an integer of 0 to 6.

10. A chemically amplified positive resist composition comprising (A) an organic solvent, (B) a base resin in the form of the high molecular weight silicone compound of any one of claims 1 to 9, and (C) a photoacid generator.

11. The resist composition of claim 10 further comprising (D) a dissolution regulator.

12. The resist composition of claim 10 further comprising (E) a basic compound.

13. The resist composition of claim 10 further comprising (F) a compound having a group represented by ≡C—COOH in a molecule.

14. The resist composition of claim 10 further comprising (G) an acetylene alcohol derivative.

15. A method for forming a pattern comprising the steps of:

(i) applying a chemically amplified positive resist composition according to claim 10 onto a substrate, (ii) heat treating the coated film and then exposing it to actinic radiation having a wavelength of up to 300 nm or electron beams through a photo mask, and (iii) optionally heat treating the exposed film and developing it with a developer.

* * * * *